(12) United States Patent
Gyouten et al.

(10) Patent No.: US 7,289,097 B2
(45) Date of Patent: Oct. 30, 2007

(54) SCANNING DIRECTION CONTROL CIRCUIT AND DISPLAY DEVICE

(75) Inventors: Seijirou Gyouten, Tenri (JP); Sachio Tsujino, Yao (JP); Hajime Washio, Sakurai (JP); Eiji Matsuda, Tenri (JP); Keiichi Ina, Tenri (JP); Yuhichiroh Murakami, Tenri (JP); Shunsuke Hayashi, Onomichi (JP); Mamoru Onda, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 902 days.

(21) Appl. No.: 10/702,077

(22) Filed: Nov. 6, 2003

(65) Prior Publication Data

US 2004/0108989 A1    Jun. 10, 2004

(30) Foreign Application Priority Data

Nov. 7, 2002    (JP) ............................ 2002-324345
Sep. 19, 2003   (JP) ............................ 2003-328475

(51) Int. Cl.
    *G09G 3/36*    (2006.01)
(52) U.S. Cl. ........................................ 345/100; 345/98
(58) Field of Classification Search .......... 345/55–100, 345/204
    See application file for complete search history.

(56) References Cited

U.S. PATENT DOCUMENTS 6,670,944 B1 *  12/2003  Ishii ............................ 345/100
6,909,417 B2 *   6/2005  Washio et al. ................. 345/98
7,190,342 B2 *   3/2007  Matsuda et al. ............. 345/100
2003/0179174 A1  9/2003  Matsuda
2006/0202940 A1* 9/2006  Azami et al. ............... 345/100

FOREIGN PATENT DOCUMENTS

EP    1 052 617    11/2000
JP    9-50264      2/1997

OTHER PUBLICATIONS

Murakami et al., "Level Shifter Circuit and Display Device Provided Therewith", U.S. Appl. No. 10/438,886, filed May 16, 2003, pp. 1-120, Figures 1-22, Official filing Receipt.

* cited by examiner

*Primary Examiner*—David L. Lewis
(74) *Attorney, Agent, or Firm*—Nixon & Vanderhye, PC

(57) ABSTRACT

The subject invention discloses a scanning direction control circuit, which includes a bidirectional shift register in which shifting direction is switched in accordance with a switching signal L/R, which is step-upped by a level shifter when having lower amplitude than the driving voltage. The scanning direction control circuit includes a latch circuit between the level shifter and the bidirectional shift register, and a control circuit causes the latch circuit to carry out latching operation after shifting operation of flip-flops constituting the bidirectional shift register is completed in response to output signals of the flip-flops. The control circuit brings the level shifter into active state in a period before, at and after the latching timing, and brings the level shifter into inactive state in the remaining period. With this arrangement, the switching signal L/R can be supplied at a predetermined timing regardless of external input timing thereof, with low power consumption.

32 Claims, 34 Drawing Sheets

SCANNING DIRECTION CONTROL CIRCUIT AND DISPLAY DEVICE

This Nonprovisional application claims priority under 35 U.S.C. § 119(a) on Patent Applications . No. 2002/324,345 filed in Japan on Nov. 7, 2002, and No. 2003/328,475 filed in Japan on Sep. 19, 2003, the entire contents of which are hereby incorporated by reference.

FIELD OF THE INVENTION

The present invention relates to a scanning direction control circuit, which is suitably used for a scanning signal line driving circuit and a data signal line driving circuit of a matrix-type display device; and a display device including such a scanning direction control circuit.

BACKGROUND OF THE INVENTION

The matrix-type display device has a scanning signal line driving circuit and a data signal line driving circuit, which often include a shift register for generating a scanning signal to be supplied to each scanning signal line, or for controlling of a timing at which a voltage is sampled from an image signal so as to apply the voltage to each data signal line.

Further, in recent years, a new display device capable of displaying a mirror image of the displayed image has come into practical use, which is often used for a monitor panel of a video camera or a digital camera. This kind of display device displays a mirror image by vertically or horizontally reversing the original image according to the angle of the image display section. Such a display device capable of reversing a displayed image uses a bidirectional shift register as the shift register. The bidirectional shift register is capable of changing the shifting direction, and therefore allows the display device to carry out such a mirror image display by only switching the shifting direction without storing the image signal.

Meanwhile, power consumption of an electronic circuit increases in proportion to the frequency, the load capacitance, and the square of the voltage. Therefore, in a periphery circuit, connected to the display device, such as a circuit for generating an image signal supplied to the display device, or in the display device itself, the driving voltage is becoming lower and lower in order to reduce power consumption.

However, for a display device in which a driving circuit (such as a scanning signal line driving circuit and/or a data signal line driving circuit) is monolithically formed in a single substrate as well as a pixel circuit, in order to obtain a wider display area, especially for the display device including the scanning signal line driving circuit and/or the data signal line driving circuit made of polycrystalline silicon thin film transistors; the difference of the threshold voltages between the respective substrates or even within a single substrate may become almost as large as several voltages. In this case, the reduction of driving voltage cannot be successfully realized.

Accordingly, the scanning signal line driving circuit and/or the data signal line driving circuit supplied with a signal from a circuit, such as the foregoing circuit for generating an image signal, which is made of monocrystal silicon transistors and is driven by a voltage of 3.3V, 5V, or lower voltage, receives an input signal lower than that of the driving voltage of the shift register, and therefore a level shifter for increasing the input voltage is required.

One specific example is explained by referring to a scanning direction control circuit 1 shown in FIG. 21, which shows a bidirectional shift register 2 (hereinafter simply referred to as a shift register 2) constituted of 6 flip-flops f1 through f6 and 12 analog switches a1 through a6 and b1 through b6. When a clock signal CK with an amplitude of approximately 5V, a starting signal SP, and a shifting direction switching signal L/R are supplied to the bidirectional shift register 2, level shifters 3 through 5 respectively steps up the voltages of those signals, for example, to 15V, which is the driving voltage of the shift register 2.

In response to (a) the switching signal L/R whose voltage has been stepped up by the level shifter 5, and (b) a signal generated by inverting the switching signal L/R by an inverter circuit 6, the analog switches a1 through a6 and b1 through b6 for switching input of the flip-flops f1 through f6 carry out antithetical operations, so that the direction for shifting the starting signal SP in synchronism with the clock signal CK is changed to f1, f2, . . . , f6 or to f6, f5, . . . f1.

FIGS. 22 and 23 are electric circuit diagrams showing specific examples of a general level shifter. The level shifter shown in FIG. 22 includes NMOS transistors qn1 and qn2, PMOS transistors qp1 through qp4, and an inverter circuit inv.

Further, the PMOS transistors qp1 and qp2 and the NMOS transistor qn1 are provided in series between a high level VDD power source line and a ground level power source line. Similarly, the PMOS transistors qp3 and qp4 and the NMOS transistor qn2 are provided in series between those two power source lines. An input signal IN is supplied to the gate terminals of the PMOS transistor qp2 and the NMOS transistor qn1, and an inversion signal of the input signal IN is created by the inverter circuit inv and supplied to the gate terminals of the PMOS transistor qp4 and the NMOS transistor qn2. The drain terminals of the PMOS transistor qp2 and the NMOS transistor qn1 are connected to the gate terminal of the PMOS transistor qp3, and the drain terminals of the PMOS transistor qp4 and the NMOS transistor qn2 are connected to the gate terminal of the PMOS transistor qp1, and also to be an output terminal from which an output signal OUT is outputted.

In such an arrangement, when the input signal IN becomes high level, the NMOS transistor qn1 is turned on and the PMOS transistor qp3 is turned on, and then the PMOS transistor qp4 is turned on, the NMOS transistor qn2 is turned off, and the PMOS transistor qp1 is turned off, and the output signal OUT becomes high level (VDD). In this manner, the output signal OUT with a voltage which has been stepped up to VDD is outputted in the same phase as the input signal IN which has a low amplitude.

To operate the level shifter of FIG. 22, the voltage level of the input signal IN is required to be greater to a certain extent than the threshold voltages for the respective NMOS transistors qn1 and qn2. When the voltage level of the input voltage IN becomes lower than or close to the threshold values for the NMOS transistors qn1 and qn2, it may cause a problem, such as malfunction of the level shifter, or an exceptional increase of delay time of the output signal OUT.

However, one of the transistors is turned off in the series circuit of the PMOS transistor qp1 and the NMOS transistor qn2, and in the series circuit of the PMOS transistor qp3 and the NMOS transistor qn4, and therefore, a steady-state current does not flow in the level shifter section. Thus, it is possible to realize a system structure with low power consumption.

Meanwhile, the level shifter of FIG. 23 includes NMOS transistors qn11 through qn14 and PMOS transistors qp11 through qp14. Further, the PMOS transistor qp11 whose gate terminal is connected to ground, and the NMOS transistor qn11 connected to function as a diode are provided in series between the high level VDD power source line and the ground level power source line. Further, the PMOS transistor qp12 whose gate terminal is connected to ground, and the NMOS transistor qn12 constituting a current mirror circuit with the NMOS transistor qn11 are provided in series between the high level VDD power source line and the input terminal.

The output signal of the drain terminal of the PMOS transistor qp12 and the NMOS transistor qn12 is inverted by a CMOS inverter constituted of the PMOS transistor qp13 and the NMOS transistor qn13, and is further inverted and outputted by a CMOS inverter constituted of the PMOS transistor qp14 and the NMOS transistor qn14.

In this arrangement, a steady-state current always flows in the PMOS transistor qp11 and the NMOS transistor qn11, and the steady-state current further flows into the PMOS transistor qp12 and the NMOS transistor qn12. As a result, a predetermined gate voltage is generated, and the PMOS transistor qp11 and the NMOS transistor qn11 come into operation.

A voltage between gate and source of the NMOS transistor qn12 changes depending on the input signal IN so as to change the gate voltage of the PMOS transistor qp13 and the NMOS transistor qn13. This causes the CMOS inverter made of the PMOS transistor qp13 and the NMOS transistor qn13, and the CMOS inverter made of the PMOS transistor qp14 and the NMOS transistor qn14 to come into operation so as to carry out level shifting of the input signal IN which has a low amplitude. The signal which has been subjected to the level shifting is then outputted as an output signal OUT.

The level shifter of FIG. 23 may be brought into operation even when the voltage level of the input signal IN is not greater to a certain extent than that of the threshold voltage of the transistor. This level shifter however causes an increase of power consumption since the steady-state current always flows in the level shifter section.

Generally, a circuit made of monocrystal silicon transistors, because of having relatively small threshold values, uses the level shifter of FIG. 22, and a circuit made of a polycrystalline silicon thin film transistor, because of having relatively large threshold values, uses the level shifter of FIG. 23.

As described, when a polycrystalline silicon thin film transistor is used for the scanning direction control circuit 1 of FIG. 21, which is used as the scanning signal line driving circuit or the data signal line driving circuit, the scanning direction control circuit adopts the level shifter of FIG. 23. The level shifter of FIG. 23 may be adopted with no particular problems for a signal showing a frequent change, such as the clock signal CLK or the shift starting signal SP, because such a signal causes dominant power consumption due to the circuit operation, apart from the steady-state current. In contrast, this power consumption affects a signal which changes a shifting direction, which seldom changes, of the bidirectional shift register 2.

Further, when the shifting direction is changed in the bidirectional shift register 2, it is necessary to change the switching signal after the previous shifting operation by the bidirectional shift register 2 is completed but before a new starting signal SP is supplied to the shift register 2. This is because of the following reason. Namely, if the switching signal is changed during the signal shifting by the shift register 2, there arises an over current somewhere in the flip-flops f1 through f6, due to a short-circuit between input and output, which may cause malfunction of the shifting operation.

Further, when the shift register 2 is mounted in a display device, the foregoing problem may occur in the scanning signal line driving circuit, for example, when the switching signal is changed during the shifting operation by the shift register. Besides, such a change of the switching signal changes the scanning direction in the halfway of one screen display, and therefore, image display cannot be properly performed in some periods.

In view of the foregoing problems, in order to supply the switching signal at predetermined timings, it is necessary to arrange a new logic for securely inputting the signal after the previous shifting operation by the bidirectional shift register is completed but before the starting signal is newly supplied, regardless the timing of change of the switching signal.

SUMMARY OF THE INVENTION

The present invention is made in view of the foregoing conventional problems, and an object is to provide a scanning direction control circuit, which is capable of supplying a shift direction switching signal to a bidirectional shift register at predetermined timings regardless of external input timing of the switching signal, and capable of realizing low power consumption, and also to provide a display device including such a scanning direction control circuit.

In order to solve the foregoing problems, a scanning direction control circuit according to the present invention includes: a bidirectional shift register for performing bidirectional operation in which shifting direction is switched in accordance with a switching signal, the bidirectional shift register including a plurality of flip-flops which respectively operate in synchronism with a clock signal; a level shifter for stepping up the switching signal which is smaller than a driving voltage of the bidirectional shift register; a latch circuit for holding a signal level of the switching signal which has been stepped up by the level shifter; and a control circuit for, in response to output signals of the plurality of flip-flops, causing the latch circuit to carry out latching operation, and for controlling operation of the level shifter.

With the foregoing arrangement, a plurality of flip-flops sequentially shifts an input signal in one of the shifting directions. The shifting directions can be switched in accordance with a switching signal. The switching signal has amplitude smaller than driving voltage of the bidirectional shift register, and therefore, the amplitude of the switching signal is stepped-up by a level shifter and then supplied to a latch circuit.

The control circuit causes the latch circuit to carry out latching operation of the switching signal whose amplitude has been stepped up by the level shifter, by using output signals of the plurality of flip-flops constituting the bidirectional shift register. Further, the control circuit controls operation of the level shifter by using the output signals of the plurality of flip-flops.

In this manner, the stepped up switching signal, which is used for switching shifting direction, is fetched to the latch circuit at specific timings, by using output signals of the plurality of flip-flops. With this arrangement, the shifting direction switching signal can be supplied to the bidirectional shift register at the operation timing of the latch circuit regardless of external input timing of the switching signal. Further, since the control circuit controls operation of the level shifter, it is possible to prevent generation of a steady-state current in the level shifter except a period including the operation of the latch circuit, thus reducing power consumption.

Additional objects, features, and strengths of the present invention will be made clear by the description below. Further, the advantages of the present invention will be evident from the following explanation in reference to the drawings.

DESCRIPTION OF THE EMBODIMENTS

First embodiment of the present invention will be described below with reference to FIGS. 1 through 7.

Figure 1:
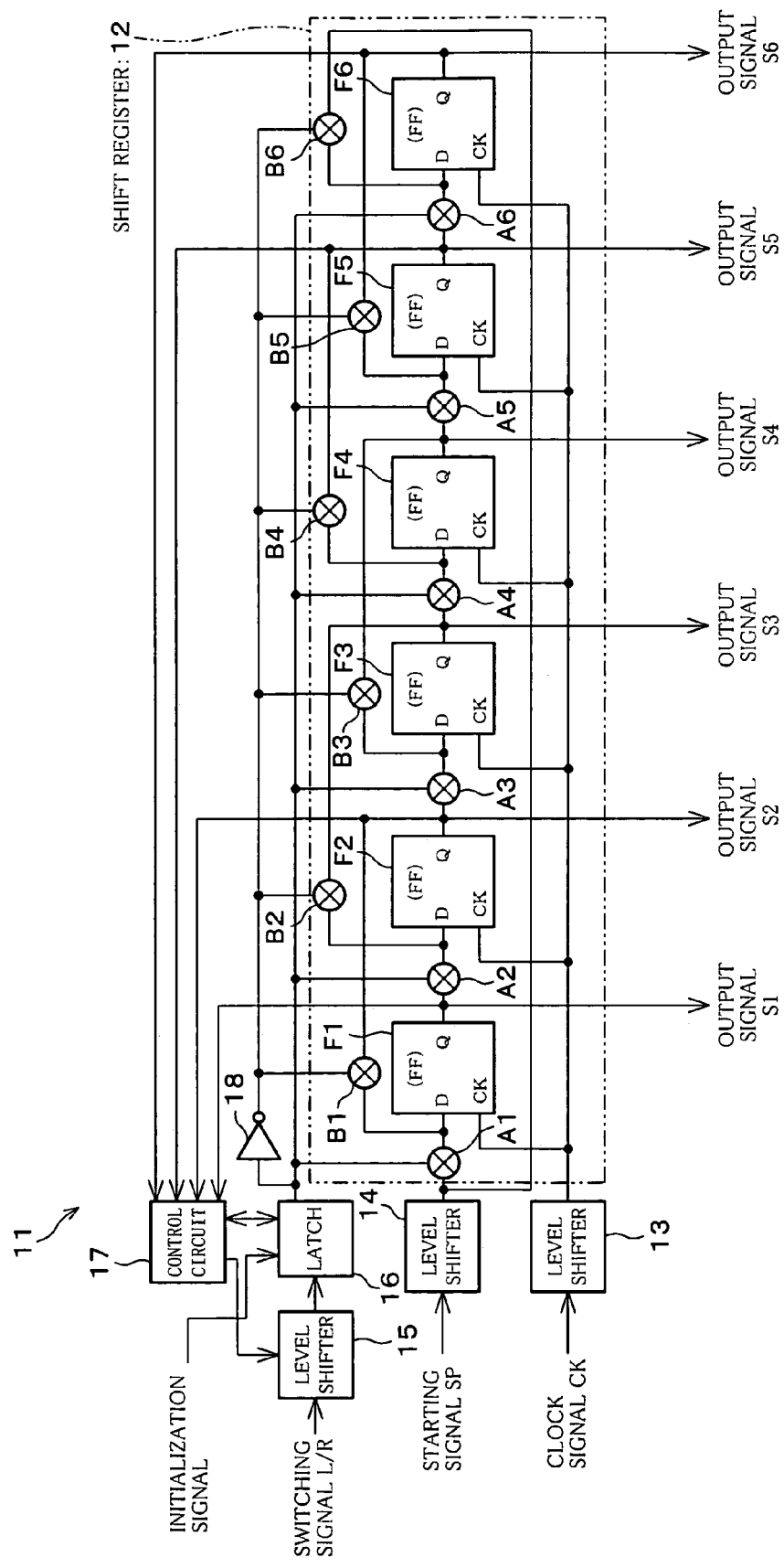
FIG. 1 is a block diagram showing an electrical arrangement of a scanning direction control circuit including a shifting direction switching circuit, according to First Embodiment of the present invention.

FIG. 1 is a block diagram showing an electrical arrangement of a scanning direction control circuit 11 according to First Embodiment of the present invention. The scanning direction control circuit 11 mainly includes a bidirectional shift register 12 (hereinafter simply referred to as a shift register 12) which is constituted of, for example, six flip-flops F1 through F6 and twelve analog switches A1 through A6 and B1 through B6; the level shifters 13, 14 and 15; a latch circuit 16; a control circuit 17 and an inverter circuit 18.

The shift register 12 includes six analog switches A1 through A6 and corresponding analog switches B1 through B6. These switches A1 through A6 and B1 through B6 operate as six pairs of switches, each of which corresponds to each input of the flip-flops F1 through F6. The analog switch A1 is provided between the first-stage flip-flop F1 and the level shifter 14, and the remaining analog switches A2 through A6 are provided between the corresponding flip-flops F2 through F6 and the preceding-stage flip-flops F1 through F5, respectively. In contrast, the analog switch B6 is positioned between the final-stage flip-flop F6 and the level shifter 14, and the remaining analog switches B1 through B5 are provided between the corresponding flip-flops F1 through F5 and the subsequent-stage flip-flops F2 through F6, respectively.

With this arrangement, as described later, these analog switches A1 through A6, and B1 through B6 are reversibly controlled by the switching signal L/R which has been outputted via the latch circuit 16 and an inverter circuit 18, so as to carry out a bidirectional shifting operation such that: (a) in one direction, the starting signal SP is sequentially shifted from the flip-flop F1 as the first stage, then the flip-flop 2, the flip-flop 3, . . . to the flip-flop F6 as the final stage, in synchronism with the clock signal CK, so that output signals S1, S2, . . . S6 are sequentially outputted in the same respective order; and (b) in the other direction, the starting signal SP is sequentially shifted from the flip-flop F6 as the first stage, then the flip-flop 5, the flip-flop 4, . . . to the flip-flop F1 as the final stage, so that the output signals S6, S5, . . . S1 are sequentially outputted in the same respective order.

Figure 2:
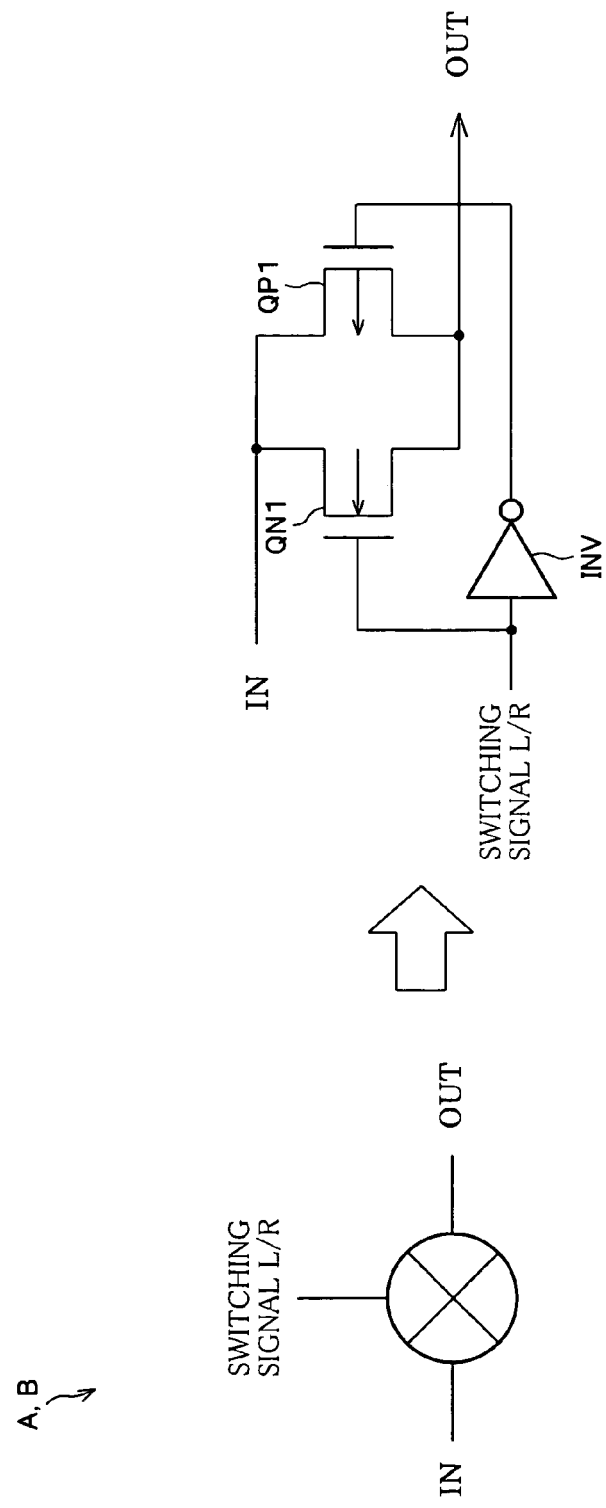
FIG. 2 is an electric circuit diagram showing an arrangement example of an analog switch provided in the scanning direction control circuit shown in FIG. 1.

FIG. 2 is an electric circuit diagram showing an arrangement example of the analog switches A1 through A6; B1 through B6 (hereinafter respectively referred to as a switch A and a switch B for giving a generic name). The analog switches A and B each include a pair of PMOS transistor QP1 and NMOS transistor QN1, and an inverter circuit INV. The switching signal L/R whose voltage has been stepped up is supplied directly from the latch circuit 16 to the gate terminal of the NMOS transistor QN1, and also supplied to the gate terminal of the PMOS transistor QP1 after being inverted by the inverter circuit INV.

Therefore, when the switching signal L/R becomes high level, those MOS transistors QN1 and QP1 are both turned on, so that a positive input signal and a negative input signal can be outputted by passing through the respective MOS transistors. On the other hand, when the switching signal L/R becomes low level, those MOS transistors QN1 and QP1 are both turned off, so that the input signals are blocked and cannot be outputted. Note that, because of the inversion by the inverter circuit 18, the switch B operates in accordance with a logic reverse to the above case for the switching signal L/R from the latch circuit 16.

The respective level shifters 13, 14 and 15 are supplied with, for example, a clock signal CK having an amplitude of approximately 5V, a starting signal SP, and a shifting direction switching signal L/R, respectively, and step up the voltages of those signals, for example, to 15V, 15V being a driving voltage of the shift register 12.

The clock signal CK which has been stepped up by the level shifter 13 is then supplied to the input terminals of the respective flip-flops F1 through F6. Further, as described, the starting signal SP which has been stepped up by the level shifter 14 is supplied to a data input terminal of one of the flip-flops F1 and F6 via the analog switch A1 or B6.

Further, the switching signal L/R which has been stepped up by the level shifter 15 is held by the latch circuit 16, and the switching signal L/R thus held is directly supplied from the latch circuit 16 to the analog switches A1 through A6 to be used for ON/OFF control of these switches, and also supplied to the analog switches B1 through B6 after being inverted by the inverter circuit 18 to be used for ON/OFF control of these switches.

Therefore, as described, the analog switches A1 through A6 and B1 through B6 are reversibly operated in response to the switching signal L/R. Such a reverse operation enables the flip-flops F1 through F6 to shift the starting signal SP in synchronism with the clock signal CK, while switching the shifting direction between the order from F1, F2, . . . , to F6 and the order from F6, F5, . . . to F1.

Figure 3:
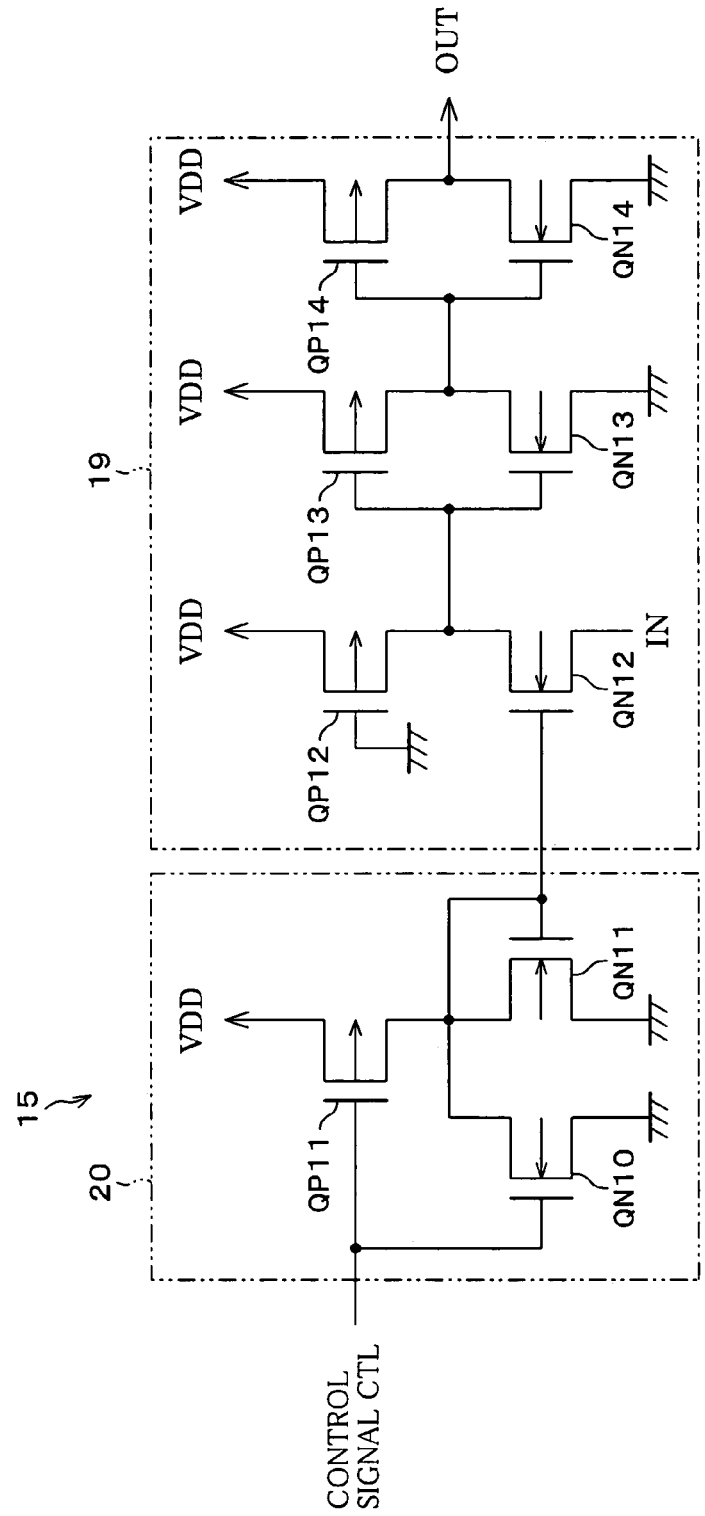
FIG. 3 is an electric circuit diagram showing a concrete arrangement of a level shifter provided in the scanning direction control circuit shown in FIG. 1.

FIG. 3 is an electric circuit diagram showing a concrete arrangement example of the level shifter 15. The level shifter 15 includes NMOS transistors QN10, QN11 through 14, and PMOS transistors QP11 through QP14. The level shifter 15 is mainly constituted of a level shifting section 19 for carrying out actual shifting operation of the switching signal L/R, and a bias section 20 for driving the level shifting section 19.

In the bias section 20, the PMOS transistor QP11 and the NMOS transistor QN11 connected so as to function as a diode are provided in series between a high level VDD power source line and a ground level power source line.

Further, the PMOS transistor QP12 whose gate terminal is connected to ground, and the NMOS transistor QN12 constituting a current mirror circuit with the NMOS transistor QN11 are provided in series between the high level VDD power source line and the input terminal.

The output of the drain terminal of the PMOS transistor QP12 and the NMOS transistor QN12 is inverted by a CMOS inverter constituted of the PMOS transistor QP13 and the NMOS transistor QN13, and is further inverted and outputted by a CMOS inverter constituted of the PMOS transistor QP14 and the NMOS transistor QN14. This arrangement is similar to that of the level shifter shown in FIG. 23.

However, in contrast to the PMOS transistor qp11 of FIG. 23 whose gate terminal is connected to the ground, the gate terminal of the PMOS transistor QP11 is supplied with a control signal CTL (described later) from the control circuit 17. The control signal CTL is also supplied to the gate terminal of the NMOS transistor QN10 which is provided in parallel with the NMOS transistor QN11.

Therefore, when the control signal CTL becomes low level, the NMOS transistor QN10 is turned off, and the PMOS transistor QP11 is turned on; and a predetermined gate voltage is created in the NMOS transistor QN11 by a constant current generated in the PMOS transistor QP11. The constant current flows through the NMOS transistor QN11, and further flows through the PMOS transistor QP12 and the NMOS transistor QN12, thus bringing the level shifter 15 into operation. The gate terminal of the PMOS transistor QP12 is always kept in the ground potential, which allows the PMOS transistor QP12 to generate a constant current. With such an arrangement, there is created a current-driven-type level shifting section 19, which is conducted throughout the operation.

Under such a circumstance, the voltage level of the input signal IN (the switching signal L/R) supplied to the source terminal of the NMOS transistor QN12 is controlled so as to vary the voltage between the gate and source of the NMOS transistor QN12. This voltage variation further causes variation of the gate potential of the PMOS transistor QP13 and the NMOS transistor QN13 so that the two-stage CMOS inverters are brought into operation, and an amplified output signal OUT is outputted in the same phase as the input signal IN having low amplitude.

On the other hand, when the control signal CTL becomes high level, the NMOS transistor QN10 is turned on, and short-circuits the NMOS transistor QN11 so that the PMOS transistor QP11 is turned off. Thus, no current flows through the PMOS transistor QP11 and the NMOS transistor QN11. Therefore, a bias current does not flow through the NMOS transistor QN12. Accordingly, the gate potential of PMOS transistor QP13 and the NMOS transistor QN13 becomes high level regardless of the voltage level of the input signal IN, and the level shifting operation for the input signal IN is not carried out. As a result, the output signal OUT is fixed to the VDD level, and the level shifter 15 suspends the operation.

With the suspension of the level shifting operation, the current flowing from the PMOS transistor QP11 to ground via the NMOS transistor QN11, and the current flowing from the PMOS transistor QP12 to the signal source of the input signal IN via the NMOS transistor QN12 are blocked, thus reducing power consumption.

Figure 23:
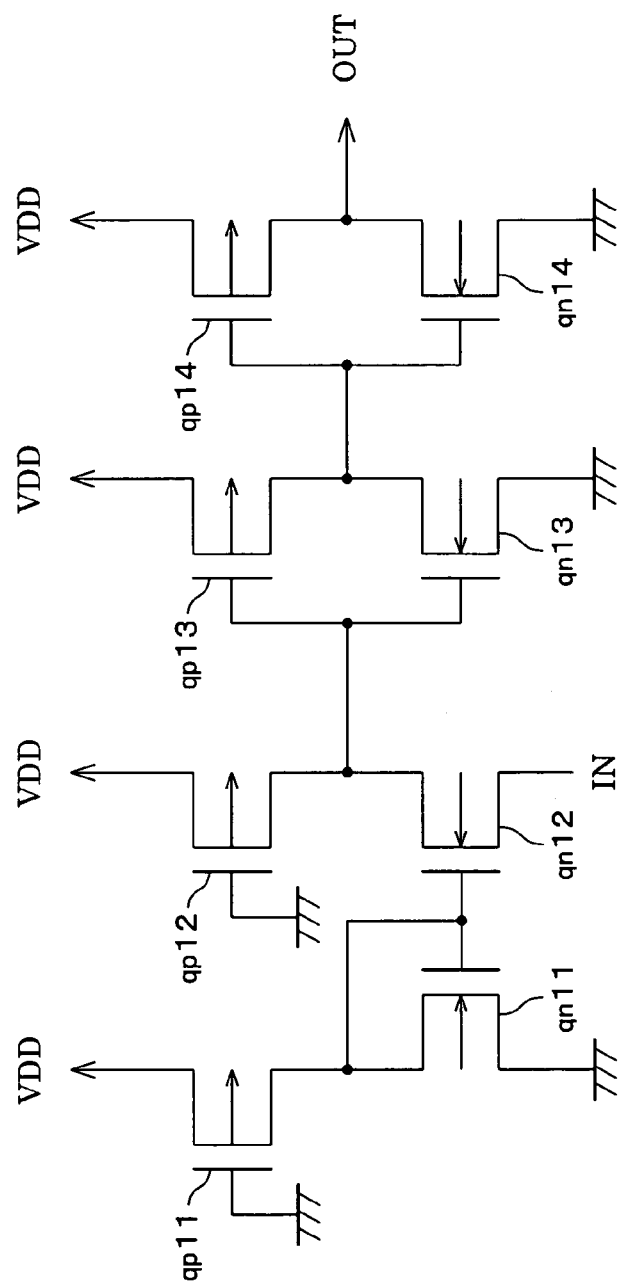
FIG. 23 is an electric circuit diagram showing a concrete arrangement example of a general level shifter.

Meanwhile, the level shifter shown in FIG. 23 of which manner of a steady-state current has been described above can be used for a level shifter for the clock signal CK and the starting signal SP, since the signal level of these signals frequently changes.

Figure 4:
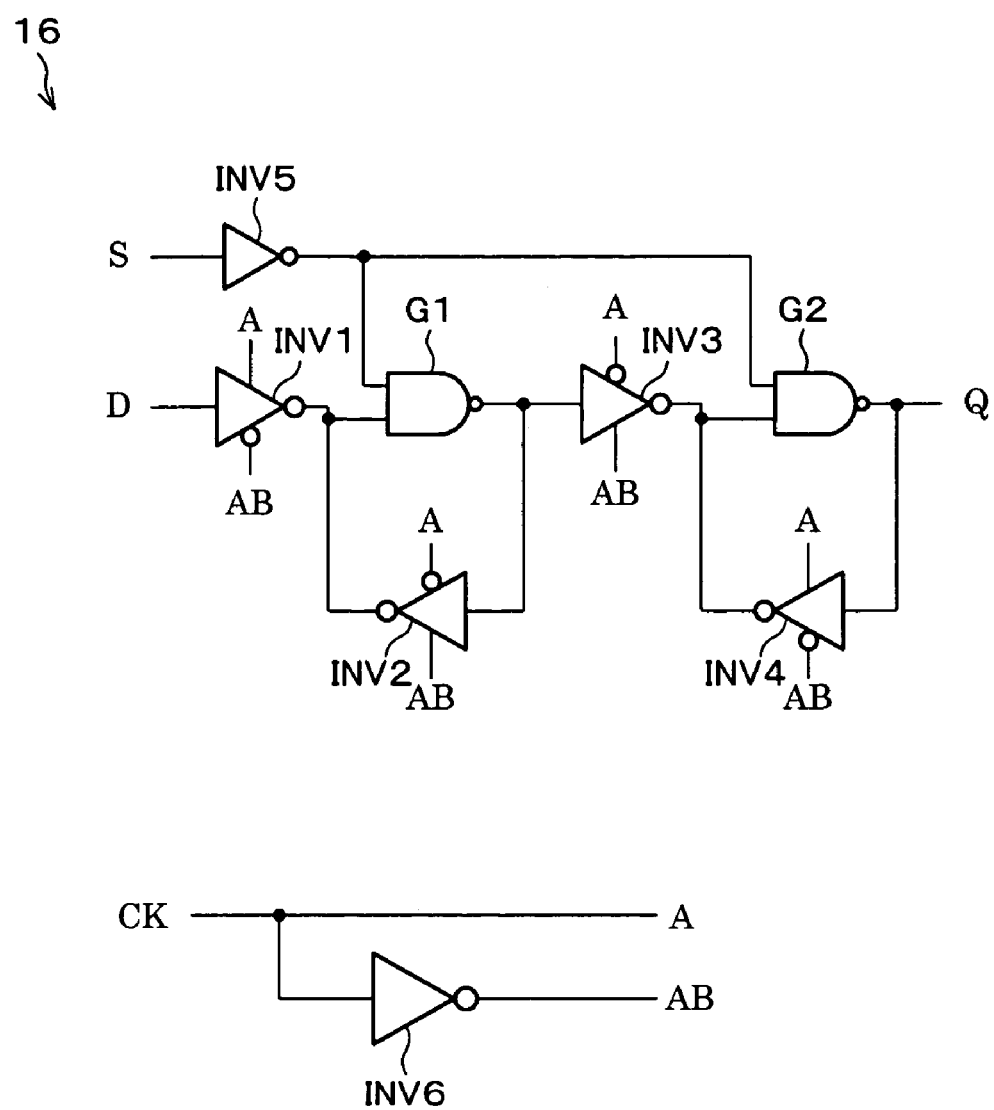
FIG. 4 is an electric circuit diagram showing a concrete arrangement of a latch circuit provided in the scanning direction control circuit shown in FIG. 1.

FIG. 4 is an electric circuit diagram showing a concrete arrangement of the latch circuit 16. The latch circuit 16 is a flip-flop constituted of clocked inverter circuits INV1 through INV4, NAND circuits G1 and G2, and inverter circuits INV5 and INV6.

The switching signal L/R which has been stepped up by the level shifter 15 for supplying to the data input terminal D through the level shift is supplied to one input of the NAND circuit G1 via the clocked inverter circuit INV1. The input of the NAND circuit G1 thus supplied with the switching signal L/R is given feedback from its own output via the clocked inverter circuit INV2. The output of the NAND circuit G1 is also supplied to one input of the NAND circuit G2 via the clocked inverter circuit INV3. The input of the NAND circuit G2 thus supplied with the output of the NAND circuit G1 is given feedback from its own output via the clocked inverter circuit INV4.

Further, the other inputs of the respective NAND circuits G1 and G2 are both supplied with an initial signal, which is inputted to a set input terminal S, via the inverter circuit INV5. Further, the clock signal CK is used without modification as a signal A in positive phase for driving the clocked inverter circuits INV1 through INV4, and also is inverted by the inverter circuit INV6 to be a signal AB in negative phase.

Therefore, when (a) the switching signal L/R inputted to the data input terminal D is latched at a falling edge of the clock signal CK, and (b) the initial signal inputted to the set input terminal S becomes high level, latch data from an output terminal Q is set to be high level.

Figure 5:
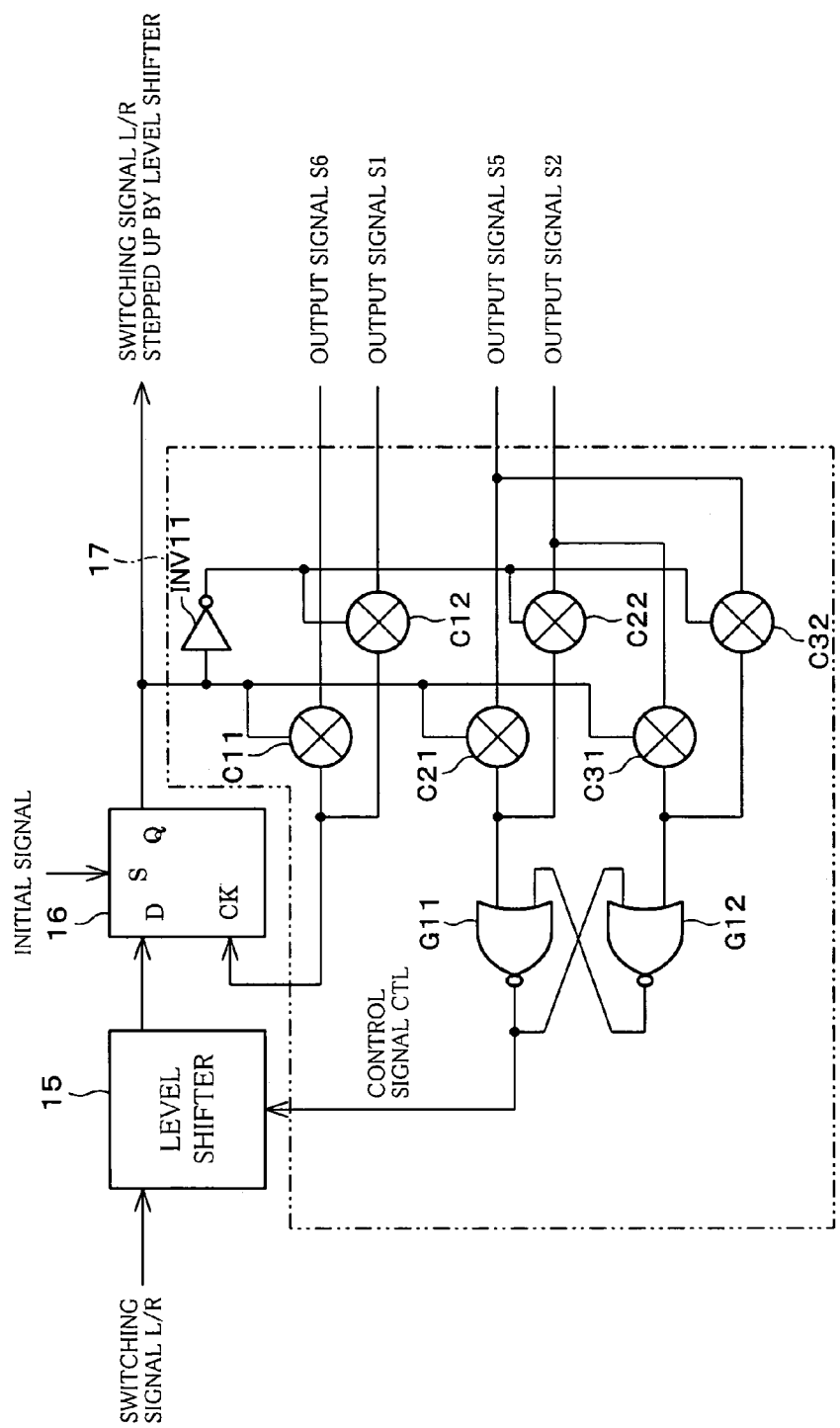
FIG. 5 is an electric circuit diagram showing a concrete arrangement of a control circuit provided in the scanning direction control circuit shown in FIG. 1.

FIG. 5 is an electric circuit diagram showing a concrete arrangement of the control circuit 17. The control circuit 17 includes an analog switch C11 (the first switch), C12 (the fourth switch), C21 (the second switch), C22 (the fifth switch), C31 (the third switch), C32 (the sixth switch), NOR circuits G1 and G12 and an inverter circuit INV11. The switching signal L/R through the level shift is supplied from the latch circuit 16 to be used as a signal for ON/OFF control of the analog switches C11, C21 and C31, and then is inverted by the inverter circuit INV11 to be supplied to the analog switches C12, C22, and C32 for their ON/OFF controls.

The analog switches C11 and C12 forms a pair. When those switches are selectively turned on in response to the switching signal L/R which has been stepped up by the level shifter, the output signal S6 or S1 is supplied to the clock input terminal CK of the flip-flop constituting the latch circuit 16.

Further, the analog switches C21 and C22 forms a pair, and when those switches are selectively turned on in response to the switching signal L/R which has been stepped up by the level shifter, the output signal S5 or S2 is supplied to one input terminal of the NOR circuit G11.

Further, the analog switches C31 and C32 forms a pair, and the output signal S5 or S2 is supplied to one input terminal of the NOR circuit G12.

The other input terminals of the NOR circuits G11 and G12 are connected to output terminals of the NOR circuits G12 and G11, respectively. Further, the output signal of the NOR circuit G11 is supplied to the level shifter 15 as the control signal CTL for controlling operation of the level shifter 15.

Figure 6:
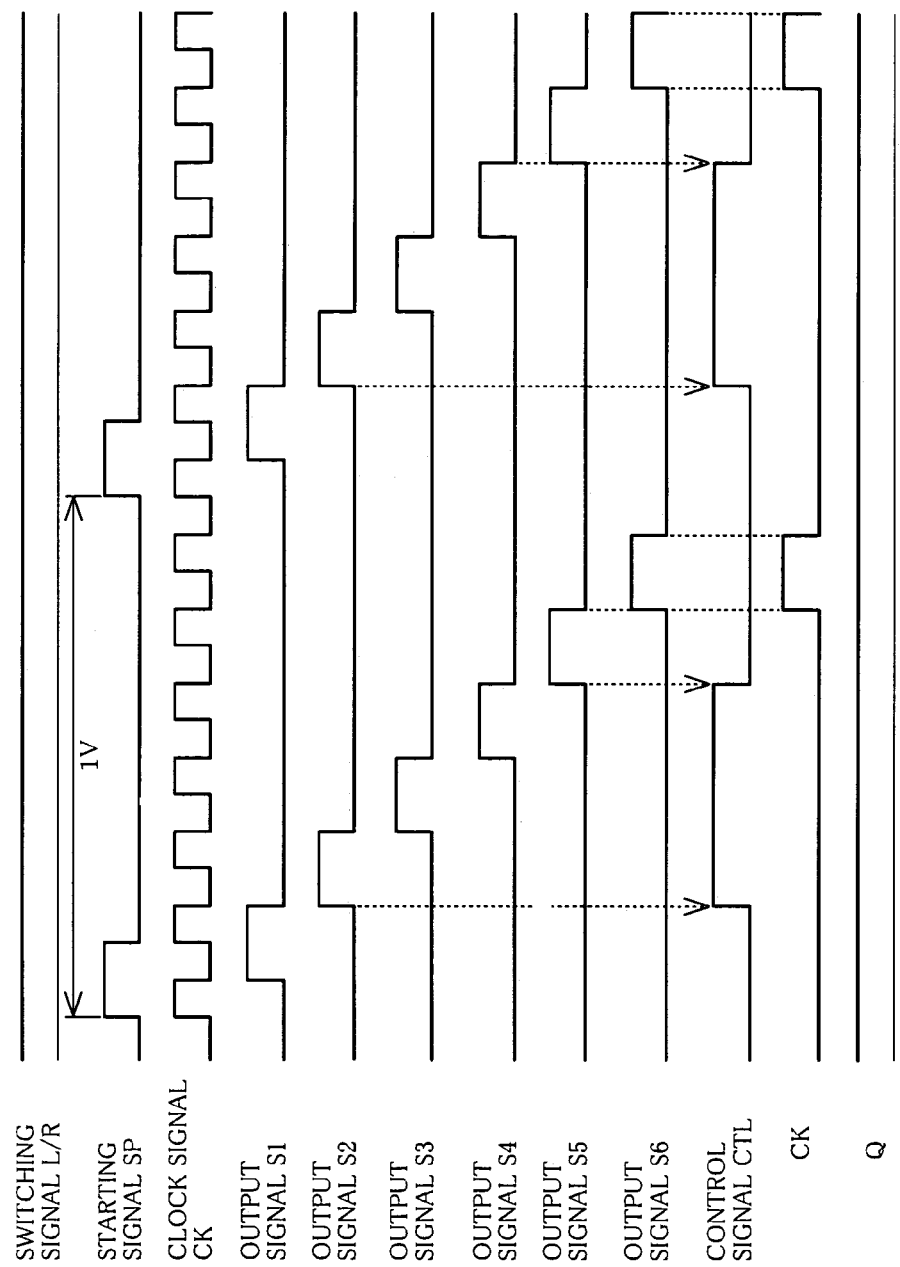
FIG. 6 is a timing chart for explaining operation of the scanning direction control circuit shown in FIG. 1.
Figure 7:
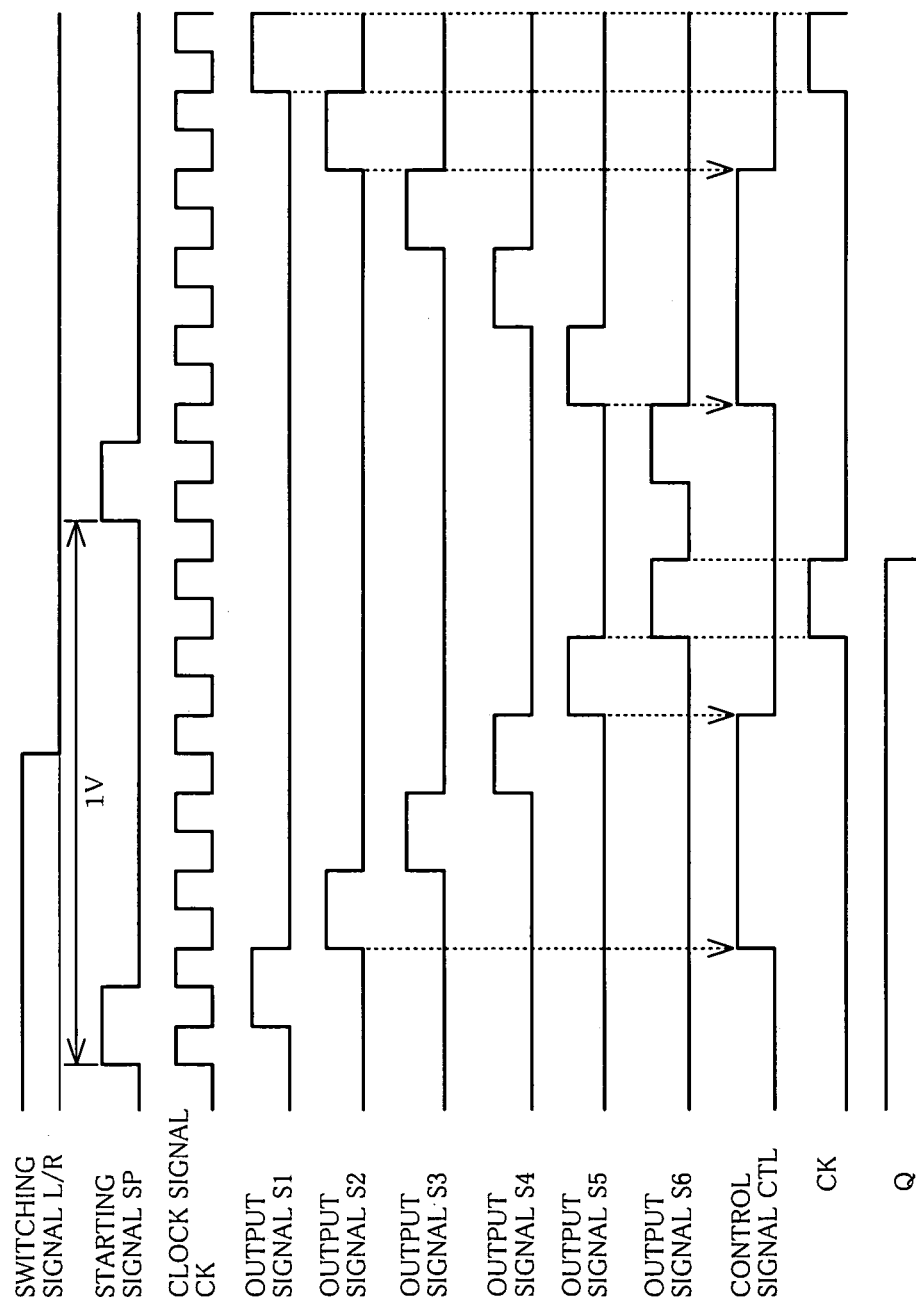
FIG. 7 is a timing chart for explaining operation of the scanning direction control circuit shown in FIG. 1.

FIGS. 6 and 7 are time charts for explaining operation of the scanning direction control circuit 11 with the foregoing arrangement. FIG. 6 shows the case where the switching signal L/R does not change (kept in high level) and FIG. 7 is the case where the switching signal L/R changes (from high level to low level).

Though it is not shown in the figures, it is assumed for these time charts that an initial signal is, in advance, supplied to the set input terminal S of the flip-flop constituting the latch circuit 16, so that the potential of the output terminal Q of the flip-flop, i.e., the potential of the switching signal L/R to be supplied to the shift register 12 is high level.

When the output terminal Q of the flip-flop constituting the latch circuit 16 becomes high level, the analog switches A1 through A6 are turned on and the analog switches B1 through B6 are turned off in the shift register 12. Therefore, when the clock signal CK and the starting signal SP which have respectively been stepped up by the level shifters 13 and 14 are supplied, as shown in FIG. 6, the starting signal SP is sequentially shifted through the respective flip-flops F1 through F6 at each falling edge of the clock signal CK, so that the output signals S1 through S6 are outputted, respectively.

When the potential of the switching signal L/R is high level, in FIG. 5, the analog switch C11 is turned on and the analog switch C12 is turned off. Therefore, the clock input terminal CK of the flip-flop constituting the latch circuit 16 is supplied with the output signal S6 from the flip-flop F6, which is the final stage flip-flop in terms of the shifting direction. Then, the timing of falling of the output signal S6 from high level to low level is used as the latch timing of the flip-flop 6 for latching the output potential of the preceding level shifter (the level shifter 15), the output potential being supplied to the data input terminal D. In this manner, since, at the same time, the data of the switching signal L/R is fetched to the flip-flop and the shifting operation of the shift register 12 is completed, any changes of the fetched data do not affect the shift register 12.

Further, when the potential of the switching signal L/R is high level, in FIG. 5, the analog switches C21 and C31 are turned on and the analog switches C22 and C32 are turned off. Thus, the output signal S5 is supplied to one input terminal of the NOR circuit G11, and the output signal S2 is supplied to one input terminal of the NOR circuit G12. Accordingly, the control signal CTL becomes inactive high level at the timing where the output signal S2 becomes, and maintains high level while the output signals S2 and S5 are both low level. Then, at the timing where the output signal S5 becomes high level, the control signal CTL becomes active low level maintains low level while the output signals S2 and S5 are both low level.

Accordingly, the level shifter 15 is controlled to be in active state (in operation) during a period from the, time when the output signal S5 has become high level to the time when the output signal S2 becomes high level. More specifically, the level shifter 15 is in active state (in operation) in a predetermined period including the timing when the latching of the flip-flop constituting the latch circuit 16 is carried out, so that the level shift of the switching signal L/R is carried out to output the signal to the data input terminal D of the flip-flop constituting the latch circuit 16. The level shifter 15 is controlled to be in inactive state (stopped)

during a period from the time when the output signal S2 has become high level to the time when the output signal S5 becomes high level.

On the other hand, in a case where the switching signal L/R changes as shown in FIG. 7, as has been described, when a scanning period 1V starts with the switching signal L/R having high level potential, in the shift register 12, the analog switches A1 through A6 are turned on, and the analog switches B1 through B6 are turned off, and the flip-flops F1 through F6 sequentially output the output signals S1 through S6 at each falling edge of the clock signal CK.

Further, in FIG. 5, the analog switch C11 is turned on and the analog switch C12 is turned off, and the output signal S6 is supplied to the clock input terminal CK of the flip-flop constituting the latch circuit 16. The output potential of the level shifter 15 is latched at the timing of falling of the output signal S6 from high level to low level, so that the output level of the flip-flop is changed.

In this manner, since, at the same time, (a) the data of the switching signal L/R is fetched to the flip-flop and (b) the shifting operation of the shift register 12 is completed any changes of the fetched data do not affect the shift register 12.

Further, when the potential of the switching signal L/R is high level, in FIG. 5, the analog switches C21 and C31 are turned on and the analog switches C22 and C32 are turned off. Thus, the output signal S5 is supplied to one input terminal of the NOR circuit G11, and the output signal S2 is supplied to one input terminal of the NOR circuit G12.

Accordingly, as with the case of FIG. 6, the control signal CTL becomes inactive high level at a timing at a timing when the output signal S2 becomes high level, and the control signal CTL becomes active low level at a timing at a timing when the output signal S5 becomes high level. Thus, the level shifter 15 is controlled to be in active state in a predetermined period including the timing for latching, and is controlled to be in inactive state during a period from the time when the output signal S2 has become high level to the time when the output signal S5 becomes high level.

The output of the flip-flop constituting the latch circuit 16 is changed to low level in the next scanning period, and therefore the analog switches A1 through A6 are turned off, and the analog switches B1 through B6 are turned on, and the flip-flops F6 through F1 sequentially output the output signals S6 through S1 in this order at each falling edge of the clock signal CK.

Further, the analog switch C11 is turned off and the analog switch C12 is turned on, and the output signal S1 is supplied to the clock input terminal CK of the flip-flop constituting the latch circuit 16, and the output potential of the level shifter 15 is latched at the timing of falling of the output signal S1 from high level to low level.

Further, when the potential of the switching signal L/R is low level, in FIG. 5, the analog switches C21 and C31 are turned off and the analog switches C22 and C32 are turned on. Thus, the output signal S2 is supplied to one input terminal of the NOR circuit G11, and the output signal S5 is supplied to one input terminal of the NOR circuit G12.

Accordingly, the control signal CTL becomes inactive high level at a timing when the output signal S5 becomes high level, and the control signal CTL becomes active low level at a timing when the output signal S2 becomes high level. Thus, the level shifter 15 is controlled to be in active state in a predetermined period including the timing for latching, and is controlled to be in inactive state during a period from the time when the output signal S2 has become high level to the time when the output signal S5 becomes high level.

As described, the scanning direction control circuit 11 according to the present invention includes: the level shifter 15 for stepping up the amplitude of the switching signal L/R which has lower amplitude than that of the driving voltage of the shift register 12; and a latch circuit 16 provided between the level shifter 15 and the shift register 12. The level shifter 15 and the latch circuit 16 are controlled, by the control circuit 17 based on the output signals S1, S2, S5 and S6 which are outputted from the flip-flops F1, F2, F5 and F6 constituting the shift register 12, so that (a) the latch circuit 16 carries out latching operation at a timing of finishing the shifting operation of the flip-flops F1 through F6, and (b) the shift register 15 is in operation during the timing for latching.

On this account, the period, during which a steady-state current that presents problems for the shift register 15 is generated, can be shortened and power consumption can be reduced in the level shifter 15, even when a current-driven type level shifter is used as the level shifter 15. The current-driven type level shifter is suitably used for a circuit using polysilicon thin film transistors, and enables of carrying out the level shifting with respect to the switching signal L/R without any trouble, even when the amplitude of the input signal is lower than the threshold voltage of the input switching element.

Further, the voltage of the switching signal L/R is kept by the latch circuit 16 after the level shifting is carried out by the level shifter 15. Therefore, the switching signal L/R is fetched to the latch circuit 16 at the end of one (1) scanning period 1V (i.e., at completion of the shifting operation), even when the switching signal L/R is inputted at an arbitrary timing. Thus, it is possible to prevent overcurrent or malfunction caused by collision of shift data among the flip-flops F1 through F6, thereby realizing secure operation.

Second Embodiment of the present invention will be described below with reference to FIGS. 8 through 12.

Figure 8:
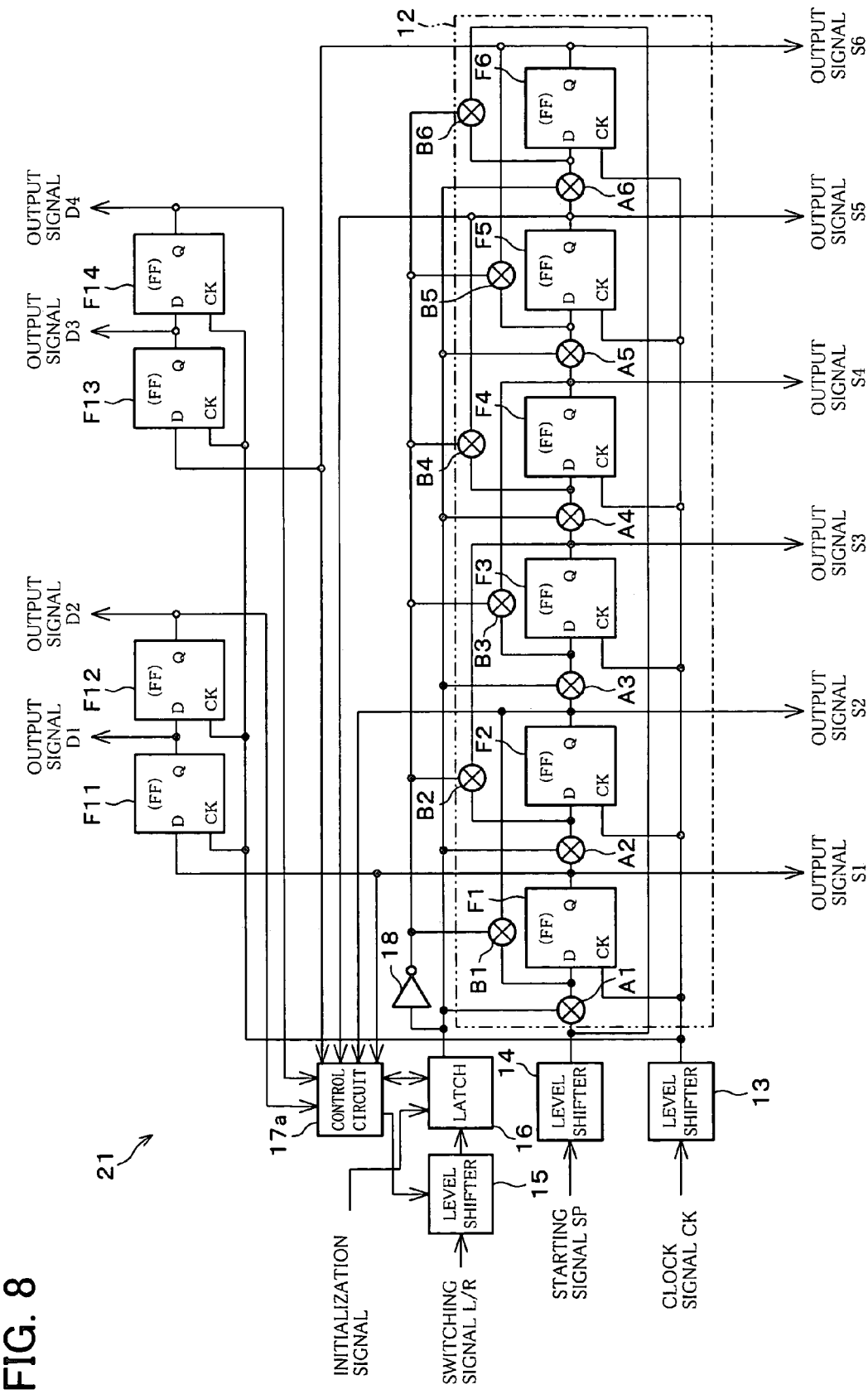
FIG. 8 is a block diagram showing an electrical arrangement of a scanning direction control circuit according to Second Embodiment of the present invention.

FIG. 8 is a block diagram showing an electrical arrangement of a scanning direction control circuit 21 according to Second Embodiment of the present invention. The scanning direction control circuit 21 is similar to the scanning direction control circuit 11 shown in FIG. 1, and therefore members having the equivalent functions will be given the same reference symbols, and explanation thereof will be omitted here.

As a notable feature of the scanning direction control circuit 21, the shift register 12 is further provided with flip-flops F11 through F14 (auxiliary flip-flops), and a control signal 17a uses output signals D2 and D4 of the flip-flops F12 and F14 so as to generate a control signal CTL for controlling the shift register 15.

The flip-flop F11 is supplied with an output signal of the flip-flop F1 of the shift register 12, and the flip-flop F12 is supplied with an output signal of the flip-flop F11. Similarly, the flip-flop F13 is supplied with an output signal of the flip-flop F6 of the shift register 12, and the flip-flop F14 is supplied with an output signal of the flip-flop F13. These flip-flops F11 through F14 are operated in synchronism with the clock signal CK which has been stepped up by a level shifter and which is supplied to the respective flip-flops F1 through F6.

Figure 9:
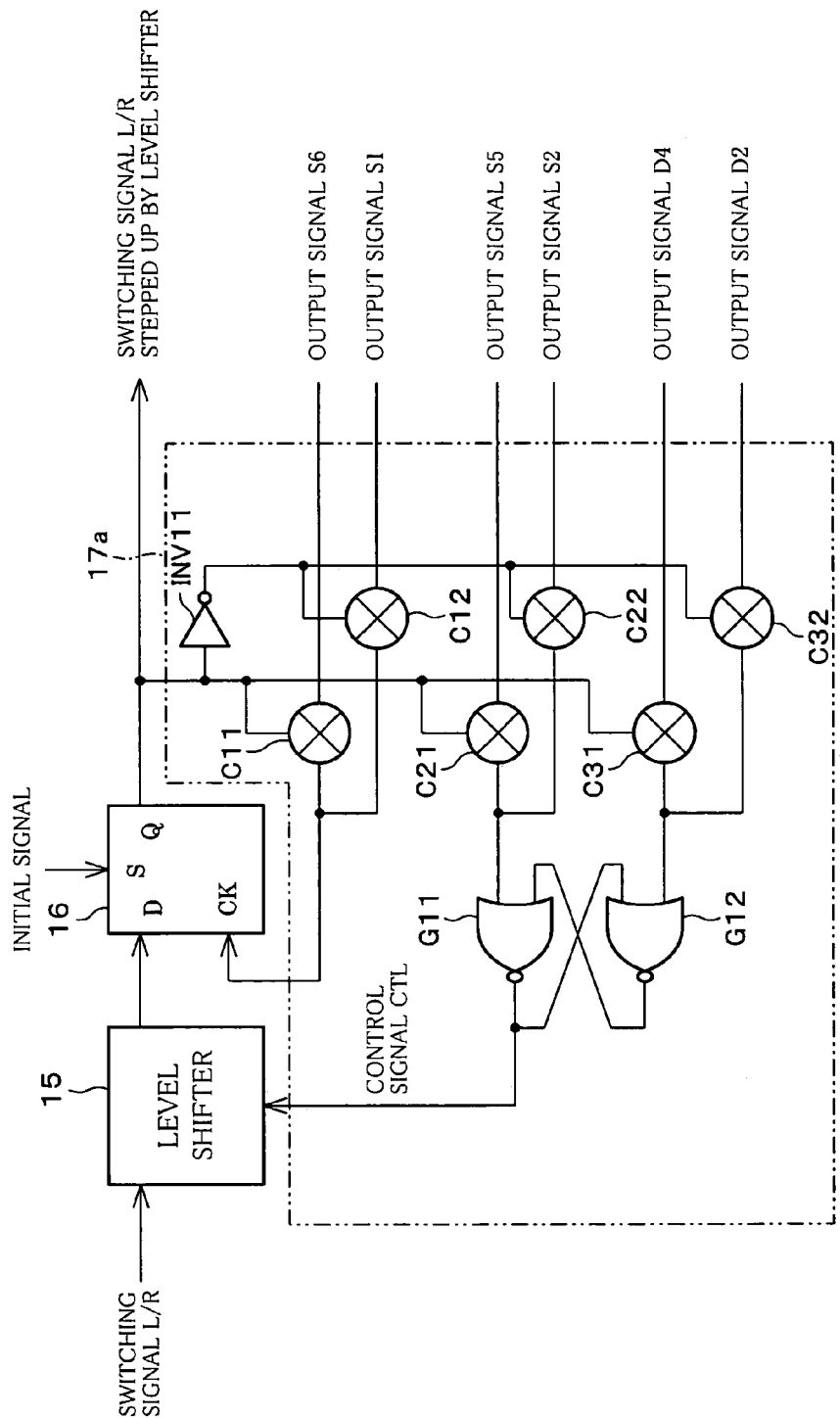
FIG. 9 is an electric circuit diagram showing a concrete arrangement of a control circuit provided in the scanning direction control circuit shown in FIG. 8.

FIG. 9 is an electric circuit diagram showing a concrete arrangement example of the control circuit 17a. The control circuit 17a has the similar arrangement to that of the control circuit 17 shown in FIG. 5, except that the analog switches C31 and C32 for specifying the timing for deactivating (suspending the operation of) the level shifter 15 are supplied with output signals D4 and D2, whereas the analog switches C31 and C32 is supplied with the output signals S2 and S5 in the foregoing control circuit 17.

Figure 10:
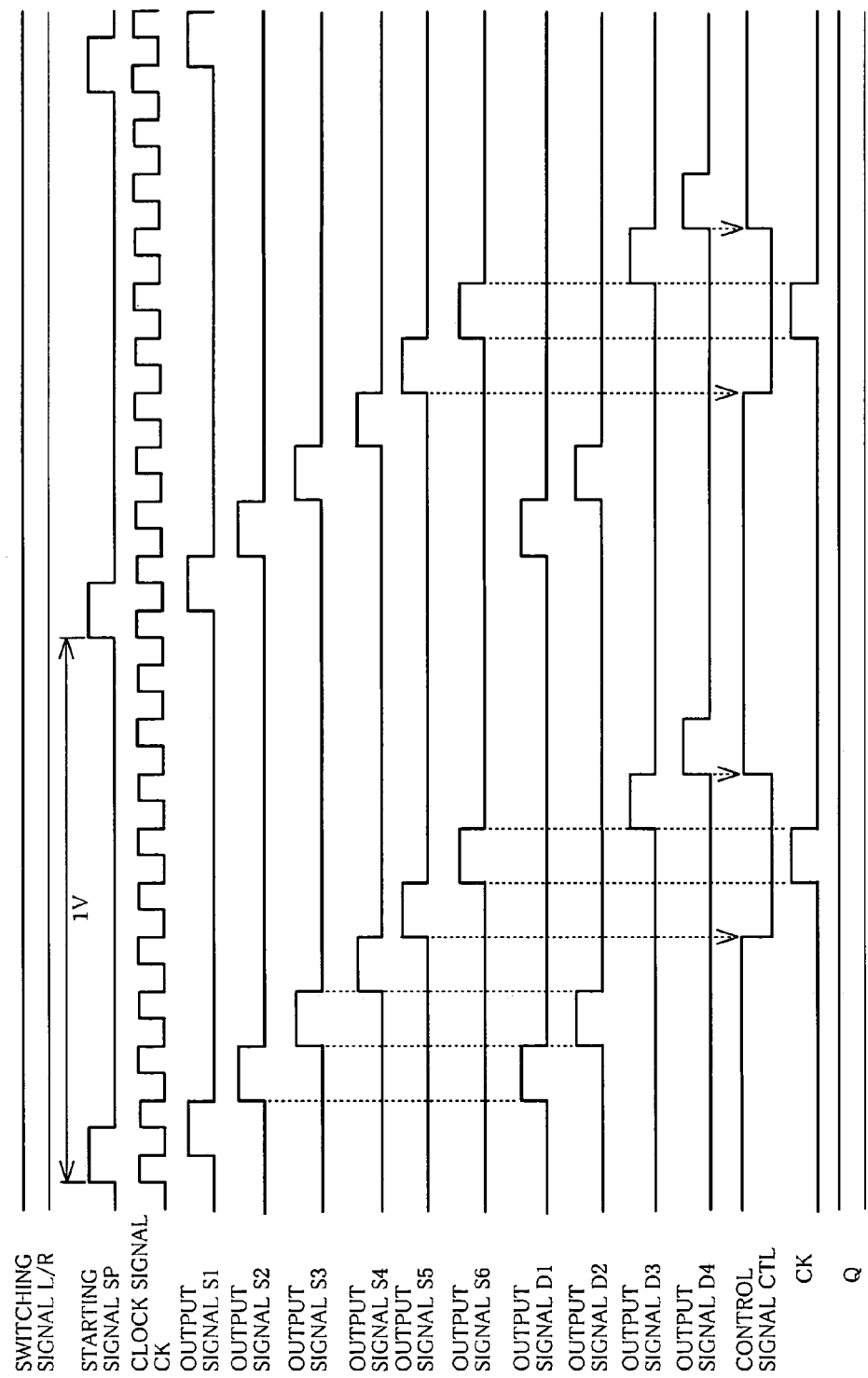
FIG. 10 is a timing chart for explaining operation of the scanning direction control circuit shown in FIG. 8.
Figure 11:
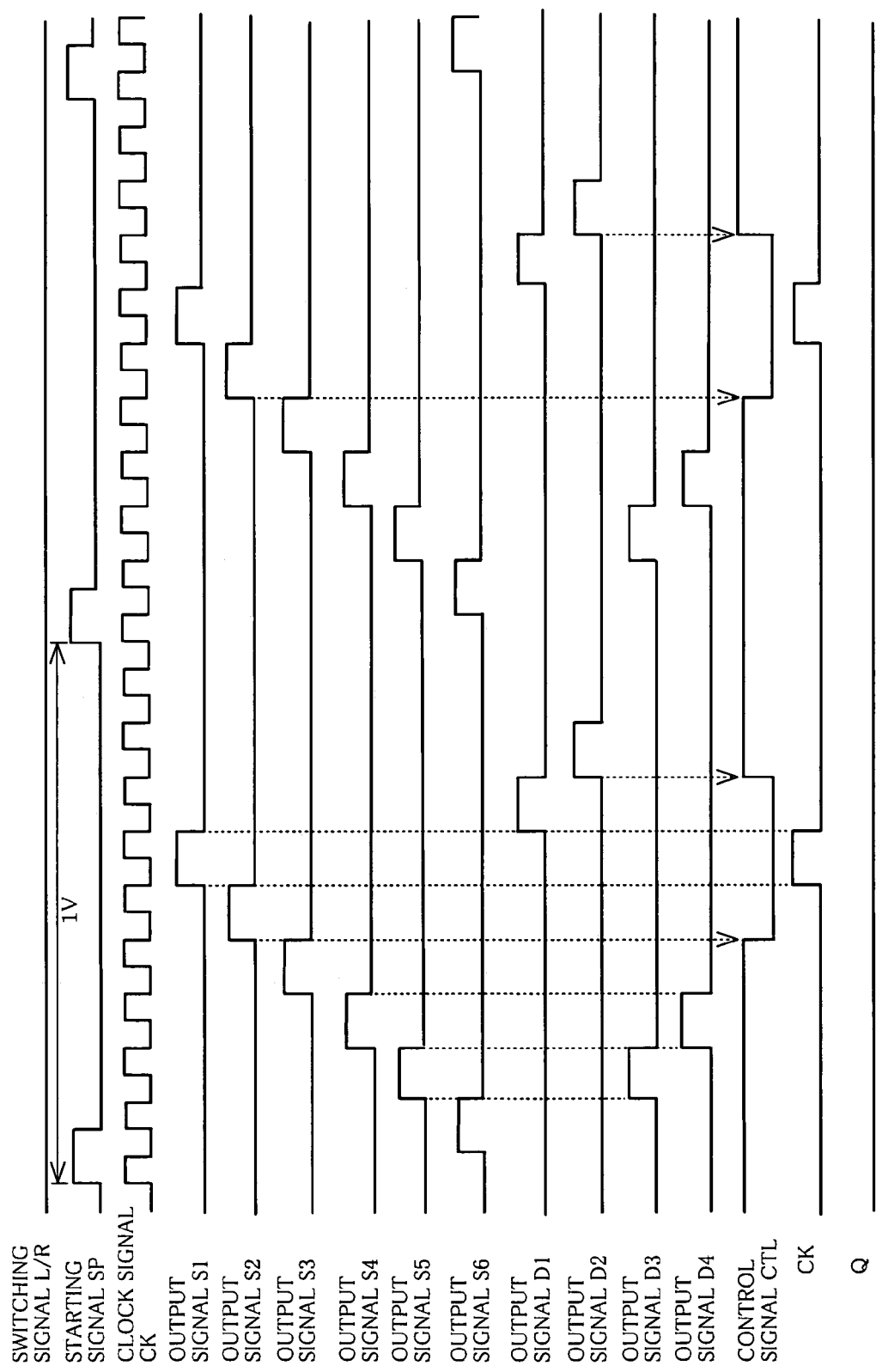
FIG. 11 is a timing chart for explaining operation of the scanning direction control circuit shown in FIG. 8.
Figure 12:
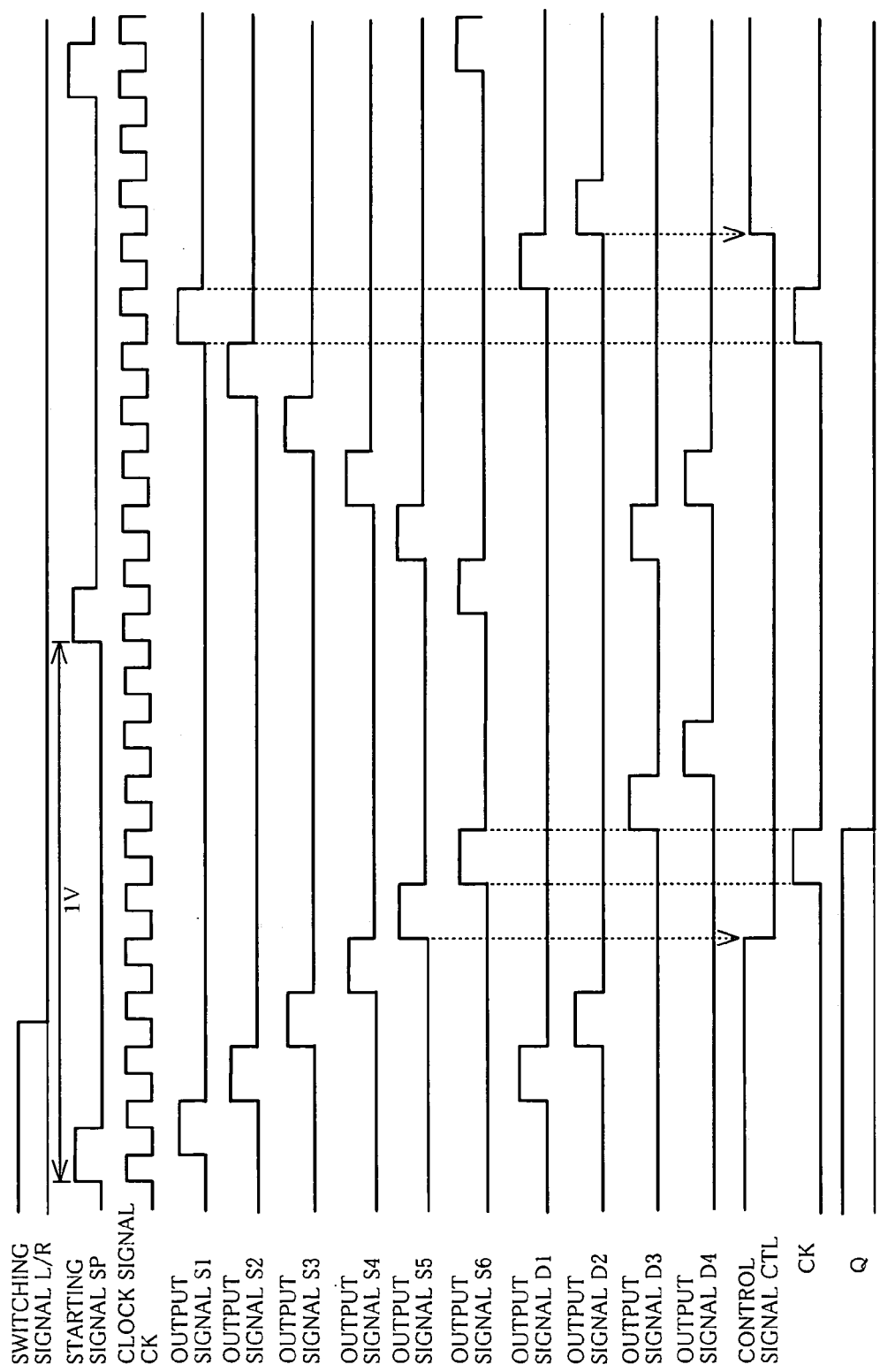
FIG. 12 is a timing chart for explaining operation of the scanning direction control circuit shown in FIG. 8.

FIGS. 10 through 12 are time charts for explaining operation of the scanning direction control circuit 21 having the foregoing arrangement. FIG. 10 shows the case where the switching signal L/R is high level, FIG. 11 shows the case where the switching signal L/R is low level, and FIG. 12 shows the case where the switching signal L/R changes from high level to low level.

Though it is not shown in the figure, it is assumed for the time charts shown in FIGS. 10 and 12 that an initial signal S is previously supplied to the set input terminal S of the flip-flop constituting the latch circuit 16, so that the potential of the output terminal Q of the flip-flop, i.e., the potential of the switching signal L/R supplied to the shift register 12 is high level.

When the output terminal Q of the flip-flop constituting the latch circuit 16 becomes high level, the analog switches A1 through A6 are turned on and the analog switches B1 through B6 are turned off, in the shift register 12. Therefore, as with the case of FIG. 6, when the clock signal CK and the starting signal SP which have respectively stepped up by the level shifters 13 and 14 are supplied, the starting signal SP is sequentially shifted through the respective flip-flops F1 through F6 at each falling edge of the clock signal CK, so that the output signals S1 through S6 are respectively outputted, as shown in FIG. 10.

Further, when the potential of the switching signal L/R is high level, in FIG. 9, the analog switch C11 is turned on and the analog switch C12 is turned off. Therefore, the clock input terminal CK of the flip-flop constituting the latch circuit 16 is supplied with the output signal S6, and the timing of falling of the output signal S6 from high level to low level is used as the latch timing of the flip-flop for latching the output potential of the preceding stage level shifter (the level shifter 15), which is supplied to the data input terminal D.

In this manner, since, at the same time, (a) the data of the switching signal L/R is fetched to the flip-flop and (b) the shifting operation of the shift register 12 is completed, any changes of the fetched data do not affect the shift register 12. This series of operations is similar to that described above with reference to FIGS. 6 and 7.

Further, when the switching signal L/R is high level as with the case above, the flip-flops F1 and F12 are in parallel with the flip-flops F2 and F3 in the scanning direction control circuit 21, and output signals D1 and D2 are outputted at the same timings as the output signals S2 and S3, respectively.

On the other hand, the flip-flops F13 and F14 are further provided so as to follow the final stage flip-flop F6, and output signals D3 and D4 in this order are outputted after the output signal S6 is outputted.

Therefore, when the potential of the switching signal L/R is high level, in FIG. 9, the analog switches C21 and C31 are turned on and the analog switches C22 and C32 are turned off. Thus, the output signal S5 is supplied to one input terminal of the NOR circuit G11, and the output signal D4 is supplied to one input terminal of the NOR circuit G12. Accordingly, the control signal CTL becomes active low level at the timing where the output signal S5 becomes high level and maintains high level during the period in which the output signals D4 and S5 are both low level. At the timing where the output signal D4 becomes high level, the control signal CTL becomes inactive high level and maintains high level during the period in which the output signals D4 and S5 are both low level the output signals D4 and S5 are both kept low level.

Accordingly, the level shifter 15 is controlled to be in active state (in operation) during a period from the time when the output signal S5 has become high level to the time when the output signal D4 becomes high level. More specifically, the level shifter 15 is controlled to be in active state (in operation) in a predetermined period including the timing for latching the flip-flop constituting the latch circuit 16. The level shifter 15 is controlled to be in inactive state (stopped) during a period from the time when the output signal D4 has become high level to the time when the output signal S5 becomes high level.

Similarly, when the switching signal L/R is low level as shown in FIG. 11, the flip-flops F13 and F14 are in parallel with the flip-flops F5 and F4, respectively, in the scanning direction control circuit 21, and output signals D3 and D4 are outputted at the same timings as the output signals S5 and S4, respectively. On the other hand, the flip-flops F11 and F12 are further provided in series so as to follow the final stage flip-flop F1, and output signals D1 and D2 are outputted in this order after the output signal S1 is outputted.

Therefore, when the potential of the switching signal L/R is low level, in FIG. 9, the analog switches C21 and C31 are turned off and the analog switches C22 and C32 are turned on. Also, the output signal S2 is supplied to one input terminal of the NOR circuit G11, and the output signal D2 is supplied to one input terminal of the NOR circuit G12. Accordingly, the control signal CTL becomes active low level at the timing when the output signal S5 becomes high level, and maintains low level while the output signals D2 and S2 are both low level. Then, at the timing where the output signal D2 becomes high level, the control signal CTL becomes inactive high level and maintains that condition while the output signals D2 and S2 are both kept in low level.

Accordingly, the level shifter 15 is controlled to be in active state (in operation) during a period from the time when the output signal S2 has become high level to the time when the output signal D2 becomes high level. More specifically, the level shifter 15 is controlled to be in active state (in operation) in a predetermined period including the timing for latching the flip-flop constituting the latch circuit 16, so as to step up the switching signal L/R and output it to the shift register. The level shifter 15 is controlled to be in inactive state (stopped) during a period from the time when the output signal D2 has become high level to the time when the output signal S2 becomes high level.

On the other hand, when the switching signal L/R changes as shown in FIG. 12, as has been described, when a scanning period 1V starts with the switching signal L/R having high level potential, the analog switches A1 through A6 are turned on, and the analog switches B1 through B6 are turned off and the flip-flops F1 through F6 sequentially output the output signals S1 through S6 at each falling edge of the clock signal CK.

Further, in FIG. 9, the analog switch C11 is turned on and the analog switch C12 is turned off, and the output signal S6 is supplied to the clock input terminal CK of the flip-flop constituting the latch circuit 16, and the output potential of the level shifter 15 is latched at the timing of falling of the output signal S6 from high level to low level, so that the output level of the flip-flop is changed.

Further, when the potential of the switching signal L/R is high level, the analog switches C21 and C31 are turned on and the analog switches C22 and C32 are turned off. Thus, the output signal S5 is supplied to one input terminal of the NOR circuit G11, and the output signal D4 is supplied to one input terminal of the NOR circuit G12. Accordingly, as with the case of FIG. 10, the control signal CTL becomes active low level at a timing when the output signal S5 becomes high level, and the scanning period is finished.

The output of the flip-flop constituting the latch circuit 16 is changed to low level in the next scanning period, and therefore in the shift register 12 the analog switches A1 through A6 are turned off, and the analog switches B1 through B6 are turned on, and the flip-flops F6 through F1 sequentially output the output signals S6 through S1 in this order at each falling edge of the clock signal CK.

Further, in FIG. 9, the analog switch C11 is turned off and the analog switch C12 is turned on, and the output signal S1 is supplied to the clock input terminal CK of the flip-flop constituting the latch circuit 16, and the output potential of the level shifter 15 is latched at the timing of falling of the output signal S1 from high level to low level.

On the other hand, the control signal CTL is kept in low level, and when the potential of the switching signal L/R is low level, the analog switches C21 and C31 are turned off and the analog switches C22 and C32 are turned on. Thus, the output signal S2 is supplied to one input terminal of the NOR circuit G11, and the output signal D2 is supplied to one input terminal of the NOR circuit G12 so that the control signal CTL becomes inactive high level at a timing when the output signal D2 becomes high level. If the potential of the switching signal L/R is kept in low level, the control signal CTL is kept in inactive high level until the output signal S2 becomes high level in the next scanning period, so that the level shifter 15 is controlled to be in inactive state.

As described, by thus providing the auxiliary flip-flops F11 through F14 in addition to the flip-flops F1 through F6 constituting the shift register 12, and by supplying the output signal S1 or S6 from the final stage flip-flop F1 or F6 to the flip-flop F11 or F13, it is possible to delay the shifting operation of the shift register 12 by the number of stages of the auxiliary flip-flops F11, F12, F13 and F14. Further, the period for active state of the level shifter 15 can be easily set by using the output signals D2 and D4 from the respective auxiliary flip-flops F12 and F14.

Further, unlike the scanning direction control circuit 11, the scanning direction control circuit 21 cannot suppress power consumption only in the subsequent scanning period in which the switching signal L/R is changed. However, as shown in FIGS. 10 and 11, it is possible to bring the level shifter 15 into active state within 1 scanning period V and to bring the level shifter 15 back in inactive state again if the switching signal L/R is constant, i.e., kept in high level or low level. Accordingly, when a period during which the scanning is suspended is set long, the level shifter 15 can be prevented from constantly consuming power. On this account, power consumption can be further reduced when considering frequency of changing of the switching signal L/R etc. Further, as with the scanning direction control circuit 11, the scanning direction control circuit 21 can avoid that the change of the switching signal L/R does not affect internal circuits until the shifting operation is completed, regardless of the time at which the switching signal L/R changes.

Third Embodiment of the present invention will be described below with reference to FIGS. 13 through 16.

Figure 13:
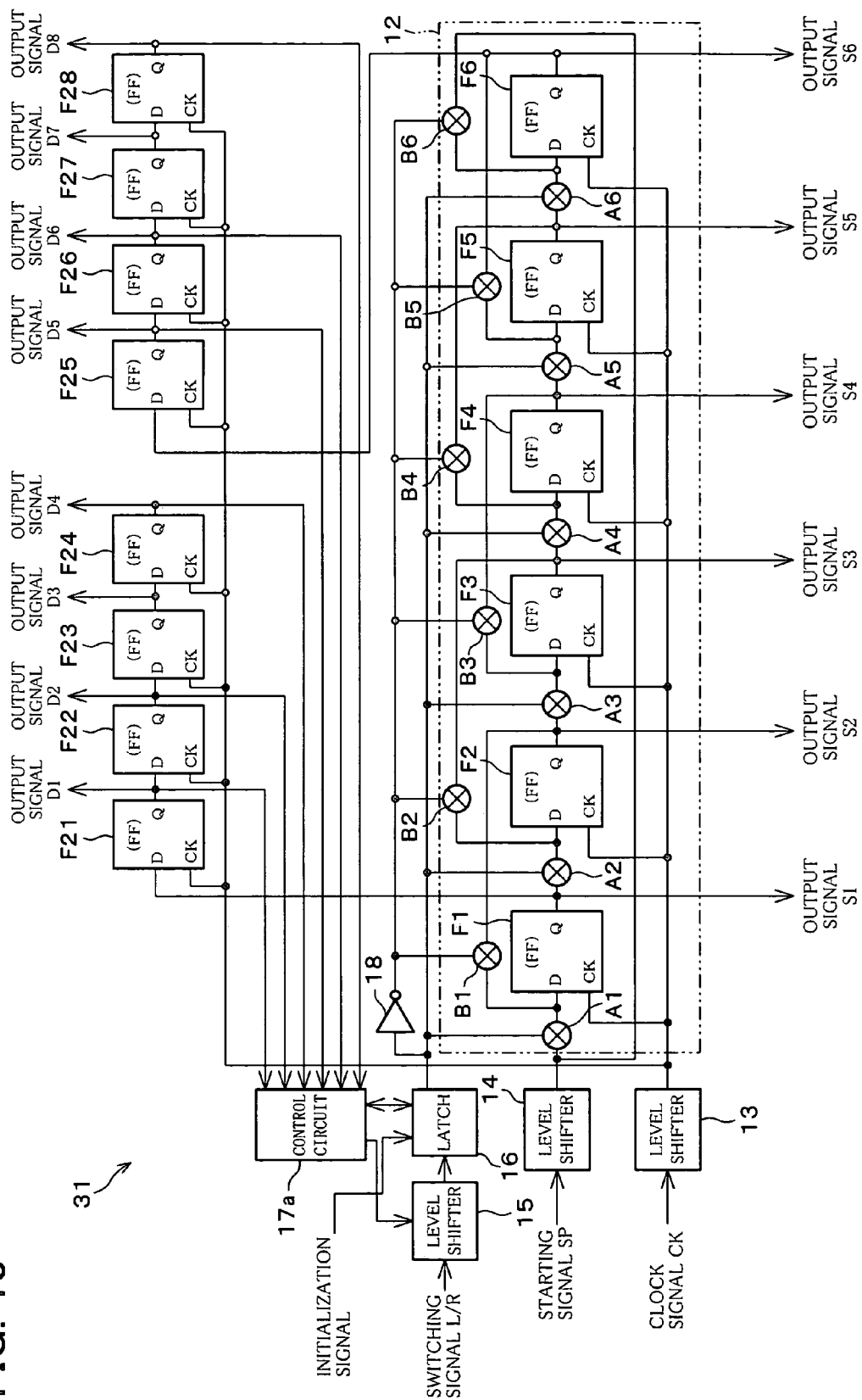
FIG. 13 is a block diagram showing an electrical arrangement of a scanning direction control circuit according to Third Embodiment of the present invention.
Figure 14:
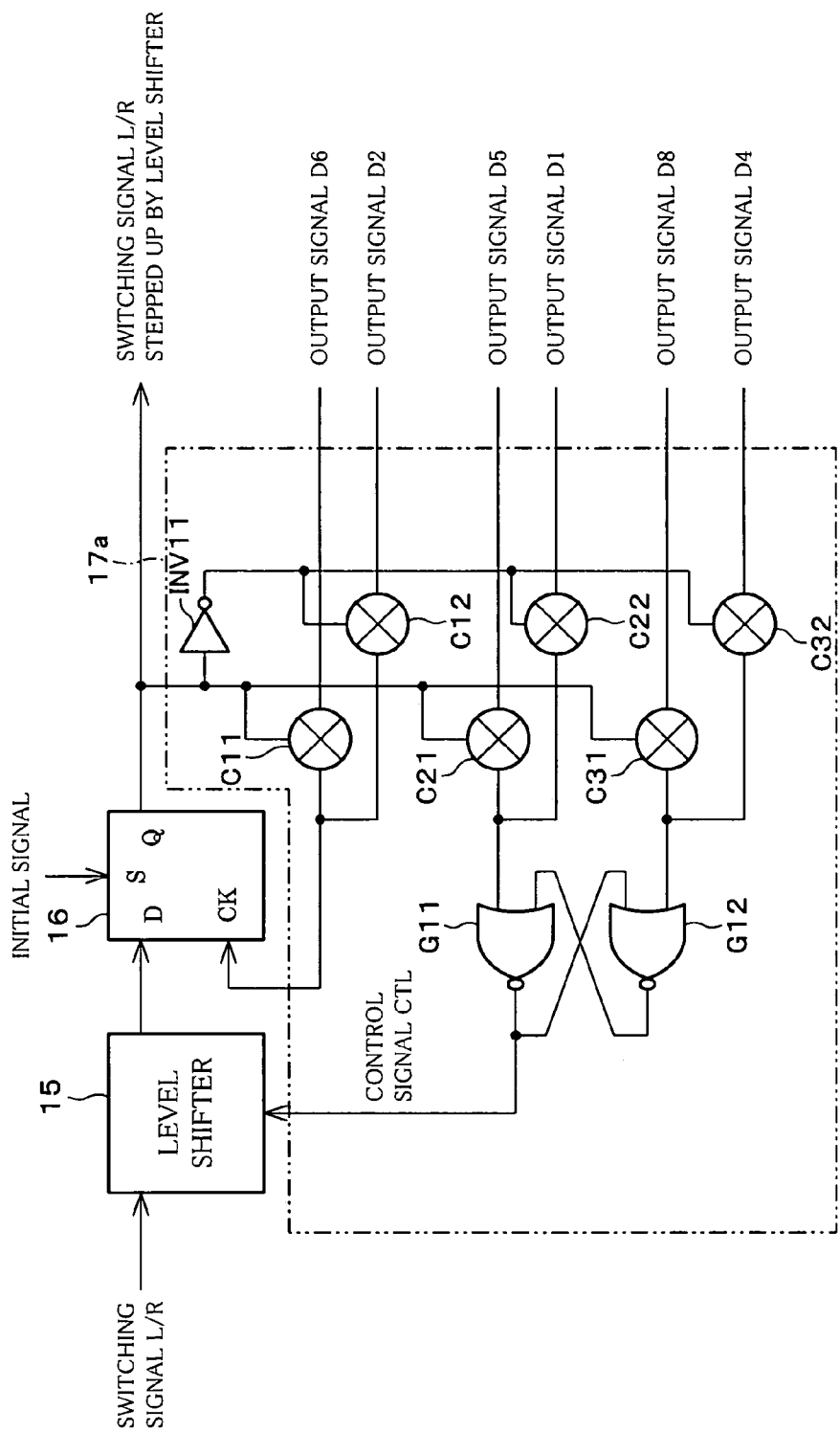
FIG. 14 is an electric circuit diagram showing a concrete arrangement of a control circuit provided in the scanning direction control circuit shown in FIG. 13.

FIG. 13 is a block diagram showing an electrical arrangement of a scanning direction control circuit 31 according to Third Embodiment of the present invention. The scanning direction control circuit 31 is similar to the scanning direction control circuit 21 shown in FIG. 8, and therefore members having the equivalent functions will be given the same reference symbols, and explanation thereof will be omitted here.

As a notable feature of the scanning direction control circuit 31, a shift register 12 is provided with respective four-stage auxiliary flip-flops F21 through F24 and F25 through 28, in contrast to the scanning direction control circuit 21 provided with the respective two-stage auxiliary flip-flops F11 and F12, and F13 and F14.

The flip-flop F21 is supplied with an output signal S1 of the flip-flop F1, and the flip-flop F25 is supplied with an output signal S6 of the flip-flop F6. Further, the analog switches C11 and C12 of the control circuit 17a are supplied with output signals D6 and D2 from the flip-flops F26 and F22, respectively, instead of the output signals S6 and S1 from the flip-flops F6 and F1. Further, the analog switches C21 and C22 of the control circuit 17a are supplied with output signals D5 and D1 from the flip-flops F25 and F21, respectively, instead of the output signals S5 and S2 from the flip-flops F5 and F2, and the analog switches C31 and C32 are supplied with output signals D8 and D4 from the flip-flops F28 and F24, respectively, instead of the output signals D4 and D2 from the flip-flops F14 and F12.

Figure 15:
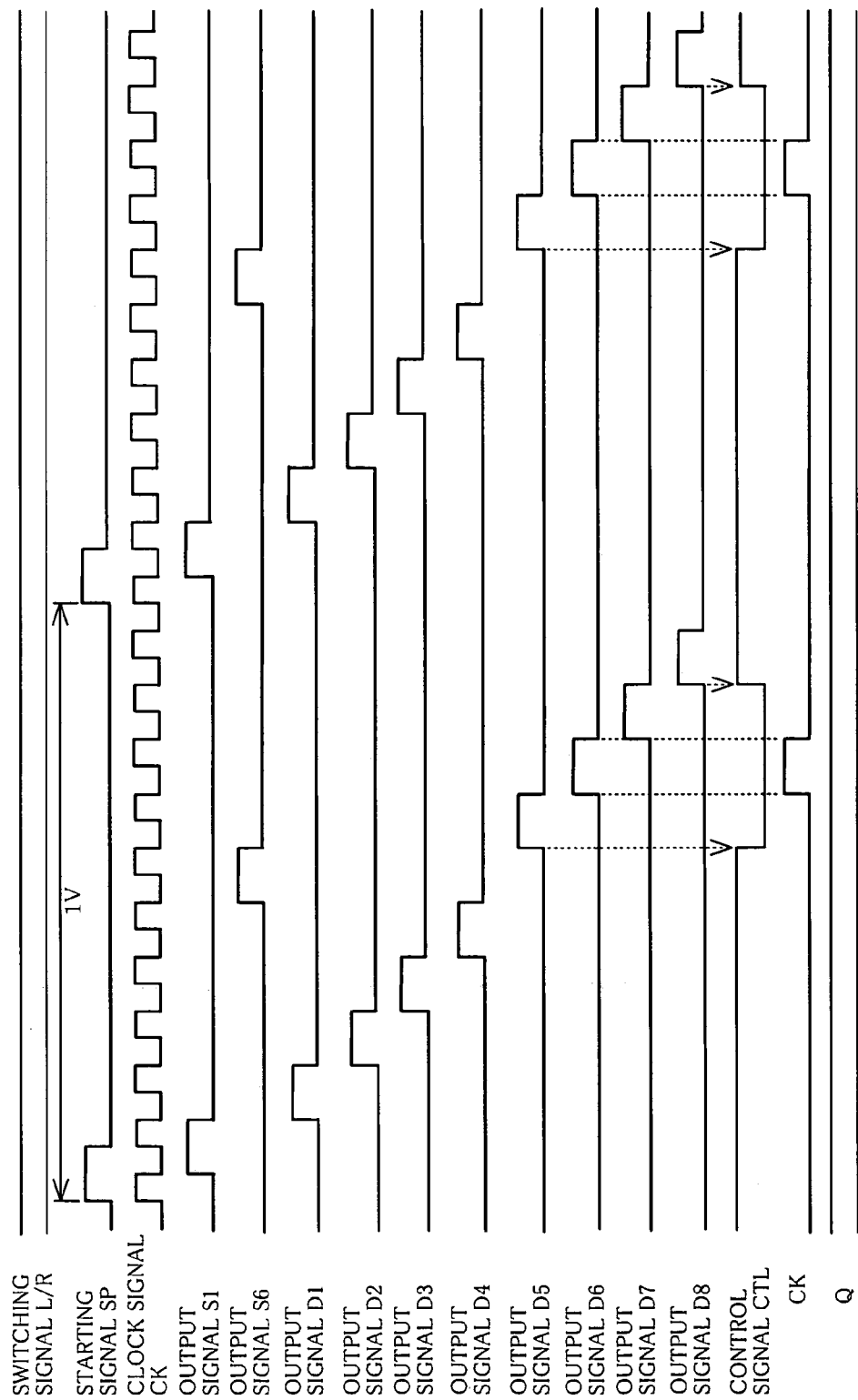
FIG. 15 is a timing chart for explaining operation of the scanning direction control circuit shown in FIG. 13.
Figure 16:
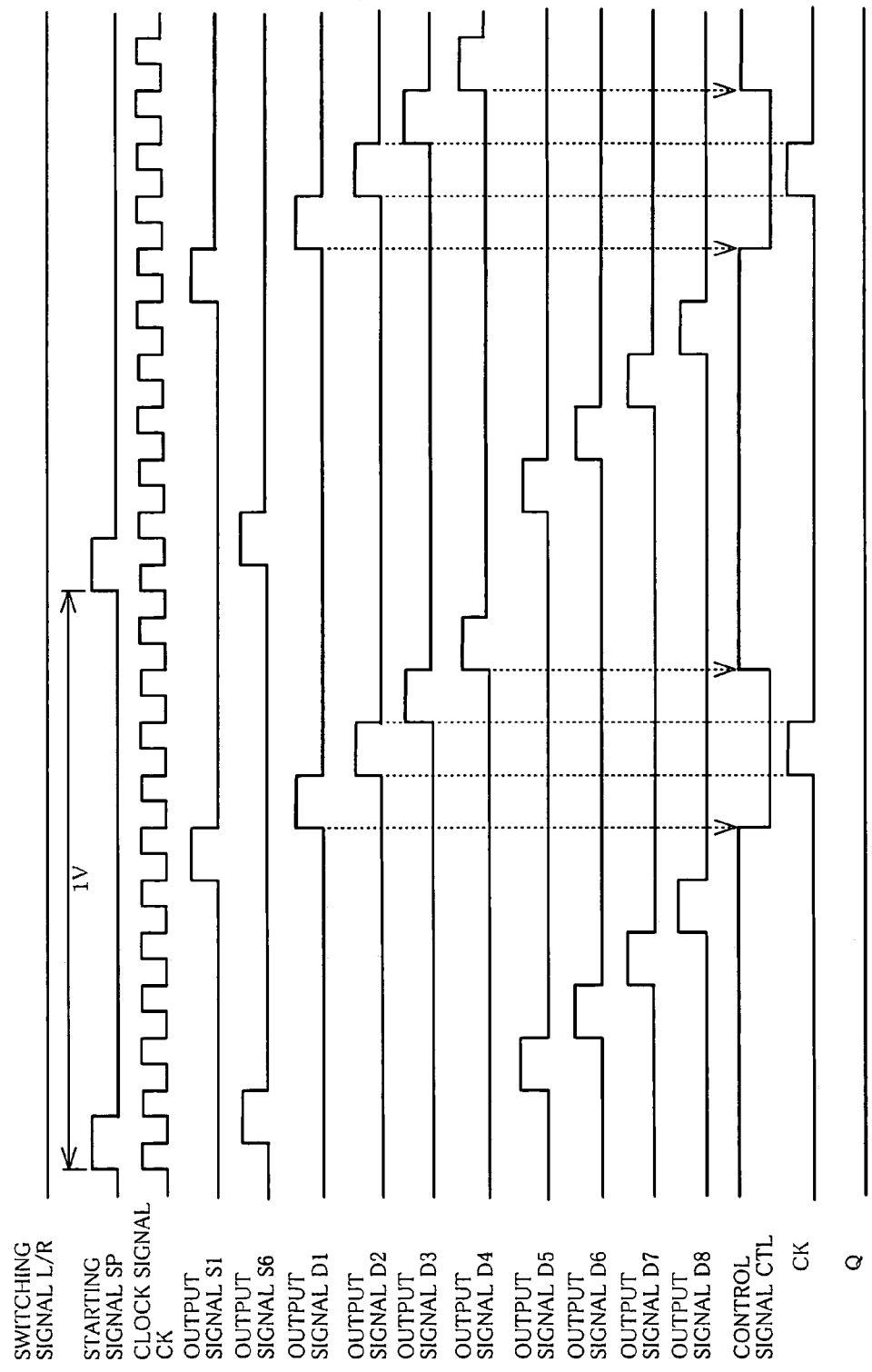
FIG. 16 is a timing chart for explaining operation of the scanning direction control circuit shown in FIG. 13.

FIGS. 15 and 16 are time charts for explaining operation of the scanning direction control circuit 31 having the foregoing arrangement. FIG. 15 shows the case where the switching signal L/R is high level, and FIG. 16 shows the case where the switching signal L/R is low level, and FIG. 12 shows the case where the switching signal L/R changes from high level to low level. However, it should be noted for these time charts that output waveforms of the output signals S2 through S5 from the flip-flops F2 through F5 are omitted.

When the switching signal L/R is high level as shown in FIG. 15, the flip-flops F21 through F24 are in parallel with the flip-flops F2 through F5 in the scanning direction control circuit 31, respectively, and output signals D1 through D4 are outputted at the same timing as the output signals S2 through S5. On the other hand, the flip-flops F25 through F28 are further provided in series so as to follow the final stage flip-flop F6, thereby respectively outputting output signals D5 through D8 in this order after the output signal S6 is outputted.

Further, when the potential of the switching signal L/R is high level, the analog switch C11 is turned on and the analog switch C12 is turned off. Thus, the output signal D6 is supplied to the clock input terminal CK of the flip-flop constituting the latch circuit 16, and the output potential of the preceding-stage level shifter 15, which is supplied to the data input terminal D, is latched at the timing of falling of the output signal D6 from high level to low level.

In this manner, since the shifting operation of the shift register 12 is completed before the data of the switching signal L/R is fetched to the flip-flop (i.e., the data is fetched in synchronism with falling edge of the output signal D6), any changes of the fetched data do not affect the shift register 12.

Further, when the potential of the switching signal L/R is high level, the analog switches C21 and C31 are turned on and the analog switches C22 and C32 are turned off. Thus, the output signal D5 is supplied to one input terminal of the NOR circuit G11, and the output signal D8 is supplied to one input terminal of the NOR circuit G12 so that the control signal CTL becomes active low level at a timing when the output signal D5 becomes high level and maintains high level while the output signals D8 and D5 are both low level. Then, at the timing when the output signal D8 becomes high level, the control signal CTL becomes inactive high level and maintains high level while the output signals D8 and D5 are both low level.

Accordingly, the level shifter 15 is controlled to be in active state (in operation) during a period from the time when the output signal D5 has become high level to the time when the output signal D8 becomes high level More specifically, the level shifter 15 is controlled to be in active state (in operation) in a predetermined period including the timing for latching the flip-flop constituting the latch circuit 16, so that the switching signal L/R is stepped up and outputted to the shift register. The level shifter 15 is controlled to be in inactive state (suspended) during a period from the time when the output signal D8 has become high level to the time when the output signal D5 becomes high level.

Similarly, when the switching signal L/R is low level as shown in FIG. 16, the flip-flops F25 through F28 are in parallel with the flip-flops F5 through F2 in the scanning direction control circuit 31, respectively, and output signals D5 through D8 are outputted at the same timing as the output signals S5 through S2. On the other hand, the flip-flops F11 through F14 are further provided in series so as to follow the final stage flip-flop F1, and output signals D1 through D4 are outputted in this order after the output signal S1 is outputted.

Therefore, when the potential of the switching signal L/R is low level, the analog switches C21 and C31 are turned off and the analog switches C22 and C32 are turned on. Thus, the output signal D1 is supplied to one input terminal of the NOR circuit G11, and the output signal D4 is supplied to one input terminal of the NOR circuit G12. Accordingly, the control signal CTL becomes active low level at the timing when the output signal D1 becomes high level, and maintains high level while the output signals D1 and D4 are both high level. Then, at the timing when the output signal D4 becomes high level, the control signal CTL becomes inactive high level and maintains high level while the output signals D1 and D4 are both low level.

Accordingly, the level shifter 15 is controlled to be in active state (in operation) during a period from the time when the output signal D4 has become high level to the time when the output signal D1 becomes high level. More specifically, the level shifter 15 is controlled to be in active state (in operation) in a predetermined period including the timing for latching the flip-flop constituting the latch circuit 16, and is controlled to be in inactive state (stopped) during a period from the time when the output signal D4 has become high level to the time when the output signal D1 becomes high level.

With such an arrangement, it is possible to set the timing for latching by the latch circuit 16 after a predetermined period of time has been elapsed since the shifting operation of the flip-flops F1 through F6 are completed (in the example shown in FIGS. 13 through 16, the latching timing has a delay of two stages after the shifting operation is completed), thus realizing stable operation.

Note that, the foregoing embodiments use the shift register 12 including six stages flip-flops F1 through F6; however, the number of stages of the flip-flops is not limited to six, i.e., may of course be changed.

Similarly, though the foregoing Embodiments use the two-stage auxiliary flip flops F11 and F12, and F13 and F14, and four-stage auxiliary flip flops F21 through F24, and F25 through F28; the number of stages for the auxiliary flip-flops may be changed.

Further, the control signal CTL for controlling active/inactive state of the level shifter 15 may be an output signal from any one of the flip-flops as long as the output signal is selected so that a signal to be supplied to the clock input signal CK of the flip-flop constituting the latch circuit 16 is included in the active period of the output signal.

Furthermore, the present invention allows different structures for each of the flip-flops, the level shifters, and the latch circuits used in the respective Embodiments.

Fourth Embodiment of the present invention will be described below with reference to FIGS. 24 through 27.

Figure 24:
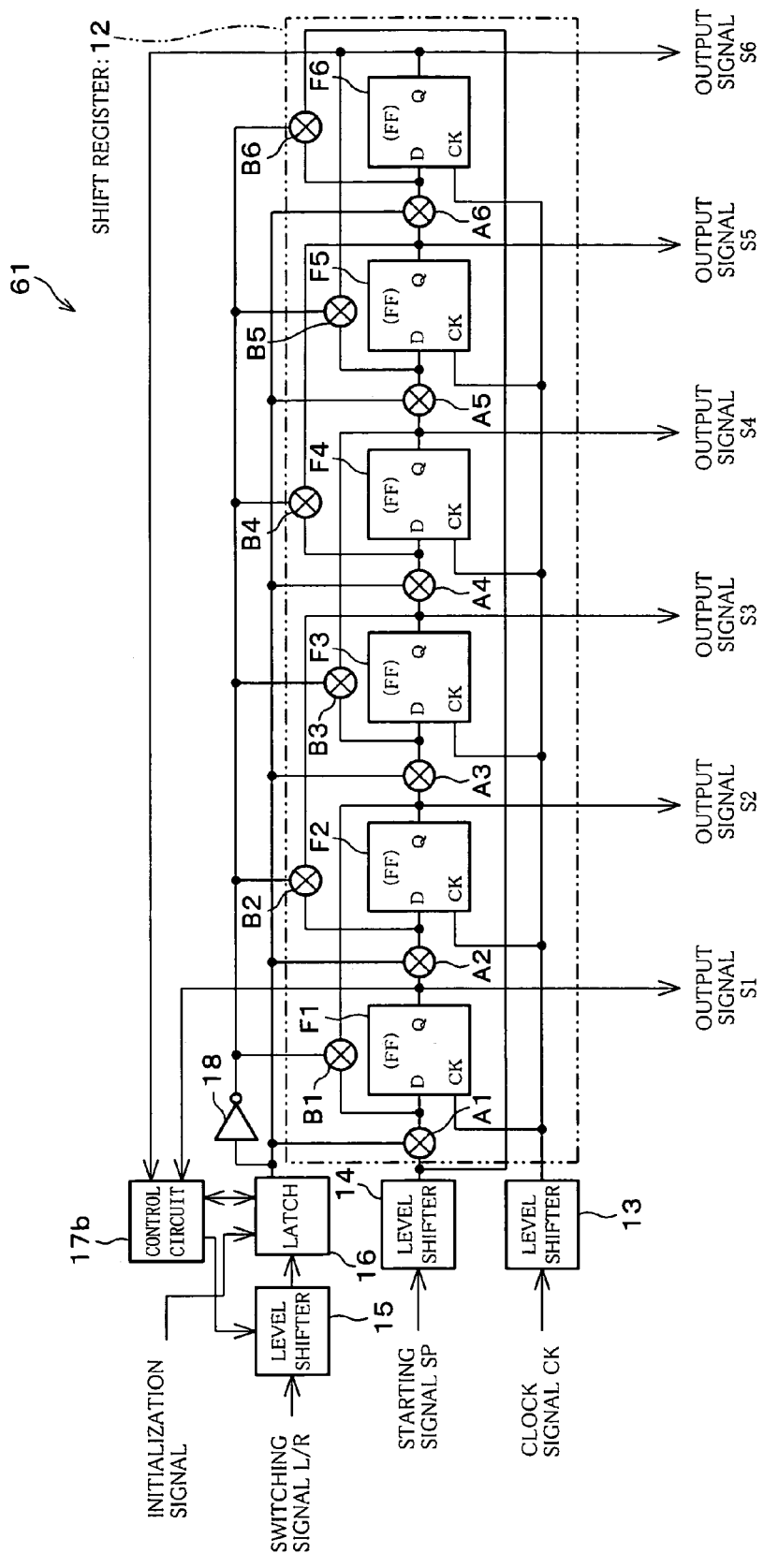
FIG. 24 is a block diagram showing an electrical arrangement of a scanning direction control circuit according to Fourth Embodiment of the present invention.

FIG. 24 is a block diagram showing a scanning direction control circuit 61 according to Fourth Embodiment of the present invention. The scanning direction control circuit 61 is similar to the scanning direction control circuit 11 shown in FIG. 1 above, and therefore members having the equivalent functions will be given the same reference symbols, and explanation thereof will be omitted here.

Figure 25:
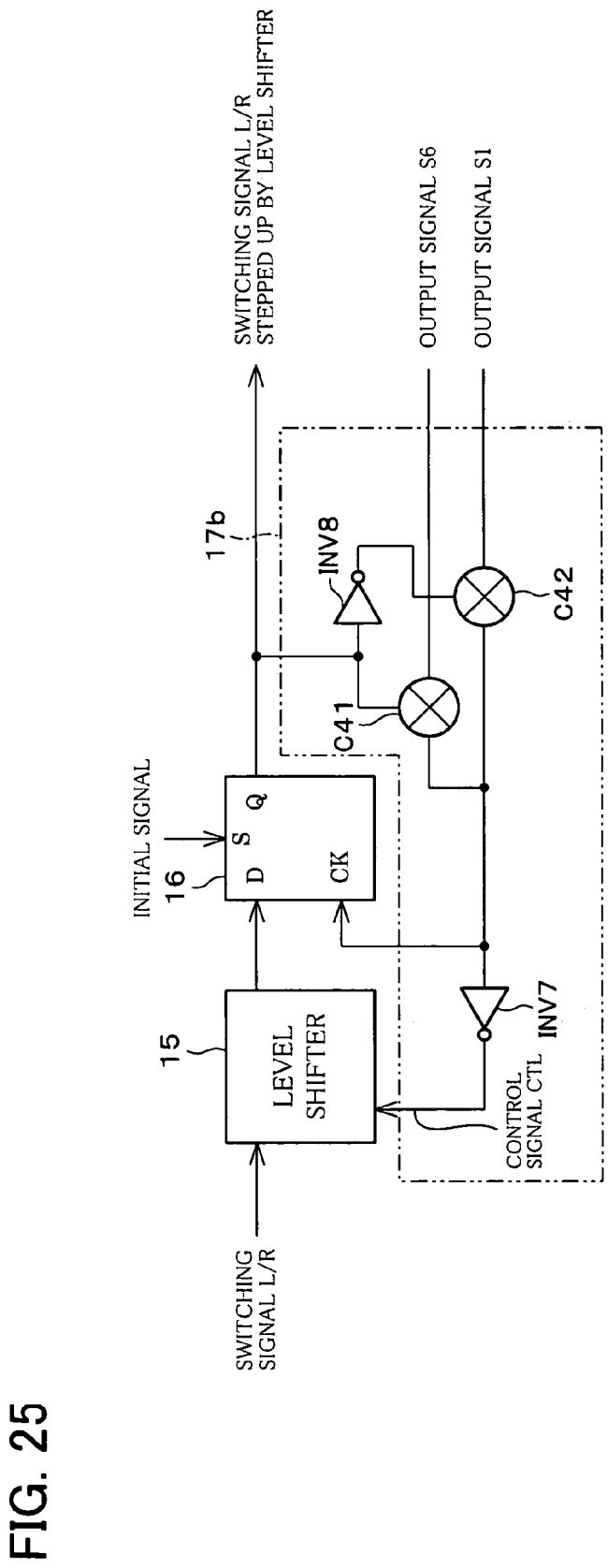
FIG. 25 is an electric circuit diagram showing a concrete arrangement of a control circuit provided in the scanning direction control circuit shown in FIG. 24.

The scanning direction control circuit 61 is notably different in a control circuit 17b, as shown in FIG. 25, from the control circuit shown in FIG. 1. Specifically, the control circuit 17b generates a control signal CTL for controlling the shift register 15 in accordance with output signal S1 or S6 outputted from the shift register 12, and also carries out latching operation of the latch circuit 16.

The scanning direction control circuit 61 shown in FIG. 24 provides the control circuit 17b with only the control signals S1 and S6 from the shift register 12. In this point, the scanning direction control circuit 61 is different from the scanning direction control circuit 11 shown in FIG. 1.

FIG. 25 is an electric circuit diagram showing a concrete arrangement of the control circuit 17b. The control circuit 17b includes analog switches C41 and C42, and inverter circuits INV7 and INV8. The switching signal L/R which has been stepped up by a level shifter is supplied without modification from the latch circuit 16 to the analog switch C41 so as to switch ON/OFF the analog switch C4. The switching signal L/R is inverted by the inverter circuit INV8 and is supplied to the analog switch C42 so as to switch ON/OFF the analog switch C42.

The analog switches C41 and C42 forms a pair. When those switches are selectively turned on in response to the switching signal L/R which has been stepped up by the level shifter, the output signal S6 or S1 is supplied to the clock input terminal CK of the flip-flop constituting the latch circuit 16, and also supplied to the inverter circuit INV7. The output signal of the inverter circuit INV7 is supplied to the level shifter 15 as a control signal CTL for controlling operation of the level shifter 15.

Figure 26:
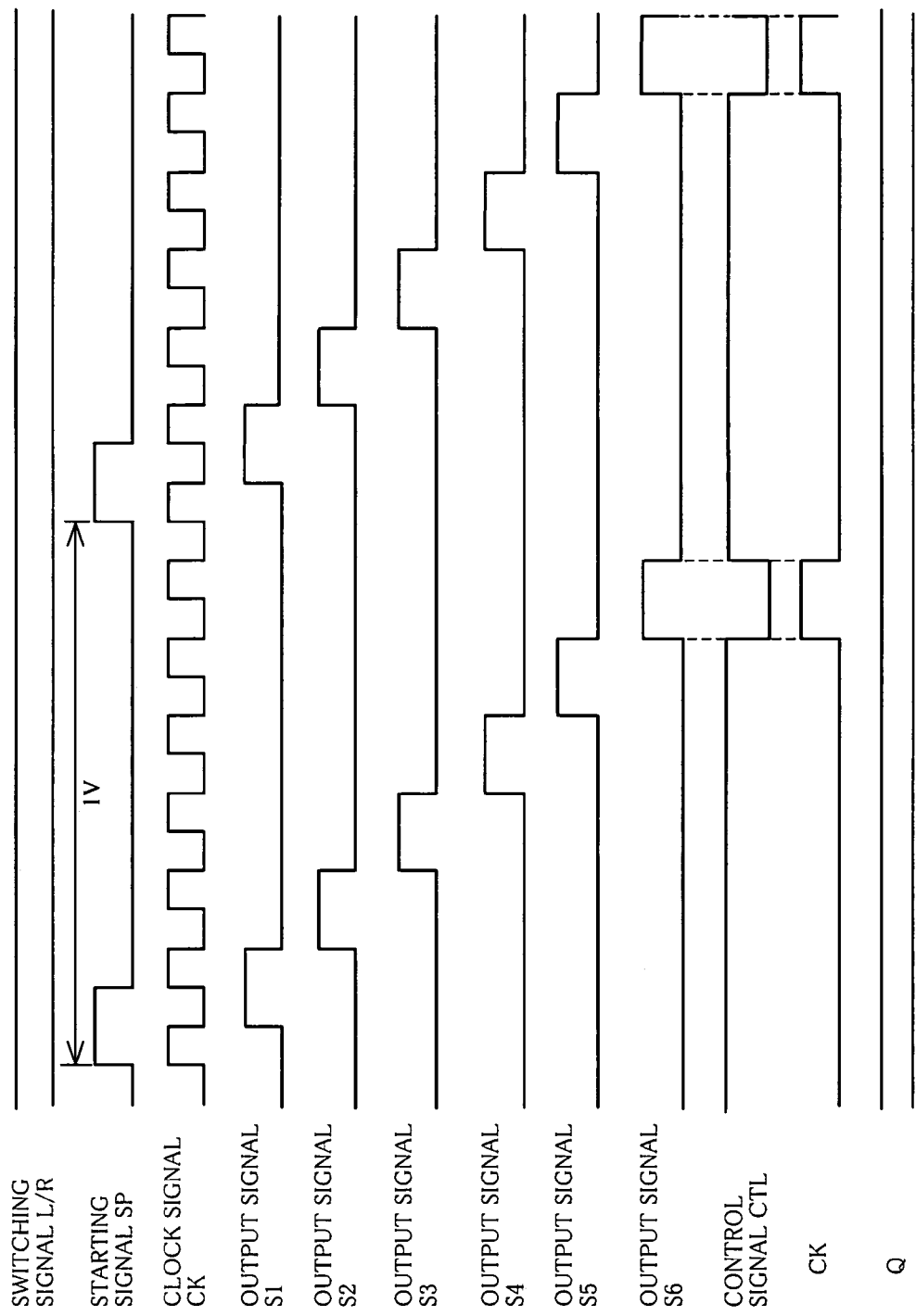
FIG. 26 is a timing chart for explaining operation of the scanning direction control circuit shown in FIG. 24.
Figure 27:
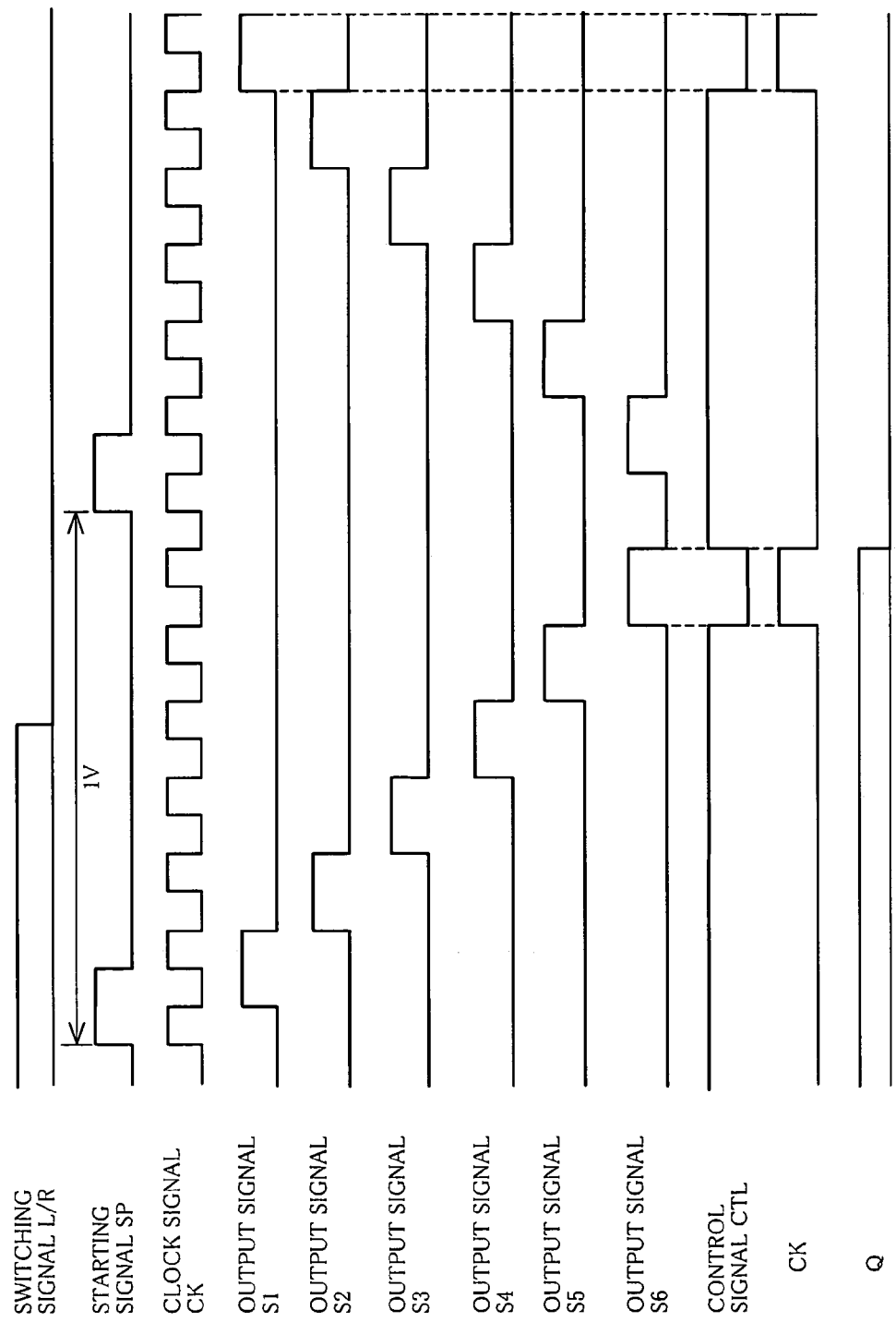
FIG. 27 is a timing chart for explaining operation of the scanning direction control circuit shown in FIG. 24.

FIGS. 26 and 27 are time charts for explaining operation of the scanning direction control circuit 61 with the foregoing arrangement. FIG. 26 shows the case where the switching signal L/R does not change (kept in high level) and FIG. 27 is the case where the switching signal L/R changes (from high level to low level).

Though it is not shown in the figures, it should be noted for these time charts that an initial signal is previously supplied to the set input terminal S of the flip-flop constituting the latch circuit 16, so that the potential of the output terminal Q of the flip-flop, i.e., the potential of the switching signal L/R supplied to the shift register 12 is high level.

When the output terminal Q of the flip-flop constituting the latch circuit 16 is high level, in the shift register 12, the analog switches A1 through A6 are turned on and the analog switches B1 through B6 are turned off. Therefore, as with the respective foregoing Embodiments, when the clock signal CK and the starting signal SP which have respectively been stepped up by the level shifters 13 and 14 are supplied, the starting signal SP is sequentially shifted through the respective flip-flops F1 through F6 at each falling edge of the clock signal CK, so that the output signals S1 through S6 are outputted, respectively, as shown in FIG. 26.

Further, when the potential of the switching signal L/R is high level, in FIG. 25, the analog switch C41 is turned on and the analog switch C42 is turned off. Therefore, the clock input terminal CK of the flip-flop constituting the latch circuit 16 and the inverter circuit INV7 are supplied with the output signal S6. The control signal CTL becomes active low level at the timing when the output signal S6 becomes high level, so that the level shifter 15 becomes active state (comes into operation). Further, the timing of falling of the output signal S6 from high level to low level is used as the latch timing of the flip-flop constituting the latch circuit 16 so as to latch the output potential of the preceding level shifter (the level shifter 15), the output potential being supplied to the data input terminal D. In this case, the control signal CTL simultaneously becomes inactive high level, so that the level shifter 15 becomes inactive state (suspended).

With such a manner, the level shifter 15 becomes active while the output signal S6 is high level, and becomes inactive while the output signal S6 is low level. Further, since, at the same time, the data of the switching, signal L/R is fetched to the flip-flop constituting the latch circuit 16 and the shifting operation of the shift register 12 is completed, any changes of the fetched data do not affect the shift register 12.

On the other hand, when the switching signal L/R changes as shown in FIG. 27, as has been described, when one scanning period 1V starts with the switching signal L/R having high level potential, in the shift register 12, the analog switches A1 through A6 are turned on, and the analog switches B1 through B6 are turned off, so that the flip-flops F1 through F6 sequentially output the output signals S1 through S6, respectively, at each falling edge of the clock signal CK.

Further, in FIG. 25, the analog switch C41 is turned on and the analog switch C42 is turned off, and the output signal S6 is supplied to the clock input terminal CK of the flip-flop constituting the latch circuit 16. The output potential of the level shifter 15 is latched at the timing of falling of the output signal S6 from high level to low level, so that the output level of the flip-flop is changed.

In this manner, since, at the same time, the data of the switching signal L/R is fetched to the flip-flop and the shifting operation of the shift register 12 is completed, any changes of the fetched data do not affect the shift register 12.

Further, the output signal S6 is also supplied to the inverter circuit INV7, and the control signal CTL becomes active low level at a timing when the output signal S6 becomes high level, and the control signal CTL becomes inactive high level at a timing when the output signal S6 becomes low level. Thus, the level shifter 15 is controlled to be in active state in a predetermined period including the timing for latching, and is controlled to be in inactive state while the output signal S6 is low level.

Note that the timing for latching is the same as the timing at which the level shifter 15 becomes inactive state.

Further, the output signal of the flip-flop constituting the latch circuit 16 is changed to low level in the next scanning period, and therefore, in the shift register, the analog switches A1 through A6 are turned off, and the analog switches B1 through B6 are turned on, and the flip-flops F6 through F1 sequentially output the output signals S6 through S1, respectively, in this order at each falling edge of the clock signal CK.

Further, the analog switch C41 is turned off and the analog switch C42 is turned on, and the output signal S1 is supplied to the clock input terminal CK of the flip-flop constituting the latch circuit 16, and the output potential of the level shifter 15 is latched at the timing of falling of the output signal S1 from high level to low level.

Further, the output signal S1 is also supplied to the inverter circuit INV7, and the control signal CTL becomes active low level at a timing when the output signal S1 becomes high level, and the control signal CTL becomes inactive high level at a timing when the output signal S1 becomes low level. Thus, the level shifter 15 is controlled to be in active state in a predetermined period including the timing for latching, and is controlled to be in inactive state while the output signal S1 is low level.

Note that the timing for latching is the same as the timing at which the level shifter 15 becomes inactive state.

As described, in the scanning direction control circuit 61 according to the present invention, control of the level shifter 15 is carried out by the control circuit 17b based on the output signal S1 or S6 from the flip-flop F1 or F6, respectively, constituting the shift register 12. Further, the timing for latching by the latch circuit 16 is the same as the timing at which the level shifter 15 becomes inactive state. On this account, since the level shifter 15 becomes active state only while the output signal S1 or S6 is high level, i.e., becomes inactive in the remaining period, the period during which a steady-state current is generated in the level shifter 15 can be further shortened and power consumption can be further reduced, accordingly, as compared to the foregoing scanning direction control circuit 11.

Further, the voltage of the switching signal L/R is held by the latch circuit 16 after being stepped up by the level shifter 15, and therefore, the switching signal L/R is fetched to the latch circuit 16 at the end of one (1) scanning period 1V (at completion of the shifting operation), even when the switching signal L/R is inputted at an arbitrary timing. Thus, it is possible to prevent overcurrent or malfunction caused by collision of shift data among the flip-flops F1 through F6, thereby realizing secure operation.

Fifth Embodiment of the present invention will be described below with reference to FIGS. 28 through 32.

Figure 28:
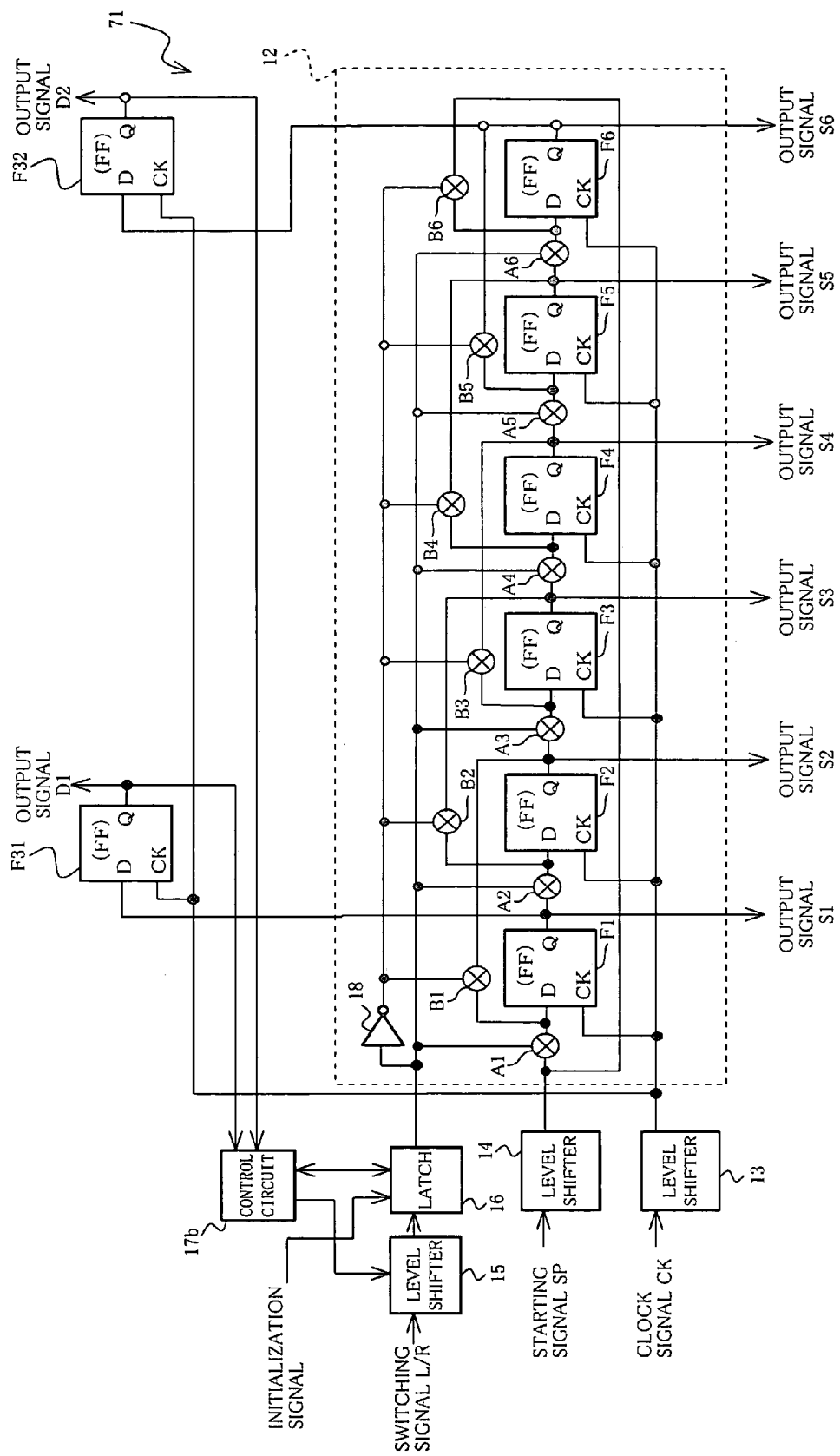
FIG. 28 is a block diagram showing an electrical arrangement of a scanning direction control circuit according to Fifth Embodiment of the present invention.

FIG. 28 is a block diagram showing an electrical arrangement of a scanning direction control circuit 71 according to Fifth Embodiment of the present invention. The scanning direction control circuit 71 is similar to the scanning direction control circuit 61 shown in FIG. 24, and therefore members having the equivalent functions will be given the same reference symbols, and explanation thereof will be omitted here.

The following is a notable feature of the scanning direction control circuit 71. Namely, the shift register 12 is further provided with flip-flops F31 and F32 (auxiliary flip-flops), and a control signal 17b uses output signals D1 and D2 of the respective flip-flops 31 and 32 so as to generate a control signal CTL for controlling the shift register 15, and so as to carry out latching operation of the latch circuit 16.

The flip-flop F31 is supplied with an output signal of the flip-flop F1 of the shift register 12, and the flip-flop F32 is supplied with an output signal-of the flip-flop F6. These flip-flops F31 and F32 are operated in synchronism with the clock signal CK which has been stepped up by a level shifter and is supplied to the flip-flops F1 through F6.

Figure 29:
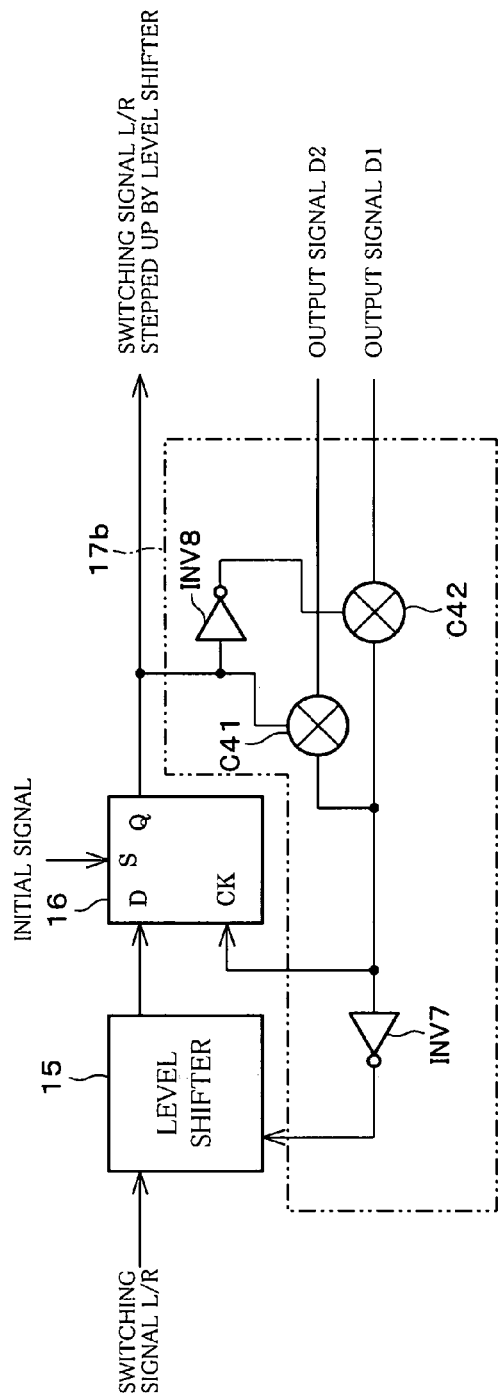
FIG. 29 is an electric circuit diagram showing a concrete arrangement of a control circuit provided in the scanning direction control circuit shown in FIG. 28.

Further, as shown in FIG. 29, the analog switches C41 and C42 of the control circuit 17b are supplied with output signals D2 and D1 from the respective flip-flops F32 and F31, instead of the output signals S6 and S1 from the respective flip-flops F6 and F1.

Figure 30:
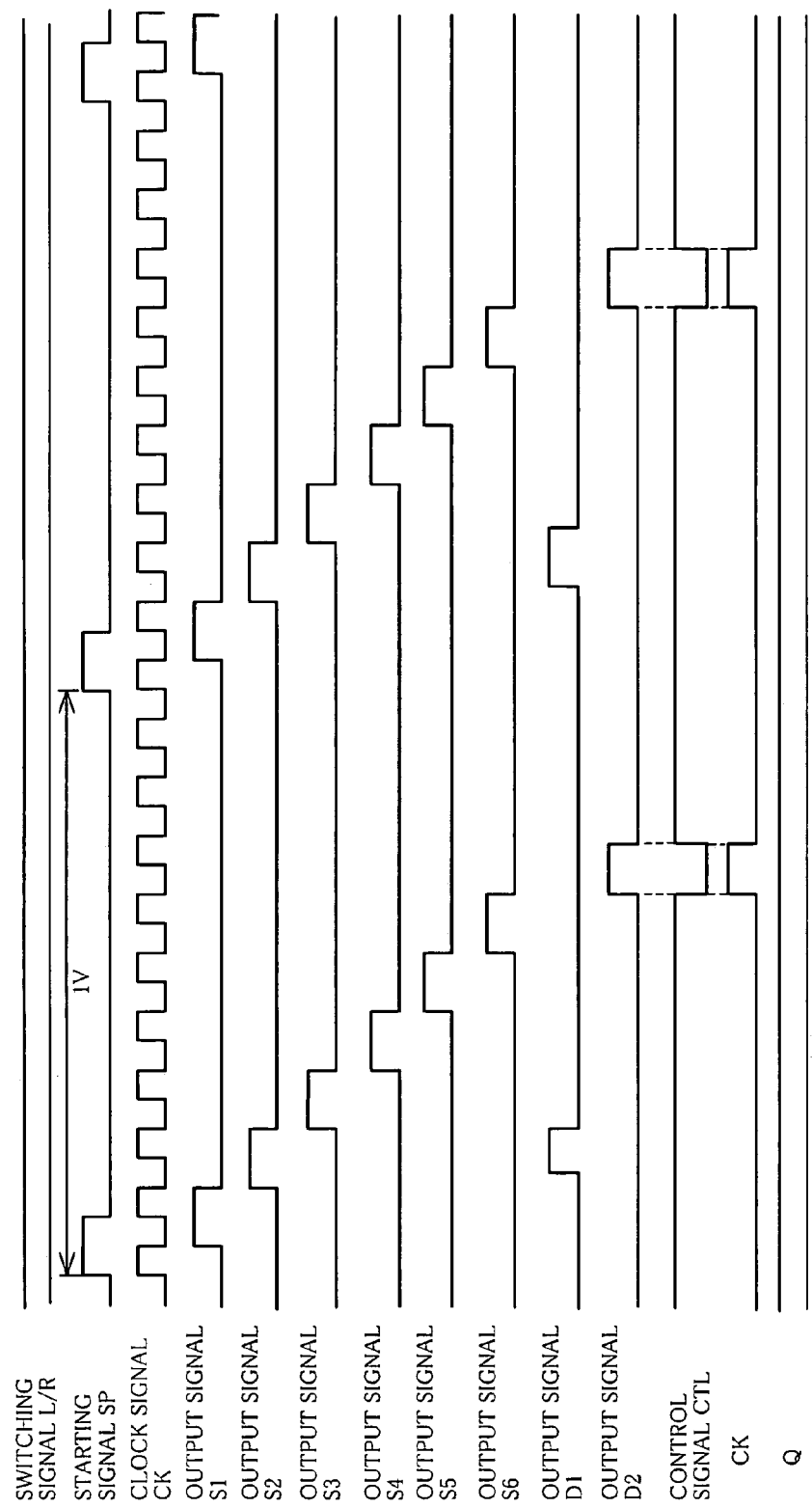
FIG. 30 is a timing chart for explaining operation of the scanning direction control circuit shown in FIG. 28.
Figure 31:
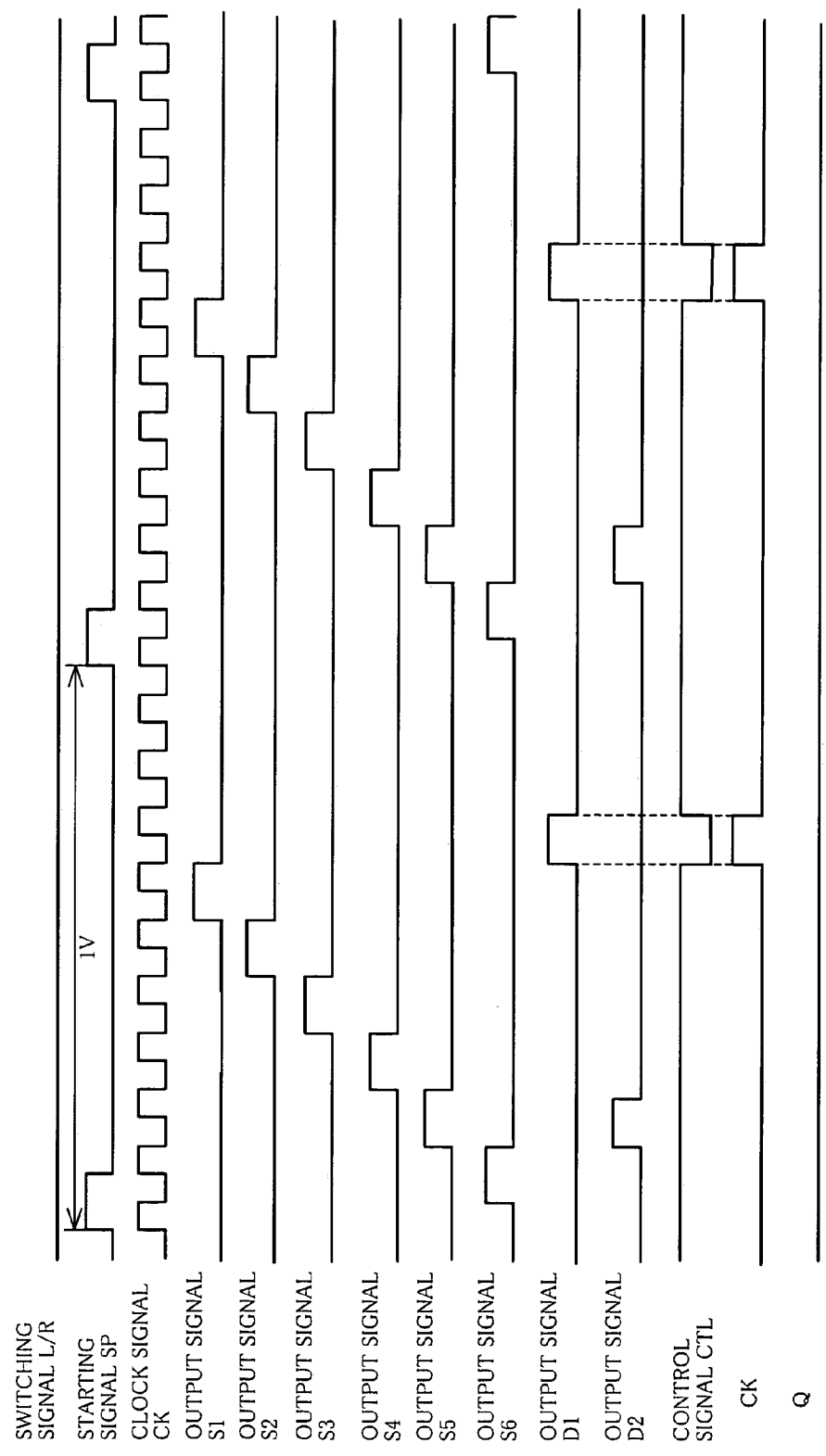
FIG. 31 is a timing chart for explaining operation of the scanning direction control circuit shown in FIG. 28.
Figure 32:
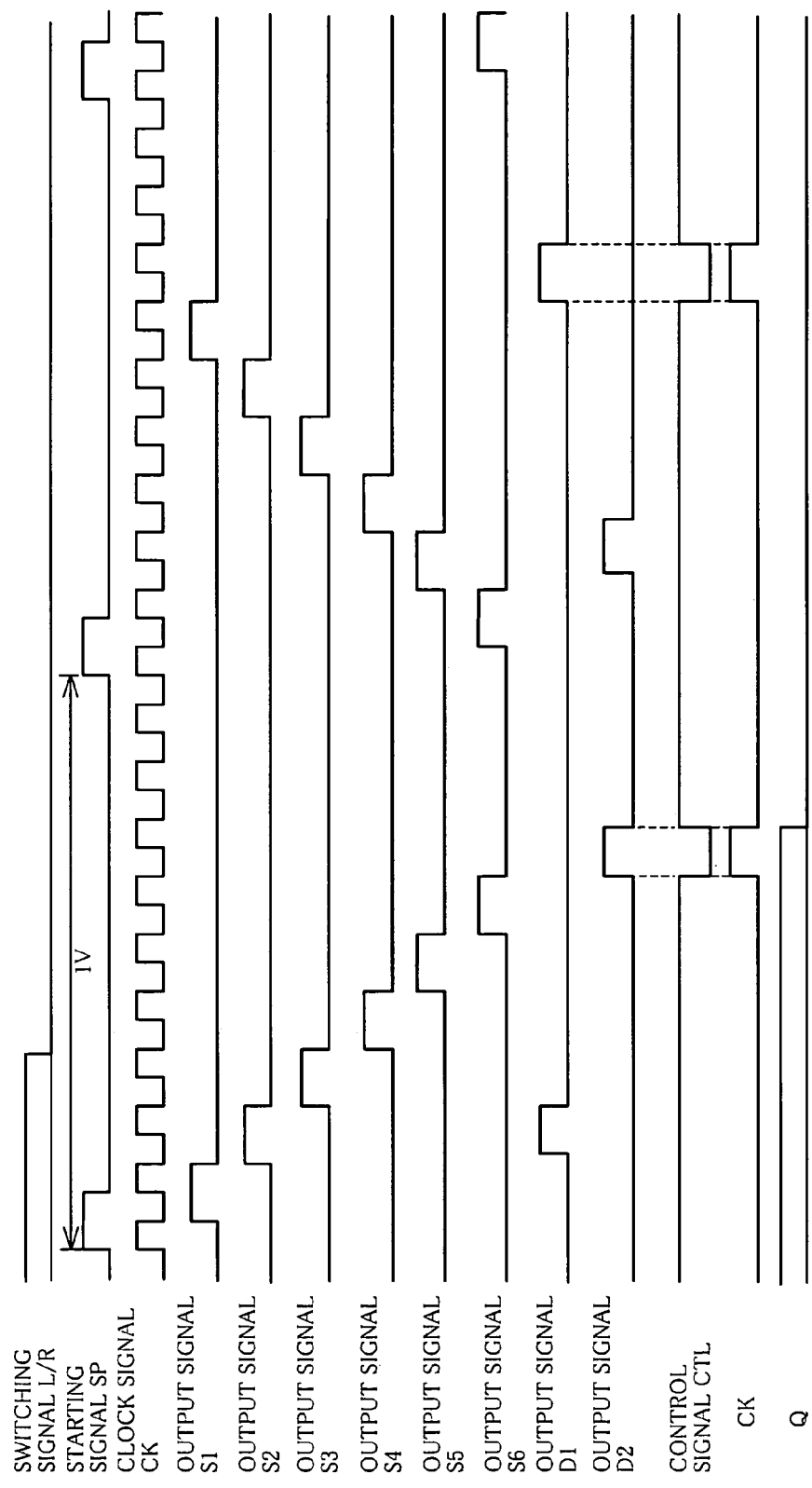
FIG. 32 is a timing chart for explaining operation of the scanning direction control circuit shown in FIG. 28.

FIGS. 30 through 32 are time charts for explaining operation of the scanning direction control circuit 71 having the foregoing arrangement. FIG. 30 shows the case where the switching signal L/R is high level, and FIG. 31 shows the case where the switching signal L/R is low level, and FIG. 32 shows the case where the switching signal L/R changes from high level to low level.

Though it is not shown in the FIGS. 30 and 32, it should be noted for these time charts that an initial signal is previously supplied to the set input terminal S of the flip-flop constituting the latch circuit 16, so that the potential of the output terminal Q of the flip-flop, i.e., the potential of the switching signal L/R supplied to the shift register 12 is high level.

When the switching signal L/R is high level as shown in FIG. 30, the flip-flop F31 is in parallel with the flip-flop F2 in the scanning direction control circuit 71, and outputs an output signal D1 at the same timing as the output signal S2. On the other hand, the flip-flop F32 is further provided in series so as to follow the final stage flip-flop F6, and outputs an output signal D2 after the output signal S6.

Further, when the potential of the switching signal L/R is high level, in FIG. 29, the analog switch C41 is turned on and the analog switch C42 is turned off. Thus, the output signal D2 is supplied to the clock input terminal CK of the flip-flop constituting the latch circuit 16 and the inverter circuit INV7. The control signal CTL becomes active low level at the timing when the output signal D2 becomes high level, so that the level shifter 15 becomes active state (comes into operation). Further, the timing of falling of the output signal D2 from high level to low level is used as the latch timing of the flip-flop constituting the latch circuit 16 so as to latch the output potential of the preceding level shifter (the level shifter 15), the output potential being supplied to the data input terminal D; and also the control signal CTL becomes inactive high level, so that the level shifter 15 becomes inactive state (stopped).

With such a manner, the level shifter 15 becomes active while the output signal D2 is high level, and becomes inactive while the output signal D2 is low level. Further, since, at the same time, the data of the switching signal L/R is fetched to the flip-flop constituting the latch circuit 16 and the shifting operation of the shift register 12 is completed, any changes of the fetched data do not affect the shift register 12.

Similarly, when the switching signal L/R is low level as shown in FIG. 31, the flip-flop F32 is in parallel with the flip-flop F5 in the scanning direction control circuit 71, and outputs an output signal D2 at-the same timing as the output signal S5. On the other hand, the flip-flop F31 is further provided in series so as to follow the final stage flip-flop F1, and outputs an output signal D1 after the output signal S1.

Further, when the potential of the switching signal L/R is high level, in FIG. 29, the analog switch C41 is turned off and the analog switch C42 is turned on. Therefore, the clock input terminal CK of the flip-flop constituting the latch circuit 16 and the inverter circuit INV7 are supplied with the output signal D1. The control signal CTL becomes active low level at the timing when the output signal D1 becomes high level, so that the level shifter 15 becomes active state (comes into operation). Further, the timing of falling of the output signal D1 from high level to low level is used as the latch timing of the flip-flop constituting the latch circuit 16 so as to latch the output potential of the preceding level shifter (the level shifter 15), the output potential being supplied to the data input terminal D; and also the control signal CTL becomes inactive high level, so that the level shifter 15 becomes inactive state (suspended).

With such a manner, the level shifter 15 becomes active while the output signal D1 is high level, and becomes inactive while the output signal D1 is low level. Further, since, at the same time, the data of the switching signal L/R is fetched to the flip-flop constituting the latch circuit 16 and the shifting operation of the shift register 12 is completed, any changes of the fetched data do not affect the shift register 12.

On the other hand, when the switching signal L/R changes as shown in FIG. 32, as has been described, when one scanning period 1V starts with the switching signal L/R having high level potential, the analog switches A1 through A6 are turned on, and the analog switches B1 through B6 are turned off, and the flip-flops F1 through F6 sequentially output the output signals S1 through S6, respectively, at each falling edge of the clock signal CK, and the output signal D2 is outputted after the output signal S6.

Further, in FIG. 29, the analog switch C41 is turned on and the analog switch C42 is turned off, and the output signal D2 is supplied to the clock input terminal CK of the flip-flop constituting the latch circuit 16, and the output potential of the level shifter 15 is latched at the timing of falling of the output signal D2 from high level to low level, so that the output level of the flip-flop is changed.

In this manner, since the shifting operation of the shift register 12 is completed before the data of the switching signal L/R is fetched to the flip-flop, any changes of the fetched data do not affect the shift register 12.

Further, the output signal D2 is also supplied to the inverter circuit INV7, and the control signal CTL becomes active low level at a timing when the output signal D2 becomes high level, and the control signal CTL becomes inactive high level at the timing when the output signal D2 becomes low level. Accordingly, the level shifter 15 is controlled to be in active state in a predetermined period including the timing for latching, and is in inactive state while the output signal D2 is low level.

Note that the timing for latching is the same as the timing at which the level shifter 15 becomes inactive state.

Further, the output of the flip-flop constituting the latch circuit 16 is changed to low level in the next scanning period, and therefore, in the shift register 12, the analog switches A1 through A6 are turned off, and the analog switches B1 through B6 are turned on. Accordingly, the flip-flops F6 through F1 sequentially output the output signals S6 through S1, respectively, in this order at each falling edge of the clock signal CK, and the output signal D1 is outputted after the output signal S1.

Further, the analog switch C41 is turned off and the analog switch C42 is turned on, and the output signal D1 is supplied to the clock input terminal CK of the flip-flop constituting the latch circuit 16. Accordingly, the output potential of the level shifter 15 is latched at the timing of falling of the output signal D1 from high level to low level.

Further, the output signal D1 is also supplied to the inverter circuit INV7, and the control signal CTL becomes active low level at a timing when the output signal D1 becomes high level, and the control signal CTL becomes inactive high level at a timing when the output signal D1 becomes low level. Thus, the level shifter 15 is controlled to be in active state in a predetermined period including the timing for latching, and is controlled to be in inactive state while the output signal D1 is low level.

Note that the timing for latching is the same as the timing at which the level shifter 15 becomes inactive state.

With such an arrangement, it is possible to set the timing for latching by the latch circuit 16 after a predetermined period of time has been elapsed since the shifting operation of the flip-flops F1 through F6 are completed (in the example shown in FIGS. 28 through 32, the latching timing has a delay of one stage after the shifting operation is completed), thus realizing stable operation.

Note that, the foregoing embodiments use the shift register 12 including six stages flip-flops F1 through F6; however, the number of stages of the flip-flops is not limited to six, i.e., may of course be changed.

Similarly, though the foregoing Embodiments use the auxiliary flip-flops F31 and F32, the number of stages for the auxiliary flip-flops may be changed. Further, the control signal CTL may be an output signal from any one of the flip-flops as long as the output signal is selected from the final or succeeding stage flip-flop.

Furthermore, the present invention allows different structures for each of the flip-flops, the level shifters, and the latch circuits used in the respective Embodiments.

Sixth Embodiment of the present invention will be described below with reference to FIGS. 17 and 18.

Figure 17:
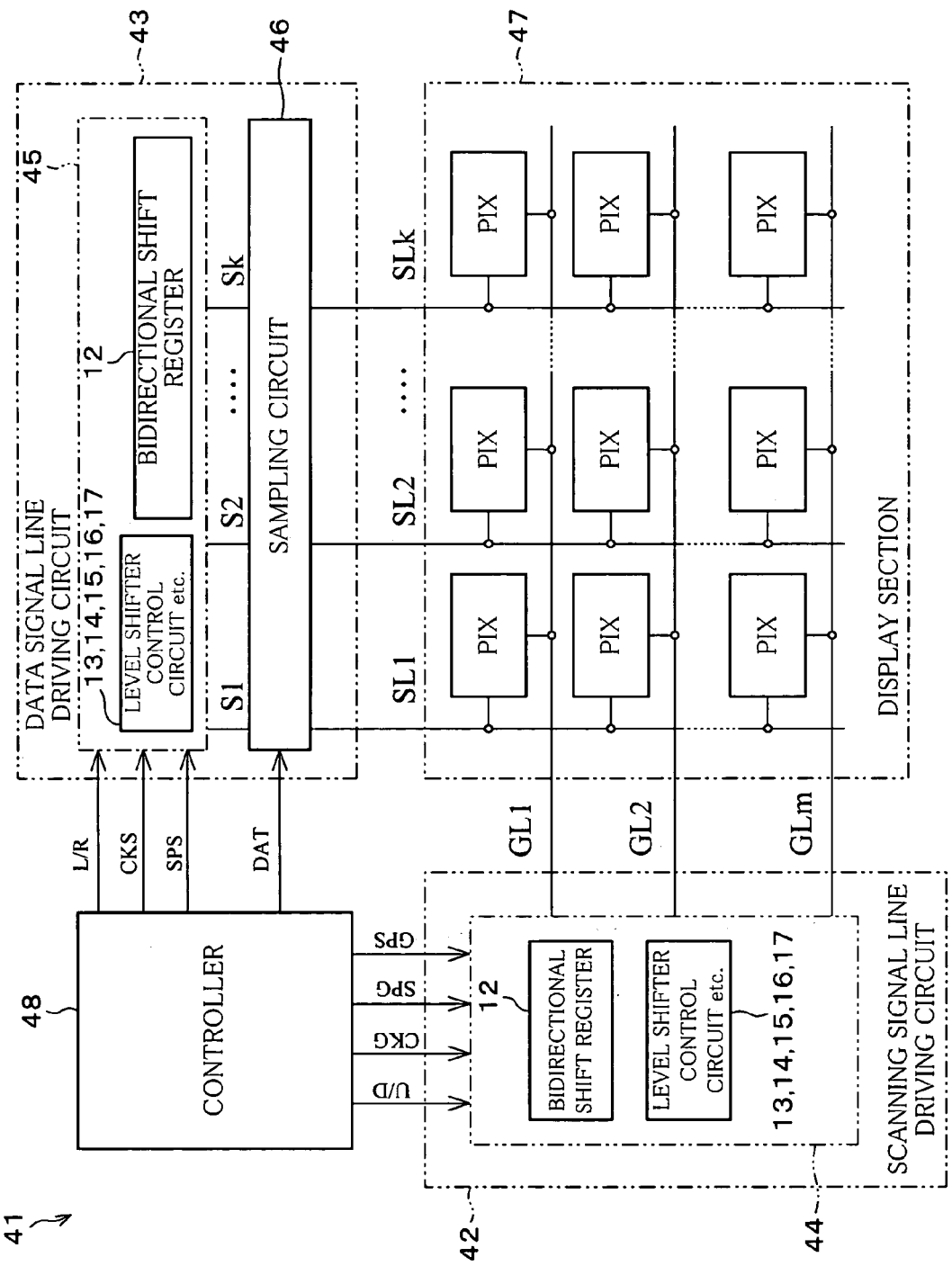
FIG. 17 is a block diagram showing an electrical arrangement of a liquid crystal display device according to Sixth Embodiment of the present invention.

FIG. 17 is a block diagram showing an electrical arrangement of a liquid crystal display device 41 according to Sixth Embodiment of the present invention. A noticeable feature of the liquid crystal display device 41 is a scanning signal line driving circuit 42 and a data signal line driving circuit 43 which are made of one of the described scanning direction control circuits 11, 21, 31, 61, and 71.

The scanning signal line driving circuit 42 is made of a scanning direction control circuit 44 which is realized by one of the described scanning direction control circuits 11, 21, 31, 61, and 71; and the data signal line driving circuit 43 is made of (a) a scanning direction control circuit 45 which is realized by one of the described scanning direction control circuits 11, 21, 31, 61, and 71, and (b) a sampling circuit 46.

The liquid crystal display device 41 is made up of a display section 47 including pixels PIX aligned in a matrix manner, the scanning signal line driving circuit 42 and the data signal line driving circuit 43, the circuits 42 and 43 driving the respective pixels PIX. The liquid crystal display device 41 carries out image display based on an image signal DAT indicative of display condition of each pixel, when a controller 48 generates the image signal DAT.

The scanning signal line driving circuit 42 and the data signal line driving circuit 43 are monolithically formed on a single substrate on which the display section 47 is formed. With this arrangement, there is no need to lead out of the substrate wirings for connecting the scanning signal line driving circuits 42 and 43 with the pixels PIX. This allows the liquid crystal display device 41 to have a larger number of scanning signal lines GL1 through GLm and/or data signal lines SL1 through SLk, without extra work for leading out the added signal lines, thus reducing work for fabrication.

Further, the foregoing structure does not require terminals for external connection of those signal lines GL1 through GLm and SL1 through SLk, and therefore, it is possible to prevent an increase of capacitance of those signal lines GL1 through GLm and SL1 through SLk, and a decrease of degree of integration.

Further, the display section 47 and the driving circuits 42 and 43 are made of polycrystalline silicon thin film transistors formed on a glass substrate. Therefore, the respective circuits can be formed on an insulative substrate of glass etc., thus easily enlarging the display area. Further, the scanning signal line driving circuit 42 and the data signal line driving circuit 43 may be formed during a process of forming circuits for the respective pixel areas, thus simplifying the fabrication and reducing the capacitance of signal lines.

The display section 47 and the driving circuits 42 and 43 each further include a switching element processed at a temperature of equal to or lower than 600° C. Therefore, the glass substrate may be made of a general glass substrate with a heat distortion point of equal to or lower than 600° C. without causing bending or warping which occurs in a process at a temperature greater than the heat distortion point. Consequently, there is realized a display device with a larger display area through easier mounting.

The display section 47 includes k data signal lines SL1 through SLk, and m scanning signal lines GL1 through GLm which intersect the data signal lines SL1 through SLk, respectively. Assuming that i denotes an arbitrary integer equal to or less than k, and j denotes an arbitrary integer equal to or less than m, each combination of an arbitrary data signal line SLi and an arbitrary scanning signal line GLj corresponds to a pixel PIX (i, j), and each pixel PIX (i, j) is positioned so as to be surrounded by two adjacent data signal lines SLi and SLli+1, and two adjacent scanning signal lines GLj and GLj+1.

Figure 18:
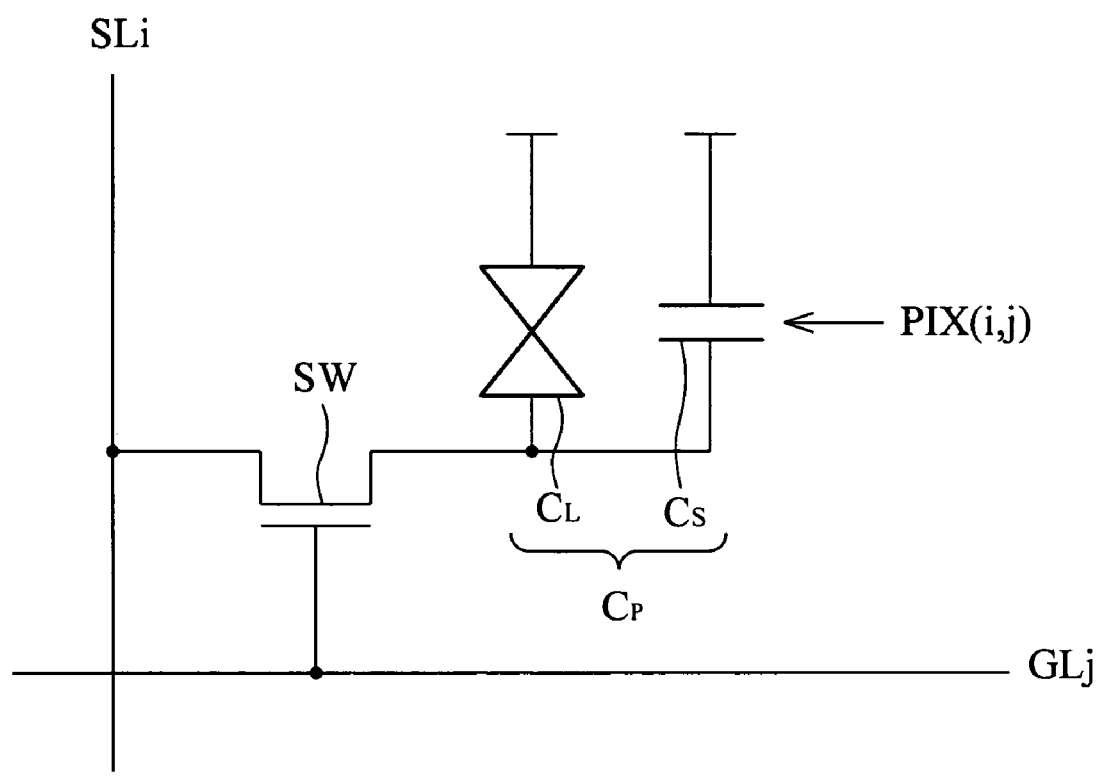
FIG. 18 is an electric circuit diagram for explaining arrangement of a pixel of the liquid crystal display device shown in FIG. 17.

Meanwhile, as shown in FIG. 18, the pixel PIX (i, j) includes a field effect transistor (switching device) SW and a pixel capacitor Cp with a terminal connected to the drain electrode of the field effect transistor SW. The field effect transistor SW includes a gate terminal connected to the scanning signal line GLj, and a source terminal connected to the data signal line SLi. Further, the other terminal of the pixel capacitor Cp is connected to a common electrode line that is common to all pixels. The pixel capacitor Cp is made up of a liquid crystal capacitor CL and an auxiliary capacitor Cs which is optionally provided.

When the scanning signal line GLj is selected in the pixel PIX (i, j), the field effect transistor SW is conducted and a voltage to be applied to the data signal line SLi is supplied to the pixel capacitor Cp. While the selection period for the scanning signal line GLj is finished and the field effect transistor SW is blocked, the capacitor Cp holds the voltage at the blocking. Here, transmittance or reflectance of the liquid crystal changes depending on the voltage to be applied to the liquid crystal capacitor CL. Therefore, by selecting the scanning signal line GLj and applying a voltage corresponding to the image data to be supplied to the data signal line SLi, it is possible to change the display condition of the pixel PIX (i, j) in accordance with the image data.

In the liquid crystal display device 41 having the foregoing arrangement, the scanning signal line driving circuit 42 selects the scanning signal line GL, and image data for the pixel PIX corresponding to the combination of the selected scanning line GL and the data signal line SL is supplied to each data signal line SL by the data signal line driving circuit 43. As a result, the respective pieces of image data are sequentially written in the pixel PIX which is connected to the scanning signal line GL. Such a scanning operation is carried out by sequentially selecting the respective scanning lines GL, so that corresponding piece of image data is written in all pixels in the display section 47.

Here, the image data for the pixel PIX is transmitted as the image signal DAT in a time divisional manner from the controller 48 to the data signal line driving circuit 43. The data signal line driving circuit 43 extracts the image data from the image signal DAT at a timing specified based on (a) a clock signal CKS which becomes a timing signal and (b) a start signal SPS having a predetermined period.

More specifically, the data signal line driving circuit 43 includes a scanning direction control circuit 45 and a sampling circuit 46. The scanning direction control circuit 45 includes the bidirectional shift register 12 for sequentially shifting the starting signal SPS in a direction specified by the switching signal L/R in synchronism with the clock signal CKS so as to generate output signals S1 through Sk that respectively have a phase difference corresponding to 1 clock between adjacent two signals. The sampling circuit 46 samples the image signal DAT at each timing specified by the output signals S1 through Sk so as to extract image data output to the data signal lines SL1 through SLk.

Here, the output signal S1 has the earliest output timing when the switching signal L/R denotes shifting operation toward the right (a direction from SL1 to SLk), whereas the output signal S6 has the earliest output timing when the switching signal L/R denotes shifting operation toward the left. Accordingly, by switching the switching signal L/R, it is possible to change the order for extracting image data to be supplied to the data signal lines SL1 through SLk from the image signal DAT, so as to display a horizontally reversed image in the display section 47.

Similarly, the scanning signal line driving circuit 42 includes a scanning direction control circuit 44 having the bidirectional shift register 12 for sequentially shifting the starting signal SPG in a direction specified by the switching signal U/D in synchronism with the clock signal CKG, so as to output to the scanning signal lines GL1 through GLm scanning signals which have a phase difference corresponding to 1 clock between adjacent two signals.

Therefore, the output signal to the scanning line GL1 has the earliest output timing when the switching signal U/D denotes shifting operation downward (a direction from GL1 to GLm), whereas the output signal to be supplied to the scanning line GLm has the earliest output timing when the switching signal U/D denotes shifting operation upward.

Accordingly, by switching the switching signal U/D, it is possible to change the order for selecting the scanning signal lines GL1 through GLm, so as to display a vertically reversed image in a display section 53.

Here, in the liquid crystal display device 41 according to the present invention, the display section 47, and the driving circuits 42 and 43 are made of polycrystalline silicon thin film transistors, and the driving voltage Vcc for these circuits is set to 15V, for example. On the other hand, the controller 48 is made of monocrystal silicon transistors formed on a different substrate on which the display section 47, and the driving circuits 42 and 43 are not formed, and the driving voltage is set to be lower than the driving voltage Vcc, for example, equal to or lower than 5V.

Note that, though the liquid crystal display device 41 includes two substrates, one for the display section 47 and the driving circuits 42 and 43, and the other for the controller 48, the number of signals (an image signal DAT, starting signals SPS, SPG, clock signals CKS, CKG, switching signals L/R, U/D etc.) transmitted between the two substrates are much less than those transmitted between the display section 47 and the driving circuits 42 and 43.

Further, the controller 48 made of monocrystal silicon transistors ensures sufficient driving capability. Thus, increase of manufacturing work, wiring capacitance or power consumption can be suppressed within an insignificant range, even when the controller 48 is formed on such a different substrate.

With such an arrangement, the liquid crystal display device reflects the switching signal L/R or U/D to internal circuits at a predetermined timing regardless of the timing at which the switching signal L/R or U/D outputted from the controller 48 changes. More specifically, the reflection of the switching signal L/R to the internal circuits is carried out for each horizontal period, and the reflection of the switching signal U/D to the internal circuits is carried out for each vertical period, thus preventing degradation of display quality.

Further, by setting to the inactive state the level shifter 15 which performs level shifting of the switching signals L/R and U/D, it is possible to reduce power consumption of the liquid crystal display device 41.

Though the foregoing Embodiment uses one of the scanning direction control circuits 11, 21, 31, 61 and 71 for both of the scanning signal line driving circuit 42 and the data signal line driving circuit 43, the present invention also allows the arrangement in which either of the scanning signal line driving circuit 42 and the data signal line driving circuit 43 is made of the scanning direction control circuit.

Seventh Embodiment of the present invention will be described below with reference to FIGS. 19 and 20.

Figure 19:
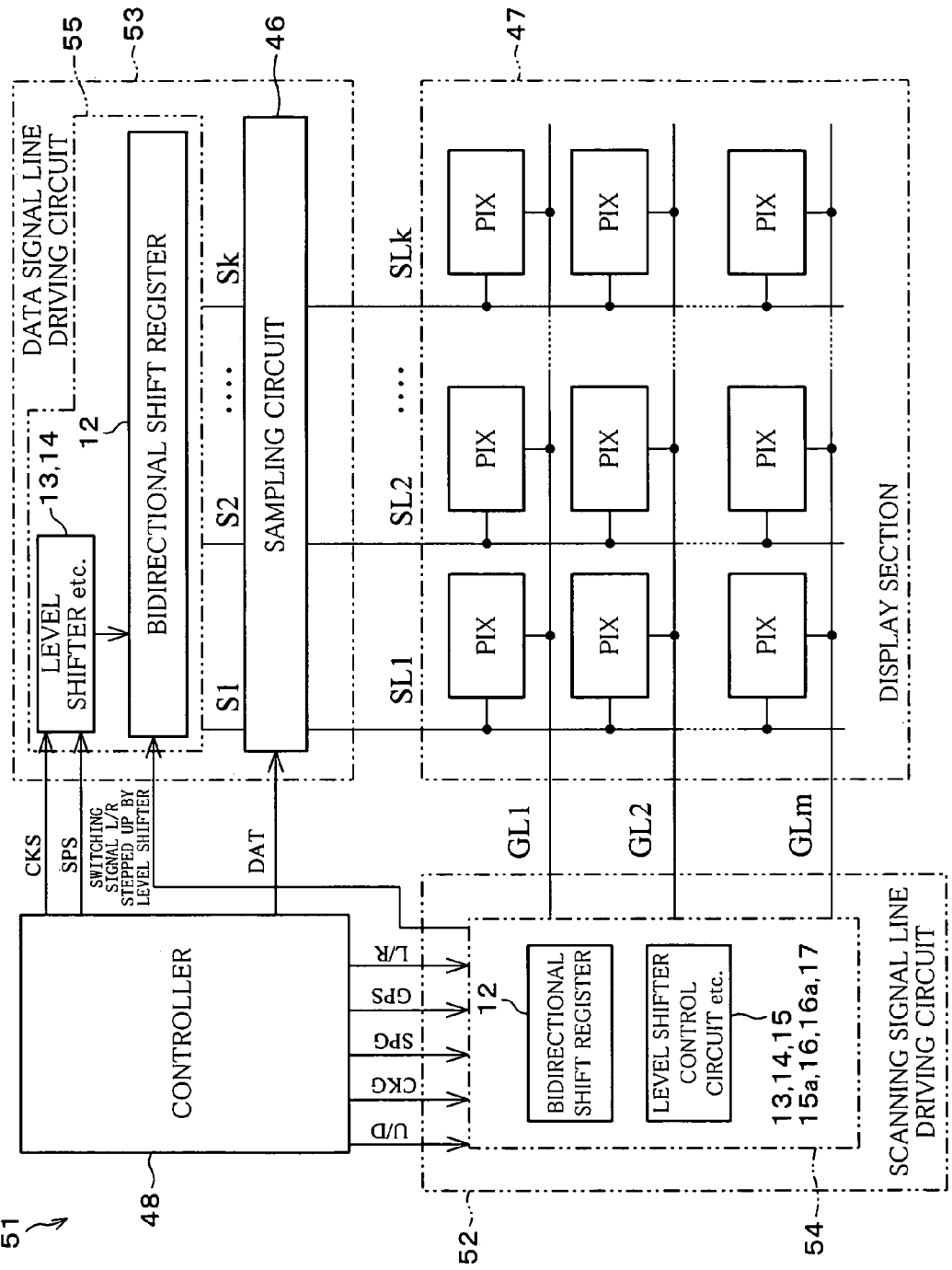
FIG. 19 is a block diagram showing an electrical arrangement of a liquid crystal display device according to Seventh Embodiment of the present invention.

FIG. 19 is a block diagram showing an electrical arrangement of a liquid crystal display device 51 according to Seventh Embodiment of the present invention. The liquid crystal display device 51 is similar to the liquid crystal display device 41 above, and therefore members having the equivalent functions will be given the same reference symbols, and explanation thereof will be omitted here.

The following is a notable feature of the liquid crystal display device 51. More specifically, (a) one of the foregoing scanning direction control circuits 11, 21 and 31 is provided as a scanning direction control circuit 54 in a scanning signal line driving circuit 52, and (b) a control circuit 17 provided in the scanning direction control circuit 54 is shared between the driving circuits 52 and 53.

Figure 20:
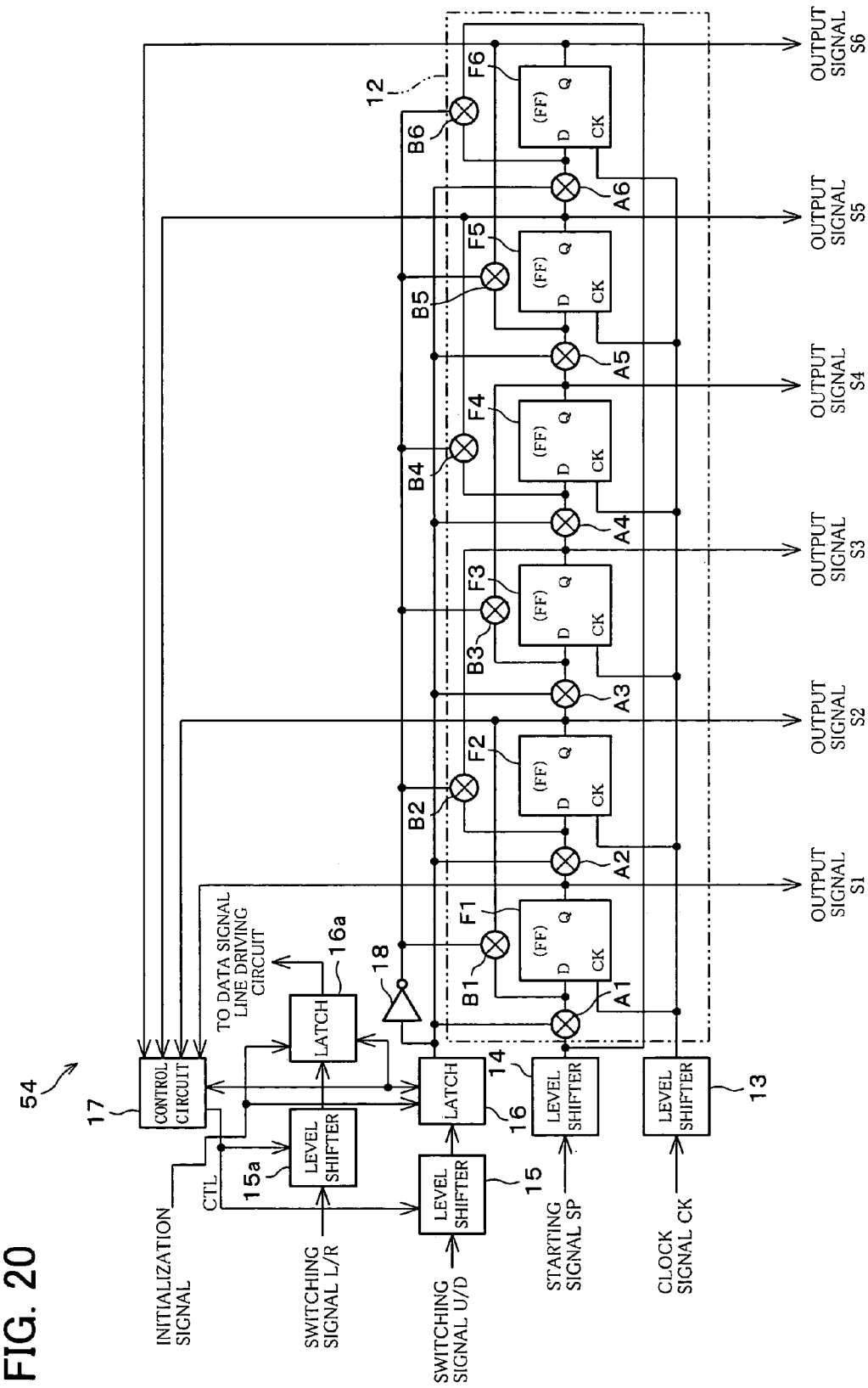
FIG. 20 is a block diagram showing an electrical arrangement of a scanning direction control circuit provided in the liquid crystal display device shown in FIG. 19.
Figure 21:
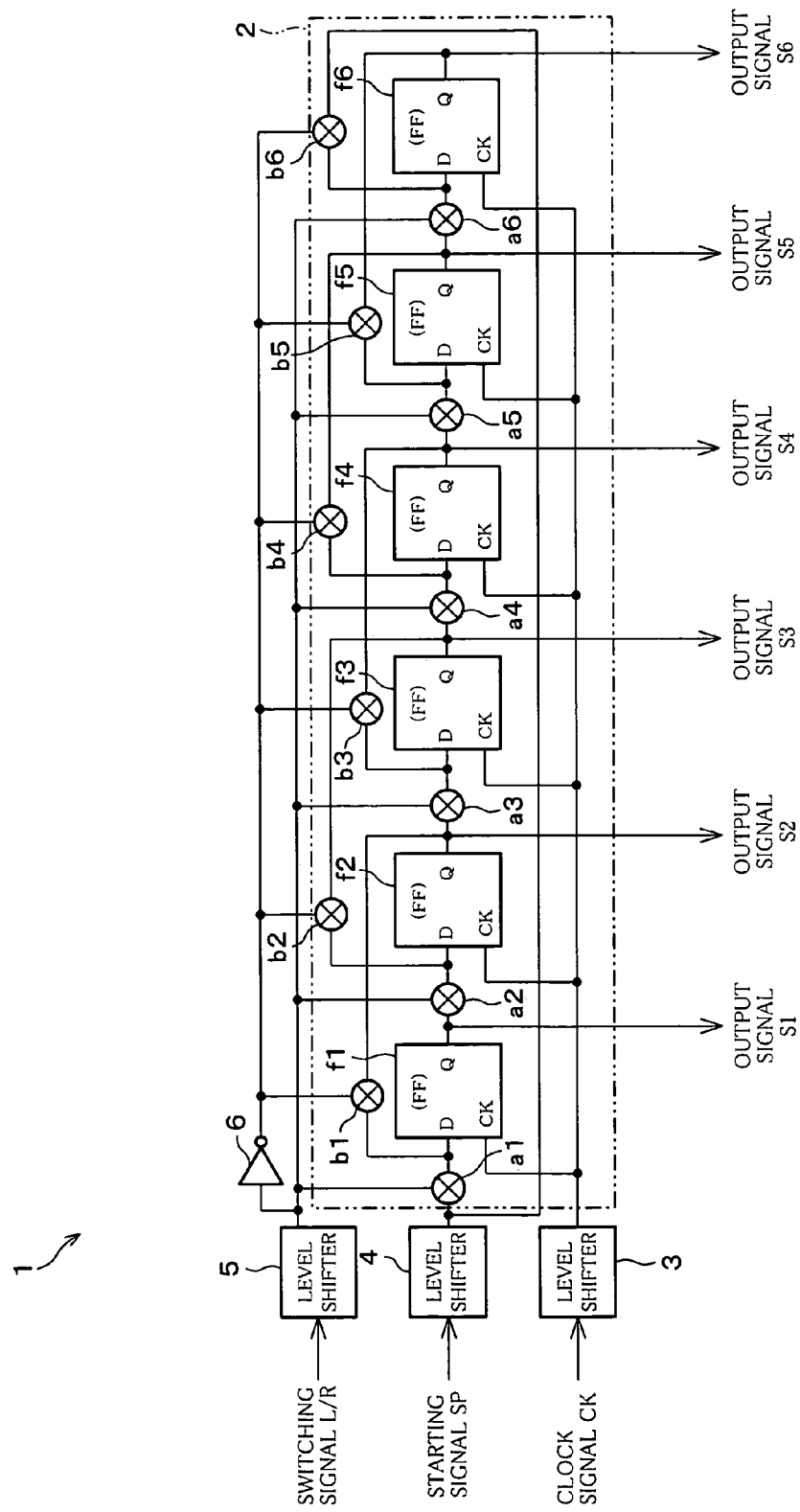
FIG. 21 is a block diagram showing an electrical arrangement of a typical conventional scanning direction control circuit.
Figure 22:
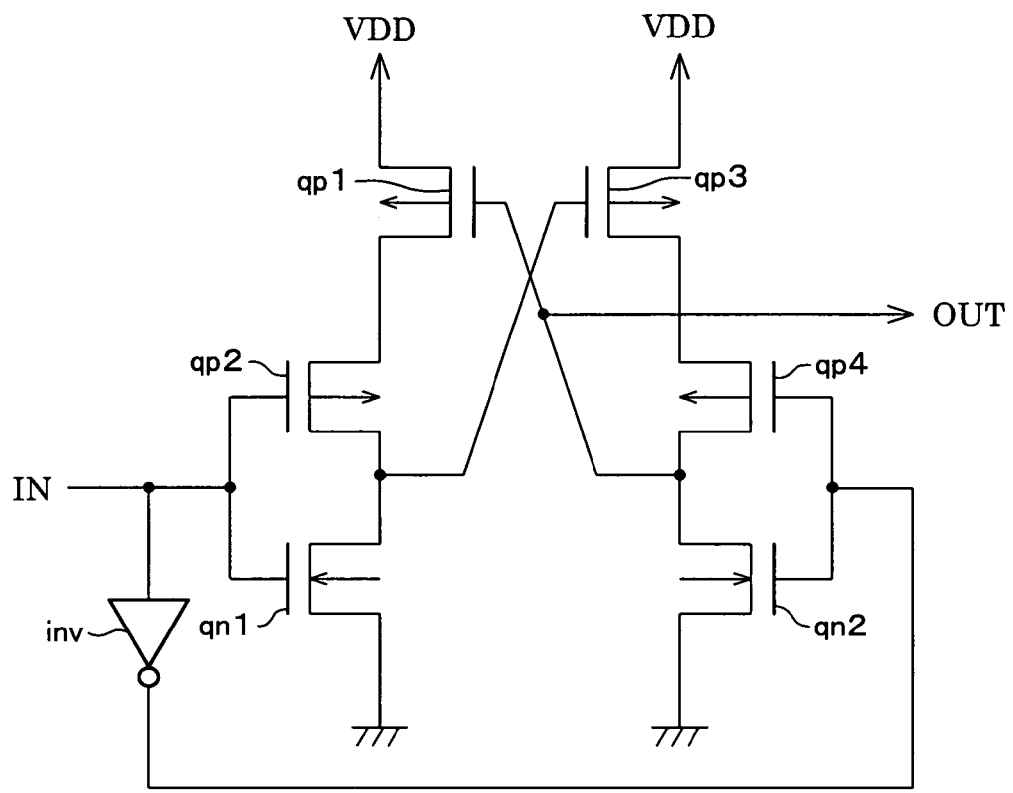
FIG. 22 is an electric circuit diagram showing a concrete arrangement example of a general level shifter.

Therefore, as shown in FIG. 20, the scanning direction control circuit 54 provided in the scanning signal line driving circuit 52 includes a level shifter 15 for stepping up the switching signal U/D, a latch circuit 16 for latching an output signal from the level shifter 15, and a level shifter 15a for stepping up the switching signal L/R, and a latch circuit 16a for latching the switching signal L/R that has been stepped up.

These level shifters 15, 15a and the latch circuits 16, 16a are both supplied with the clock signal CK and the control signal CTL from the control circuit 17 in response to the output signals S6, S1; S5, S2, respectively. The switching signal L/R that has been stepped up is supplied to circuit elements such as analog switches A1 through A6 of the shift register 12 in the scanning direction control circuit 55 of the data signal line driving circuit 53.

Therefore, for each end of the vertical scanning periods, the latch circuit 16a, as well as the latch circuit 16, performs latching operation In response thereto, the level shifter 15a, as well as the level shifter 15, becomes active state in a predetermined period around the latching timing. With this arrangement, the switching of shifting direction can be carried out only for each timing at which a screen display is finished, thus further improving the display quality.

Eighth Embodiment of the present invention will be described below with reference to FIGS. 33 and 34.

Figure 33:
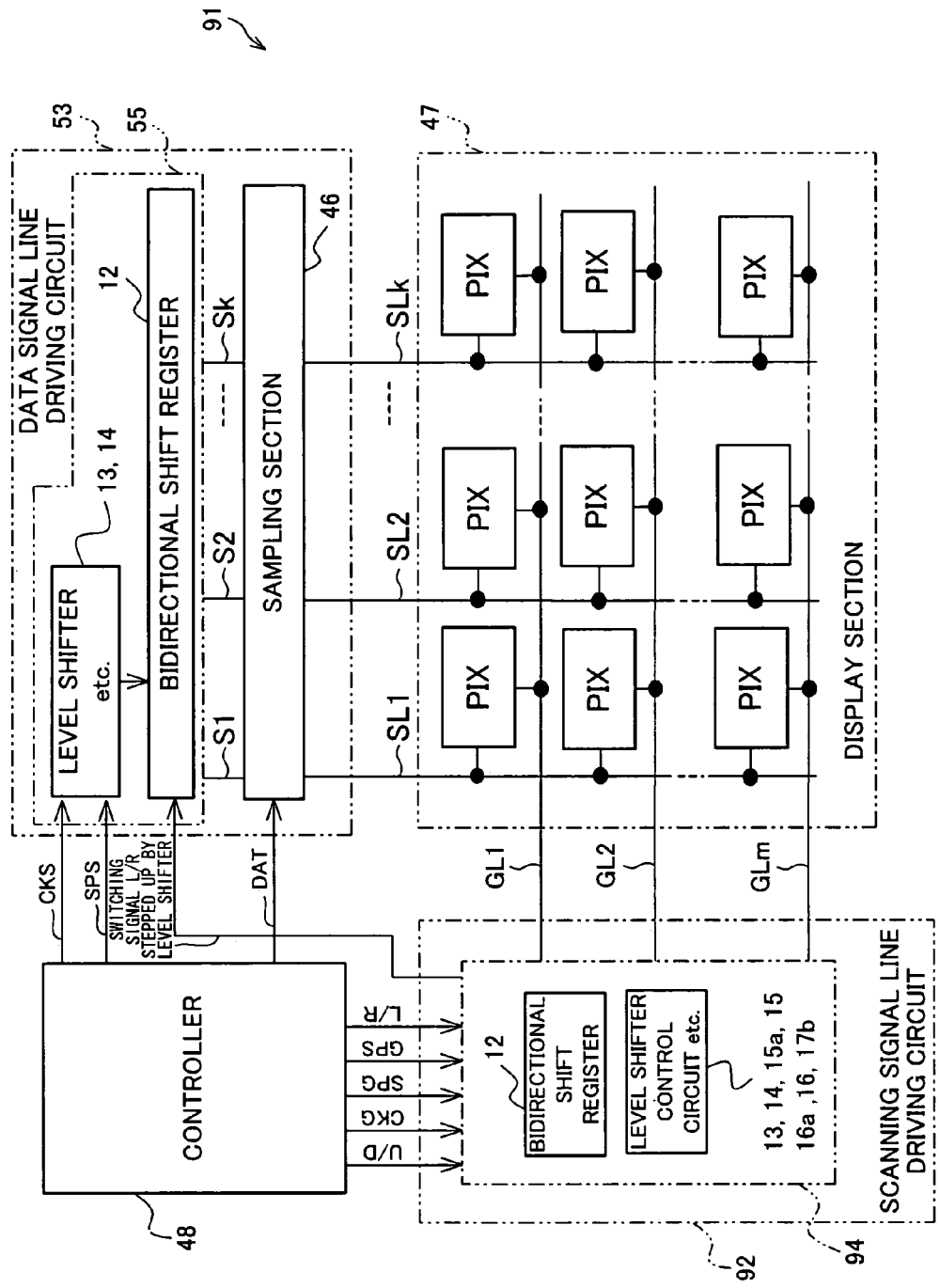
FIG. 33 is a block diagram showing an electrical arrangement of a liquid crystal display device according to Eighth Embodiment of the present invention.

FIG. 33 is a block diagram showing an electrical arrangement of a liquid crystal display device 91 according to Eighth Embodiment of the present invention. The liquid crystal display device 91 is similar to the liquid crystal display device 51 above, and therefore members having the equivalent functions will be given the same reference symbols, and explanation thereof will be omitted here.

The following is a notable feature of the liquid crystal display device 91. More specifically, (a) one of the foregoing scanning direction control circuits 61 and 71 is provided as a scanning direction control circuit 94 in a scanning signal line driving circuit 92, and (b) a control circuit 17*b* provided in the scanning direction control circuit 94 is shared between the driving circuits 92 and 53.

Figure 34:
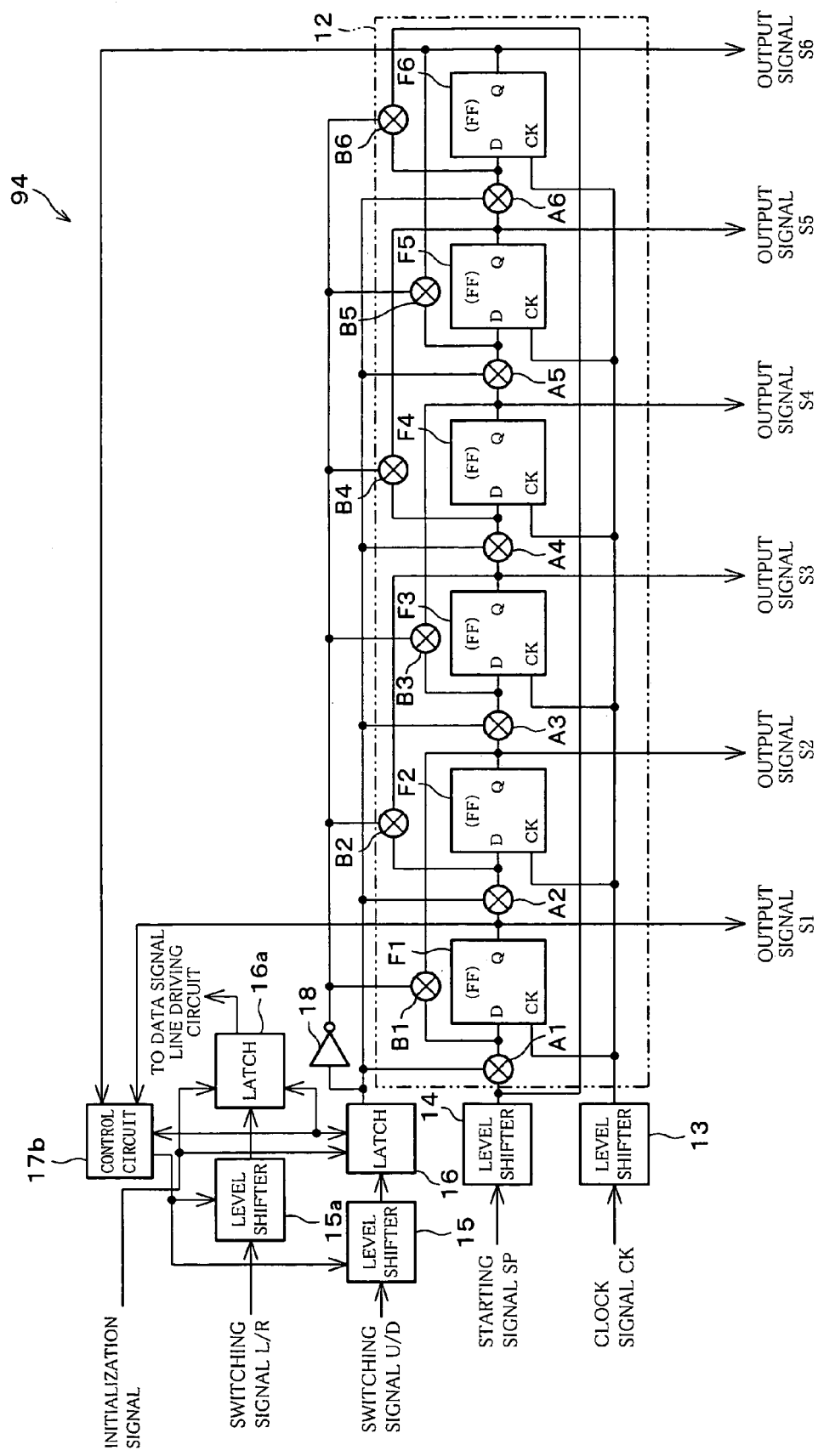
FIG. 34 is a block diagram showing an electrical arrangement of a scanning direction control circuit provided in the liquid crystal display device shown in FIG. 33.

Therefore, as shown in FIG. 34, the scanning direction control circuit 94 provided in the scanning signal line driving circuit 92 includes a level shifter 15 for stepping up the switching signal U/D, a latch circuit 16 for latching an output signal from the level shifter 15, and a level shifter 15*a* for stepping up the switching signal L/R, and a latch circuit 16*a* for latching the switching signal L/R that has been stepped up.

These level shifters 15, 15*a* and the latch circuits 16, 16*a* are both supplied with the clock signal CK and the control signal CTL from the control circuit 17*b* in response to the output signals S6 or S1, respectively. The switching signal L/R that has been stepped up is supplied to circuit elements such as analog switches A1 through A6 of the shift register 12 in the scanning direction control circuit 55 of the data signal line driving circuit 53.

Therefore, for each end of the vertical scanning periods, the latch circuit 16*a*, as well as the latch circuit 16, performs latching operation in response thereto, the level shifter 15*a*, as well as the level shifter 15, becomes active state in a predetermined period around the latching timing. With this arrangement, the switching of shifting direction can be carried out only for each timing at which a screen display is finished, thus further improving the display quality.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations with different combinations of the respective disclosed means within the spirit of the present invention, provided such variations do not exceed the scope of the patent claims set forth below.

The present invention offers an arrangement such that the shifting direction switching signal is supplied to a bidirectional shift register at operation timing of a; latch circuit regardless of external input timing of the shifting direction switching signal; and a control circuit controls operation of a level shifter so that generation of a steady-state current can be prevented in the level shifter except a period including the operation of the latch circuit, thus reducing power consumption. With such arrangement, the present invention is suitably used for a scanning signal line driving circuit and/or a data signal line driving circuit of a matrix-type display device.

As described, a scanning direction control circuit according to the present invention includes: a bidirectional shift register for performing bidirectional operation in which shifting direction is switched in accordance with a switching signal, the bidirectional shift register including a plurality of flip-flops which respectively operate in synchronism with a clock signal; a level shifter for stepping up the switching signal which is smaller than a driving voltage of the bidirectional shift register; a latch circuit for holding a signal level of the switching signal which has been stepped up by the level shifter; and a control circuit for, in response to output signals of the plurality of flip-flops, causing the latch circuit to carry out latching operation, and for controlling operation of the level shifter.

With the arrangement, a plurality of flip-flops of a bidirectional shift register sequentially shifts an input signal in one of the shifting directions. The shifting directions can be switched in response to a switching signal. The switching signal has amplitude smaller than that of driving voltage of the bidirectional shift register, and therefore, the amplitude of the switching signal is stepped-up by a level shifter and then supplied to a latch circuit.

The control circuit causes the latch circuit to carry out latching operation of the switching signal whose amplitude has been stepped up by the level shifter, by using output signals of the plurality of flip-flops constituting the bidirectional shift register. Further, the control circuit controls operation of the level shifter by using the output signals of the plurality of flip-flops.

In this manner, the stepped up switching signal, which is used for switching shifting direction, is fetched to the latch circuit at specific timings, by using output signals of the plurality of flip-flops. With this arrangement, the shifting direction switching signal can be supplied to the bidirectional shift register at the operation timing of the latch circuit regardless of external input timing of the switching signal. Further, since the control circuit controls operation of the level shifter, it is possible to prevent generation of a steady-state current in the level shifter except a period including the operation of the latch circuit, thus reducing power consumption.

As described, the control circuit brings the latch circuit into operation by using an output signal of a final-stage flip-flop in a shifting direction among the plurality of flip-flops, and the control circuit brings the level shifter into active state by using an output signal from other flip-flop than the final-stage flip-flop before the final-stage flip-flop outputs the output signal, and brings the level shifter into inactive state by using an output signal from the final-stage flip-flop or other flip-flop than the final-stage flip-flop after the final-stage flip-flop outputs the output signal.

With this arrangement, the control circuit causes the latch circuit to carry out latching operation with an output signal of the final-stage flip-flop of the bidirectional shift register, and therefore, the switching signal can be supplied to the bidirectional shift register after the shifting operation of the bidirectional shift register is completed.

Further, the control circuit brings the level shifter into active state before the final-stage flip-flop outputs the output signal, and brings the level shifter into inactive state after the final-stage flip-flop outputs the output signal. On this account, it is possible to prevent generation of a steady-state current in the level shifter, thus reducing power consumption.

As described, another scanning direction control circuit of the present invention further includes: a plurality of flip-flop stages which are connected in series so as to follow a final-stage flip-flop of the bidirectional shift register in a shifting direction, wherein: the control circuit brings the latch circuit into operation by using an output signal of the final-stage flip-flop among the plurality of flip-flops constituting the bidirectional shift register, and the control circuit brings the level shifter into active state by using an output signal from other flip-flop than the final-stage flip-flop before the final-stage flip-flop outputs the output signal, and brings the level shifter into inactive state by using an output signal of one of the plurality of flip-flop stages connected in series so as to follow the final-stage flip-flop.

With this arrangement, the control circuit causes the latch circuit to carry out latching operation with an output signal of the final-stage flip-flop of the bidirectional shift register, and therefore, the switching signal can be supplied to the bidirectional shift register after the shifting operation of the bidirectional shift register is completed.

Further, since the control circuit brings the level shifter into active state before the final-stage flip-flop outputs the output signal, and also controls inactive state of the level shifter by using an output signal of one of the plurality of flip-flop stages connected in series so as to follow the final-stage flip-flop, regardless of operation condition of the bidirectional shift register, thus more easily bringing the level shifter into inactive state.

Further, the control circuit may be arranged so as to bring the latch circuit into operation by using an output signal of N-stage flip-flop among the plurality of flip-flop stages connected in series so as to follow the final-stage flip-flop, and so as to bring the level shifter into active state by using an output signal of one of preceding flip-flops which include the plurality of flip-flops constituting the bidirectional shift register but are different from the N-stage flip-flop, and brings the level shifter into inactive state by using an output signal of one of subsequent flip-flops which are different from the N-stage flip-flop.

With this arrangement, the controlling of the latch circuit and the controlling of inactive state of the level shifter are carried out by using an output signal of N-stage flip-flop among the plurality of flip-flop stages connected in series so as to follow the final-stage flip-flop, and an output signal of one of subsequent flip-flops which are different from the N-stage flip-flop, respectively. Accordingly, the control circuit can easily carry out such controls regardless of operation condition of the bidirectional shift register, and also can easily adjust control timings for the latching operation and the level shifter.

Further, the control circuit may be arranged so as to bring the shift register into active state and brings the latch circuit into operation by using an output signal of a final-stage flip-flop in a shifting direction among the plurality of flip-flops constituting the bidirectional shift register, and so as to bring the level shifter into inactive state while the final-stage flip-flop suspends outputting of the output signal.

With this arrangement, the level shifter becomes active state and the latching operation of the latch circuit is carried out by an output signal of the final-stage flip-flop of the bidirectional shift register, and the level shifter is in inactive state in the remaining periods. With such an arrangement, it is possible to shorten the generation period of a steady-state current in the level shifter, thus further reducing power consumption.

Further, as described, the scanning direction control circuit of the present invention alternatively arranged so that at least one flip-flop stage which is connected in series so as to follow a final-stage flip-flop of the bidirectional shift register in the shifting direction, wherein: the control circuit brings the shift register into active state and brings the latch circuit into operation by using an output signal of N-stage flip-flop (N is an positive integer) among the at least one flip-flop stage, and the control circuit brings the level shifter into inactive state while the final-stage flip-flop suspends outputting of the output signal.

With this arrangement, the controlling of the latch circuit and the controlling of inactive state of the level shifter are respectively carried out by using an output signal of at least one flip-flop stages connected in series so as to follow the final-stage flip-flop. Accordingly, the control circuit can easily carry out such controls regardless of operation condition of the bidirectional shift register, and also can easily adjust control timings for the latching operation and the level shifter. Further, it is possible to securely shorten generation period of a steady-state current in the level shifter, thus further reducing power consumption.

Further, the scanning direction control circuit of the present invention is arranged so that the level shifter includes a current-driven-type level shifting section in which an input switching element for receiving an input signal is constantly conducted during operation of the level shifter.

With this arrangement, the input switching element of the level shifter is always conducted during operation of the level shifter. Therefore, unlike a voltage-driven.-type level shifter which conducts/cuts off the input switching element depending on the level of the input signal, this arrangement allows level shifting of an input signal without problems even when the amplitude of the input signal is lower than the threshold voltage of the input switching element.

Further, the scanning direction control circuit of the present invention is arranged so that the control circuit suspends power supply to the level shifter so as to bring the level shifter into inactive state.

With this arrangement, the control circuit suspends power supply to the level shifter so as to bring the level shifter into inactive state. Therefore, the control circuit securely suspends operation of the level shifter, and also securely reducing power consumption by the amount equal to power consumed for operating the level shifter.

Meanwhile, as described, a display device according to the present invention includes: a plurality of pixels; a plurality of data signal lines; a plurality of scanning signal lines; a scanning signal line driving circuit for supplying a scanning signal to each of the scanning signal lines in synchronism with a first clock signal having a predetermined period; and a data signal line driving circuit for extracting a data signal for each of the pixels of the scanning signal lines, each of which has been supplied with the scanning signal, from image signals showing display conditions of the respective pixels and being supplied in synchronism with a second clock signal having a predetermined period, and for outputting the data signal, which has been extracted, to each of the data signal lines, wherein: at least one of the data signal line driving circuit and the scanning signal line driving circuit includes one of the foregoing scanning direction control circuits.

With the foregoing arrangement, by providing one of the foregoing scanning direction control circuits in either or both of the data signal line driving circuit and the scanning signal line driving circuit provided in a display device, the shifting direction switching signal can be supplied to the bidirectional shift register at the operation timing of the latch circuit, regardless of external input timing of the switching signal. Further, it is possible to prevent generation of a steady-state current in the level shifter except a period including the latching operation of the latch circuit, thus preventing degradation of display quality of the display device, and reducing power consumption of an image display device.

Further, as described, the display device of the present invention, which includes the foregoing scanning direction control circuit as the data signal line driving circuit, further includes: a level shifter for stepping up voltage of a switching signal for switching shifting direction of a scanning signal line driving circuit; and a latch circuit for holding a signal level of the switching signal whose voltage has been stepped up, wherein: the control circuit controls the bidirectional shift register and the level shifter provided in the data signal line driving circuit, controls latching operation of the latch circuit and operation of the level shifter of the scanning signal line driving circuit.

With this arrangement, the display device includes a data signal line driving circuit having the foregoing scanning direction control circuit, and the control circuit of the scanning direction control circuit in the data signal line driving circuit controls the shifting direction switching signal of the scanning signal line driving circuit, thus further reducing power consumption of the display device.

Further, the display device of the present invention, which includes the foregoing scanning direction control circuit in the scanning signal line driving circuit, further includes: a level shifter for stepping up voltage of a switching signal for switching shifting direction of a data signal line driving circuit; and a latch circuit for holding a signal level of the switching signal whose voltage has been stepped up, wherein: the control circuit controls the bidirectional shift register and the level shifter provided in the scanning signal line driving circuit, controls latching operation of the latch circuit and operation of the level shifter of the data signal line driving circuit.

With this arrangement, the display device includes a scanning signal line driving circuit having the foregoing scanning direction control circuit, and the control circuit of the scanning direction control circuit in the scanning signal line driving circuit controls the shifting direction switching signal of the scanning signal line driving circuit. Therefore, information of the shifting direction switching signal is transmitted only at each timing where 1 screen display is finished, thus preventing degradation of display quality of the display device, and reducing power consumption of an image display device.

In the scanning direction control circuit or the display device of the present invention, it is preferable that the data signal line driving circuit, the scanning signal line driving circuit, and the pixels are formed on a single substrate, respectively.

With this arrangement, the scanning signal line driving circuit, the data signal line driving circuit, and the pixels are formed on the same substrate, respectively. In this structure, wirings for respectively connecting the data signal line driving circuit to the pixels, and wirings for connecting the scanning signal line driving circuit to the pixels are provided on the substrate and there is no need to lead the wirings out of the substrate, accordingly. Such a structure allows the liquid crystal display device to have a larger number of scanning signal lines and/or data signal lines without extra work during fabrication because the number of the signal lines to be lead out of the substrate is not changed, thus reducing work for fabrication. Further, the foregoing structure does not require terminals for external connection of those signal lines, and therefore, it is possible to prevent an increase of capacitance of the signal lines, and a decrease of degree of integration.

Further, in the foregoing respective display devices, it is preferable that each of the data signal line driving circuit, the scanning signal line driving circuit and the pixels includes switching elements, each being made of a polycrystalline silicon thin film transistor.

With this arrangement, each of the data signal line driving circuit, the scanning signal line driving circuit and the pixels includes switching elements, each being made of a polycrystalline silicon thin film transistor, thus easily enlarging the display area. Further, since the scanning signal line driving circuit, the data signal line driving circuit and the pixels all include switching elements of polycrystalline silicon thin film transistors, they can be easily formed on the same substrate, thus simplifying the fabrication and reducing the capacitance of signal lines.

Further, in the foregoing respective display devices, it is preferable that each of the data signal line driving circuit, the scanning signal line driving circuit and the pixels includes switching elements manufactured at a process temperature of not more than 600° C.

With this arrangement, the switching element is processed at a temperature of equal to or lower than 600° C. Therefore, the ordinary glass substrate (a glass substrate with a heat distortion point of equal to or lower than 600° C.) may be used as the substrate of each switching element without causing bending or warping which occurs in a process at a temperature of not less than the heat distortion point. Consequently, it is possible to realize a display device with a larger display area through easier mounting.

The control circuit used in the scanning direction control circuit and the display device may have any of the following arrangements (1) through (5).

(1) The control circuit includes first through third switches which are turned on or off in response to an output signal of the latch circuit, and fourth through sixth switches which are turned on or off in response to an inversion signal of the output signal of the latch circuit, the first switch and the fourth switch supply to the latch circuit an output signal of the final-stage flip-flop of the bidirectional shift register in the shifting direction among the plurality of flip-flops so as to bring the latch circuit into operation, the second switch and the fifth switch supply an output signal of other flip-flop than the final-stage flip-flop to one input terminal of a control signal flip-flop circuit, and an output signal of the control signal flip-flop circuit brings the level shifter into active state before the final-stage flip-flop outputs the output signal, and the third switch and the sixth switch supply an output signal of other flip-flop than the final-stage flip-flop or supply an output signal of the final-stage flip-flop to the other input terminal of the control signal flip-flop circuit, and an output signal of the control signal flip-flop circuit brings the level shifter into inactive state after the final-stage flip-flop outputs the output signal.

(2) The control circuit includes first through third switches which are turned on or off in response to an output signal of the latch circuit, and fourth through sixth switches which are turned on or off in response to an inversion signal of the output signal of the latch circuit, the first switch and the fourth switch supply to the latch circuit an output signal of the final-stage flip-flop of the bidirectional shift register in the shifting direction among the plurality of flip-flops so as to bring the latch circuit into operation, the second switch and the fifth switch supply an output signal of other flip-flop than the final-stage flip-flop to one input terminal of a control signal flip-flop circuit, and an output signal of the control signal flip-flop circuit brings the level shifter into active state before the final-stage flip-flop outputs an output signal, and the third switch and the sixth switch supply an output signal of one of the flip-flop stages, connected in series so as to follow the final-stage flip-flop, to the other input terminal of the control signal flip-flop circuit, and an output signal of the control signal flip-flop circuit brings the level shifter into inactive state.

(3) The control circuit includes first through third switches which are turned on or off in response to an output signal of the latch circuit, and fourth through sixth switches which are turned on or off in response to an inversion signal of the output signal of the latch circuit, the first switch and the fourth switch supply an output signal of the N-stage flip-flop to the latch circuit so as to bring the latch circuit into operation, the second switch and the fifth switch supply an output signal of a preceding stage flip-flop which is different from the N-stage flip-flop to one input terminal of a control signal flip-flop circuit, and an output signal of the control signal flip-flop circuit brings the level shifter into active state, and the third switch and the sixth switch supply an output signal of a subsequent stage flip-flop which is different from the N-stage flip-flop to the other input terminal of the control signal flip-flop circuit, and an output signal of the control signal flip-flop circuit brings the level shifter into inactive state.

(4) The control circuit includes a first switch which is turned on or off in response to an output signal of the latch circuit, and a second switch which is turned on or off in response to an inversion signal of the output signal of the latch circuit, the first switch and the second switch supply an output signal of the final-stage flip-flop to the latch circuit so as to bring the latch circuit into operation, and the first switch and the second switch supply the output signal of the final-stage flip-flop to the level shifter via an inverter circuit so as to bring the level shifter into active state and so as to bring the level shifter into inactive state while the final-stage flip-flop suspends outputting of the output signal.

(5) The control circuit includes a first switch which is turned on or off in response to an output signal of the latch circuit, and a second switch which is turned on or off in response to an inversion signal of the output signal of the latch circuit, the first switch and the second switch supply an output signal of the N-stage flip-flop to the latch circuit so as to bring the latch circuit into operation, and supply the output signal of the N-stage flip-flop to the level shifter via an inverter circuit so as to bring the level shifter into active state and so as to bring the level shifter into inactive state while the N-stage flip-flop suspends outputting of the output signal.

With the respective arrangements for the control circuit, operation of the latch circuit and condition of the level shifter are controlled by the switches, respectively. More specifically; the shifting direction switching signal, which has been stepped up, is fetched to the latch circuit at a specific timing by using an output signal of the bidirectional shift register, and therefore, the shifting direction switching signal can be supplied to the bidirectional shift register at the operation timing of the latch circuit regardless of external input timing of the switching signal. Further, since the control circuit controls operation of the level shifter, it is possible to prevent generation of a steady-state current in the level shifter except a period including the operation of the latch circuit, thus reducing power consumption.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A scanning direction control circuit, comprising:
    a bidirectional shift register for performing bidirectional operation in which shifting direction is switched in accordance with a switching signal, the bidirectional shift register including a plurality of flip-flops which respectively operate in synchronism with a clock signal;
    a level shifter for stepping up the switching signal which is smaller than a driving voltage of the bidirectional shift register;
    a latch circuit for holding a signal level of the switching signal which has been stepped up by the level shifter; and
    a control circuit for, in response to output signals of the plurality of flip-flops, causing the latch circuit to carry out latching operation, and for controlling operation of the level shifter.

2. The scanning direction control circuit as set forth in claim 1, wherein:
    the control circuit brings the latch circuit into operation by using an output signal of a final-stage flip-flop in a shifting direction among the plurality of flip-flops, and
    the control circuit brings the level shifter into active state by using an output signal from other flip-flop than the final-stage flip-flop before the final-stage flip-flop outputs the output signal, and brings the level shifter into inactive state by using an output signal from the final-stage flip-flop or other flip-flop than the final-stage flip-flop after the final-stage flip-flop outputs the output signal.

3. The scanning direction control circuit as set forth in claim 1, further comprising:
    a plurality of flip-flop stages which are connected in series so as to follow a final-stage flip-flop of the bidirectional shift register in a shifting direction,
    wherein:
    the control circuit brings the latch circuit into operation by using an output signal of the final-stage flip-flop among the plurality of flip-flops constituting the bidirectional shift register, and
    the control circuit brings the level shifter into active state by using an output signal from other flip-flop than the final-stage flip-flop before the final-stage flip-flop outputs the output signal, and brings the level shifter into inactive state by using an output signal of one of the plurality of flip-flop stages connected in series so as to follow the final-stage flip-flop.

4. The scanning direction control circuit as set forth in claim 1, wherein:
    the control circuit brings the latch circuit into operation by using an output signal of N-stage flip-flop among the plurality of flip-flop stages connected in series so as to follow the final-stage flip-flop, and
    the control circuit brings the level shifter into active state by using an output signal of one of preceding flip-flops which include the plurality of flip-flops constituting the bidirectional shift register but are different from the N-stage flip-flop, and brings the level shifter into inactive state by using an output signal of one of subsequent flip-flops which are different from the N-stage flip-flop.

5. The scanning direction control circuit as set forth in claim 1, wherein:
    the control circuit brings the shift register into active state and brings the latch circuit into operation by using an output signal of a final-stage flip-flop in a shifting direction among the plurality of flip-flops constituting the bidirectional shift register, and the control circuit brings the level shifter into inactive state while the final-stage flip-flop suspends outputting of the output signal.

6. The scanning direction control circuit as set forth in claim 1, further comprising:
at least one flip-flop stage which is connected in series so as to follow a final-stage flip-flop of the bidirectional shift register in the shifting direction,
wherein:
the control circuit brings the shift register into active state and brings the latch circuit into operation by using an output signal of N-stage flip-flop among the at least one flip-flop stage, and the control circuit brings the level shifter into inactive state while the final-stage flip-flop suspends outputting of the output signal.

7. The scanning direction control circuit as set forth in claim 1,
wherein:
the level shifter includes a current-driven-type level shifting section in which an input switching element for receiving an input signal is always conducted during operation of the level shifter.

8. The scanning direction control circuit as set forth in claim 2,
wherein:
the level shifter includes a current-driven-type level shifting section in which an input switching element for receiving an input signal is always conducted during operation of the level shifter.

9. The scanning direction control circuit as set forth in claim 7,
wherein:
the control circuit suspends power supply to the level shifter so as to bring the level shifter into inactive state.

10. The scanning direction control circuit as set forth in claim 8,
wherein:
the control circuit suspends power supply to the level shifter so as to bring the level shifter into inactive state.

11. A display device, comprising:
a plurality of pixels;
a plurality of data signal lines;
a plurality of scanning signal lines;
a scanning signal line driving circuit for supplying a scanning signal to each of the scanning signal lines in synchronism with a first clock signal having a predetermined period; and
a data signal line driving circuit for extracting a data signal for each of the pixels of the scanning signal lines, each of which has been supplied with the scanning signal, from image signals showing display conditions of the respective pixels and being supplied in synchronism with a second clock signal having a predetermined period, and for outputting the data signal, which has been extracted, to each of the data signal lines,
wherein:
at least one of the data signal line driving circuit and scanning signal line driving circuit includes:
a bidirectional shift register for performing bidirectional operation in which shifting direction is switched in accordance with a switching signal, the bidirectional shift register including a plurality of flip-flops which respectively operate in synchronism with a clock signal;
a level shifter for stepping up the switching signal which is smaller than a driving voltage of the bidirectional shift register;
a latch circuit for holding a signal level of the switching signal which has been stepped up by the level shifter; and
a control circuit for, in response to output signals of the plurality of flip-flops, causing the latch circuit to carry out latching operation, and for controlling operation of the level shifter.

12. The display device as set forth in claim 11, wherein:
the control circuit brings the latch circuit into operation by using an output signal of a final-stage flip-flop in a shifting direction among the plurality of flip-flops, and
the control circuit brings the level shifter into active state by using an output signal from other flip-flop than the final-stage flip-flop before the final-stage flip-flop outputs the output signal, and brings the level shifter into inactive state by using an output signal from the final-stage flip-flop or other flip-flop than the final-stage flip-flop after the final-stage flip-flop outputs the output signal.

13. The display device as set forth in claim 11, further comprising:
a plurality of flip-flop stages which are connected in series so as to follow a final-stage flip-flop of the bidirectional shift register in a shifting direction,
wherein:
the control circuit brings the latch circuit into operation by using an output signal of the final-stage flip-flop among the plurality of flip-flops constituting the bidirectional shift register, and
the control circuit brings the level shifter into active state by using an output signal from other flip-flop than the final-stage flip-flop before the final-stage flip-flop outputs the output signal, and brings the level shifter into inactive state by using an output signal of one of the plurality of flip-flop stages connected in series so as to follow the final-stage flip-flop.

14. The display device as set forth in claim 11, wherein:
the control circuit brings the latch circuit into operation by using an output signal of N-stage flip-flop among the plurality of flip-flop stages connected in series so as to follow the final-stage flip-flop, and
the control circuit brings the level shifter into active state by using an output signal of one of preceding flip-flops which include the plurality of flip-flops constituting the bidirectional shift register but are different from the N-stage flip-flop, and brings the level shifter into inactive state by using an output signal of one of subsequent flip-flops which are different from the N-stage flip-flop.

15. The display device as set forth in claim 11, wherein:
the control circuit brings the shift register into active state and brings the latch circuit into operation by using an output signal of a final-stage flip-flop in a shifting direction among the plurality of flip-flops constituting the bidirectional shift register, and the control circuit brings the level shifter into inactive state while the final-stage flip-flop suspends outputting of the output signal.

16. The display device as set forth in claim 11, further comprising:
at least one flip-flop stage which is connected in series so as to follow a final-stage flip-flop of the bidirectional shift register in the shifting direction,
wherein:
the control circuit brings the shift register into active state and brings the latch circuit into operation by using an output signal of N-stage flip-flop among the at least one flip-flop stage, and the control circuit brings the level shifter into inactive state while the final-stage flip-flop suspends outputting of the output signal.

17. A display device comprising a data signal driving circuit,
the data signal driving circuit including:
a bidirectional shift register for performing bidirectional operation in which shifting direction is switched in accordance with a switching signal, the bidirectional shift register including a plurality of flip-flops which respectively operate in synchronism with a clock signal;
a first level shifter for stepping up the switching signal which is smaller than a driving voltage of the bidirectional shift register;
a first latch circuit for holding a signal level of the switching signal which has been stepped up by the level shifter;
a control circuit for, in response to output signals of the plurality of flip-flops, causing the latch circuit to carry out latching operation, and for controlling operation of the level shifter;
a second level shifter for stepping up a switching signal for switching shifting direction of a scanning signal line driving circuit; and
a second latch circuit for holding signal level of the switching signal which has been stepped up by the second level shifter,
the control circuit (a) controlling the bi-directional shift register and the first level shifter of the data signal line driving circuit, (b) causing the second latch circuit to carry out latching operation, and (c) controlling operation of the second level shifter.

18. A display device comprising a scanning signal line driving circuit,
the scanning signal line driving circuit including:
a bidirectional shift register for performing bidirectional operation in which shifting direction is switched in accordance with a switching signal, the bidirectional shift register including a plurality of flip-flops which respectively operate in synchronism with a clock signal;
a first level shifter for stepping up the switching signal which is smaller than a driving voltage of the bidirectional shift register;
a first latch circuit for holding a signal level of the switching signal which has been stepped up by the level shifter;
a control circuit for, in response to output signals of the plurality of flip-flops, causing the latch circuit to carry out latching operation, and for controlling operation of the level shifter;
a second level shifter for stepping up a switching signal for switching shifting direction of a data signal line driving circuit; and
a second latch circuit for holding signal level of the switching signal which has been stepped up by the second level shifter,
the control circuit (a) controlling the bi-directional shift register and the first level shifter of the scanning signal line driving circuit, (b) causing the second latch circuit to carry out latching operation, and (c) controlling operation of the second level shifter.

19. The display device as set forth in claim 11, wherein:
the data signal line driving circuit, the scanning signal line driving circuit, and the pixels are formed on a single substrate, respectively.

20. The display device as set forth in claim 17, wherein:
the data signal line driving circuit, the scanning signal line driving circuit and the pixels are formed on a single substrate, respectively.

21. The display device as set forth in claim 18, wherein:
the data signal line driving circuit, the scanning signal line driving circuit and the pixels are formed on a single substrate, respectively.

22. The display device as set forth in claim 11, wherein:
each of the data signal line driving circuit, the scanning signal line driving circuit, and the pixels includes switching elements, each being made of a polycrystalline silicon thin film transistor.

23. The display device as set forth in claim 17, wherein:
each of the data signal line driving circuit, the scanning signal line driving circuit, and the pixels includes switching elements, each being made of a polycrystalline silicon thin film transistor.

24. The display device as set forth in claim 18, wherein:
each of the data signal line driving circuit, the scanning signal line driving circuit, and the pixels includes switching elements, each being made of a polycrystalline silicon thin film transistor.

25. The display device as set forth in claim 11, wherein:
each of the data signal line driving circuit, the scanning signal line driving circuit, and the pixels includes switching elements manufactured at a process temperature of not more than 600° C.

26. The display device as set forth in claim 17, wherein:
each of the data signal line driving circuit, the scanning signal line driving circuit and the pixels includes switching elements manufactured at a process temperature of not more than 600° C.

27. The display device as set forth in claim 18, wherein:
each of the data signal line driving circuit, the scanning signal line driving circuit and the pixels includes switching elements manufactured at a process temperature of not more than 600° C.

28. A scanning direction control circuit as set forth in claim 2, wherein:
the control circuit includes first through third switches which are turned on or off in response to an output signal of the latch circuit, and fourth through sixth switches which are turned on or off in response to an inversion signal of the output signal of the latch circuit,
the first switch and the fourth switch supply to the latch circuit an output signal of the final-stage flip-flop of the bidirectional shift register in the shifting direction among the plurality of flip-flops so as to bring the latch circuit into operation,
the second switch and the fifth switch supply an output signal of other flip-flop than the final-stage flip-flop to one input terminal of a control signal flip-flop circuit, and an output signal of the control signal flip-flop circuit brings the level shifter into active state before the final-stage flip-flop outputs the output signal, and
the third switch and the sixth switch supply an output signal of other flip-flop than the final-stage flip-flop or supply an output signal of the final-stage flip-flop to the other input terminal of the control signal flip-flop circuit, and an output signal of the control signal flip-flop circuit brings the level shifter into inactive state after the final-stage flip-flop outputs the output signal.

29. A scanning direction control circuit as set forth in claim 3, wherein:
- the control circuit includes first through third switches which are turned on or off in response to an output signal of the latch circuit, and fourth through sixth switches which are turned on or off in response to an inversion signal of the output signal of the latch circuit,
- the first switch and the fourth switch supply to the latch circuit an output signal of the final-stage flip-flop of the bidirectional shift register in the shifting direction among the plurality of flip-flops so as to bring the latch circuit into operation,
- the second switch and the fifth switch supply an output signal of other flip-flop than the final-stage flip-flop to one input terminal of a control signal flip-flop circuit, and an output signal of the control signal flip-flop circuit brings the level shifter into active state before the final-stage flip-flop outputs an output signal, and
- the third switch and the sixth switch supply an output signal of one of the flip-flop stages, connected in series so as to follow the final-stage flip-flop, to the other input terminal of the control signal flip-flop circuit, and an output signal of the control signal flip-flop circuit brings the level shifter into inactive state.

30. A scanning direction control circuit as set forth in claim 4, wherein:
- the control circuit includes first through third switches which are turned on or off in response to an output signal of the latch circuit, and fourth through sixth switches which are turned on or off in response to an inversion signal of the output signal of the latch circuit,
- the first switch and the fourth switch supply an output signal of the N-stage flip-flop to the latch circuit so as to bring the latch circuit into operation,
- the second switch and the fifth switch supply an output signal of a preceding stage flip-flop which is different from the N-stage flip-flop to one input terminal of a control signal flip-flop circuit, and an output signal of the control signal flip-flop circuit brings the level shifter into active state, and
- the third switch and the sixth switch supply an output signal of a subsequent stage flip-flop which is different from the N-stage flip-flop to the other input terminal of the control signal flip-flop circuit, and an output signal of the control signal flip-flop circuit brings the level shifter into inactive state.

31. A scanning direction control circuit as set forth in claim 5, wherein:
- the control circuit includes a first switch which is turned on or off in response to an output signal of the latch circuit, and a second switch which is turned on or off in response to an inversion signal of the output signal of the latch circuit,
- the first switch and the second switch supply an output signal of the final-stage flip-flop to the latch circuit so as to bring the latch circuit into operation, and
- the first switch and the second switch supply the output signal of the final-stage flip-flop to the level shifter via an inverter circuit so as to bring the level shifter into active state and so as to bring the level shifter into inactive state while the final-stage flip-flop suspends outputting of the output signal.

32. A scanning direction control circuit as set forth in claim 6, wherein:
- the control circuit includes a first switch which is turned on or off in response to an output signal of the latch circuit, and a second switch which is turned on or off in response to an inversion signal of the output signal of the latch circuit,
- the first switch and the second switch supply an output signal of the N-stage flip-flop to the latch circuit so as to bring the latch circuit into operation, and supply the output signal of the N-stage flip-flop to the level shifter via an inverter circuit so as to bring the level shifter into active state and so as to bring the level shifter into inactive state while the N-stage flip-flop suspends outputting of the output signal.

* * * * *